United States Patent [19]

LeBlanc et al.

[11] Patent Number: 5,542,070

[45] Date of Patent: Jul. 30, 1996

[54] METHOD FOR RAPID DEVELOPMENT OF SOFTWARE SYSTEMS

[75] Inventors: Rene LeBlanc, Scottsdale; Thomas J. Perry, Phoenix, both of Ariz.

[73] Assignee: AG Communication Systems Corporation, Phoenix, Ariz.

[21] Appl. No.: 358,651

[22] Filed: Dec. 19, 1994

Related U.S. Application Data

[63] Continuation of Ser. No. 64,315, May 20, 1993, abandoned.

[51] Int. Cl.$^6$ .................................................. G06F 9/00
[52] U.S. Cl. ..................... 395/500; 395/700; 395/375; 395/650; 364/DIG. 1; 364/DIG 2
[58] Field of Search ........................... 395/500, 650, 395/700, 375

[56] References Cited

U.S. PATENT DOCUMENTS

| | | | |
|---|---|---|---|
| 4,374,412 | 2/1983 | Schlaffner | 395/775 |
| 5,070,451 | 12/1991 | Moore et al. | 395/375 |
| 5,166,953 | 11/1992 | Hershey et al. | 375/1 |
| 5,228,040 | 7/1993 | Agrawal et al. | 371/22.1 |
| 5,319,757 | 6/1994 | Moore et al. | 395/375 |

OTHER PUBLICATIONS

Intelligent network Basic call model rapid prototype by Renë R. LeBlanc, 1993 IEEE—publication pp. 1543-7.
Observ—A Prototyping Language and Environment combining Object Oriented Approach, Stale Machines and Logic Programmins, Tyszberowicz 1990 IEEE.
An Object–Oriented Approach to Recoverable Manufacturing Control Systems. Kradjel, 1990 IEEE pp. 9–15.
An Integrated System of Modelling, Analysis and Simulation for Real–Time Networks. by Yuang et al, IEEE 1992, pp. 231–240.
Validating System and Software Requirements: Extending the Davis–Jordan requirements metamodel to the "User's view", IEEE 1992. Overmayer pp. 149–150.

*Primary Examiner*—Krisna Lim
*Assistant Examiner*—Zarni Maung
*Attorney, Agent, or Firm*—Gregory G. Hendricks

[57] ABSTRACT

Two major Forth extensions provide high-level support for building rapid prototypes for systems. These extensions form distinct language vocabularies available in the Forth environment. One is a Finite State Machine Language, named FSML, and the other is an object oriented language, named 200L. Using these extension and the inherent expandability of the Forth language, a prototype can be rapidly created. The modeling method requires four steps. First, using 200L, the system is described as a set of objects. At least one of the objects must be a controlling object and so identified. Second, using FSML, the controlling object is described as a finite state machine. Third, the system's operation is expressed as a collection of one or more finite state machines. Each finite state machine type is defined with a unique machine type name. Any number of instances of a finite state machine type can be dynamically created at execution time. Fourth, communication is allowed between the finite state machines.

6 Claims, 25 Drawing Sheets

METHOD FOR RAPID DEVELOPMENT OF SOFTWARE SYSTEMS

This is a continuation of application Ser. No. 08/064,315 filed on May 20, 1993 now abandoned.

FIELD OF THE INVENTION

The present invention relates to programming of computer systems. More specifically, the present invention is a method of quickly implementing programming ideas into actual test code that can be used to test basic assumptions about the programming idea.

BACKGROUND OF THE INVENTION

To minimize risks and gain insight, many customers and vendors are cooperatively building prototypes and field trials, starting with simpler more restricted capabilities and gradually adding capabilities in phased steps. This can be done in stages, starting with software-only simulations, followed by hardware/software prototypes leading to the design refinements that can later be applied to a commercial system development with greatly reduced risk of unexpected and costly problems.

Software simulation of complex systems requires flexible software tools that can represent the logical systems design elements in an executable form, i.e, a Rapid Prototype. The tools are used to build a logical prototype of the system being studied. There are several kinds of simulation possible. For logical analysis of system models and protocols, a logical execution model works best. A statistical model and other mathematical models might be used for subsequent performance and reliability analysis.

The tools should support rapid creation of design elements that represent the level of logic being simulated. The prototype is recursively refined and expanded to implement the model in increasingly greater detail. This process quickly leads to deep insight about the model and problems as they are discovered.

To develop a rapid prototype, the tools should:

1) Minimize the conceptual distance between the logical model and the implementation;
2) Support logical representation at any level of detail without limitations imposed by resource of language constraints;
3) Retain flexibility during all phases of development; and
4) Provide an interactive user interface.

This arrangement can best be described as a spiral development strategy. One way to view the spiral is to picture a problem domain as a wheel with radial spokes defining sectors that represent parts of the problem. Traversing a spiral, beginning at the center of the wheel, one encounters a small piece of each part of the problem. With each successive traversal of the spiral, the radius grows so that the path becomes longer and the level of detail, represented by the areas of the circumscribed sectors, is increased. This process allows repeated evaluations over the full scope of the problem, each time with more detail as design choices are simulated with greater precision.

Prior to the present invention, a programmer wanting to test ideas or control systems had to expend a great deal of time creating a computer model on which the problem could be simulated. Before the programmer could begin testing any of the underlying assumptions, the model needed to be nearly complete. This required that many of the detailed decisions and associated coding be in place. The present invention provides a method to rapidly start testing high level design assumptions even prior to a detailed understanding of the low level responses.

Therefore it is the objective of the present invention to provide a method to rapidly reduce programming ideas and concepts into a working model whereby the programming ideas and concepts can be tested at a high level.

SUMMARY OF THE INVENTION

In order to accomplish the objective of the present invention there is a provided method for allowing a computer system to simulate a system. The invention is best described as four steps. First the system is described as a set of objects. At least one of the objects must be a controlling object and so identified. Second, the controlling object is described as a finite state machine. Third, express the system operation as a collection of one or more finite state machines. Create as many finite state machines as needed. These finite state machines can be statically defined with unique machine names. They can also be dynamically created at runtime, using the controlling finite state machine as the prototype. Fourth, allowing communication between the finite state machines.

DESCRIPTION OF THE DRAWINGS

A better understanding of the invention may be had from the consideration of the following detailed description taken in conjunction with the accompanying drawings, in which.

DESCRIPTION OF THE PREFERRED EMBODIMENT

Figure 1:
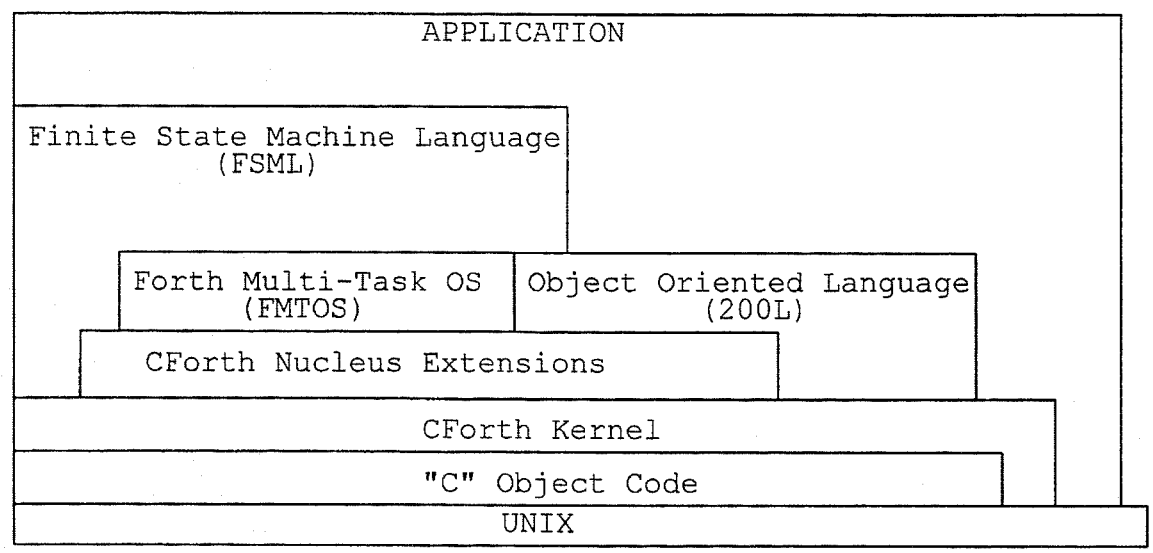
FIG. 1 is a high level block diagram showing the layers of the present invention.

Referring to FIG. 1, at the lowest level, a Forth language nucleus is used. This particular implementation of Forth is in C to provide portability to a wide variety of host environments. Several properties of the Forth language have proven to be very important factors in minimizing the effort to build a rapid prototype.

1) Forth inherently provides an interactive user interface.

2) Forth is inherently an extendible language. New words added to the dictionary operate in an identical fashion as native Forth words. This makes it easy to create high-level, application-oriented language sets above the Forth nucleus to minimize the conceptual distance between the problem domain (the logical model) and the implementation language.

3) The Forth system provides efficient support for multi-task operations internal to an application.

4) The Forth system contains a wide variety of internal development tools that support testing and debugging operations.

5) Large complex problem domains can be implemented in great detail without restrictions due to resource exhaustion, even on relatively modest host platforms.

Two major Forth extensions provide high-level support for building rapid prototypes for real-time control systems such as telecommunication switching systems. These extensions form distinct language vocabularies available in the Forth environment. One is a Finite State Machine Language, named FSML, and the other is an object oriented language, named 2OOL.

Finite State Machine Language—FSML

FSML supports definition of an arbitrary set of communicating, finite state machines. Each Finite State Machine (FSM) runs as a separate task and can establish static or dynamic communication bindings with other FSMs. FSML syntax is simple. Referring to Table 1, each FSM is defined as a list of states. Under each state is a list of inputs that are valid for that state. Following each input is a next-state and action list (output) to be executed when the FSM receives the input while in that state. Inputs are programmer-defined tokens sent to an FSM via messages. Messages may contain any additional parameters needed by the application. FSML also supports the concept of sub-machines in which inputs are synchronously processed in the task-space of a parent FSM. This extension provides a natural expression of more complex finite state machines in which there may be states and sub-states. This has proven very practical in supporting solutions to real-world problems without incurring problems of un-bounded state expansion.

By way of an example, a Finite State Machine (FSM) is a specialized controlling object or structure that can be used to define the action of a system or subsystem. As stated above, an FSM is defined by it's states, input—next-state transition pairs, and action routines.

| machine A | | |
|---|---|---|
| input | next-state | action routine |
| state 1 | | |
| Input X | state 2 | { perform action 1 } |
| Input Y | state 1 | { perform action 2 } |
| Input Z | state 2 | { perform action 3 } |
| or-else | state 1 | { perform action 7 } |
| state 2 | | |
| Input X | state 2 | { perform action 4 } |
| Input Y | state 1 | { perform action 5 } |
| Input W | state 1 | { perform action 6 } |
| or-else | state 2 | { perform action 7 } |
| start-state state 1 | | |

This FSM has 2 states, 1 and 2. When instantiated, it starts out in state 1. If this FSM receives an input X, it changes to state and performs action routine 1. Each state has an or-else clause to handle unknown inputs.

The following is an example of how a simple Voice Mail (VM) system could be modeled using an FSM. This example will be used as the steps involved in designing a model are explained below.

| input | next-state | action routine |
|---|---|---|
| machine VoiceMailbox | | |
| state Choose_VM_Option | | |
| Button1 | Play_Messages | { retrieve messages } |
| Button2 | Send_Message | { get list of mailboxes and prompt for mailbox # } |
| Button3 | Quit_VM | { no action required } |
| VM_Message | Choose_VM_Option | { store incoming message from other VM mailbox } |
| Message | Choose_VM_Option | { store callers message } |
| or-else | Choose_VM_Option | { prompt user "Invalid Input!" } |
| state Play_Messages | | |
| Button1 | Play_Messages | { tag each message as old after played } |
| Button2 | Choose_VM_option | { erase all tagged messages } |
| or_else | Play_Messages | { prompt user "Invalid Input!" } |
| state Send_Message | | |
| Mess_to_Send | Send_Message | { save message to send } |
| Send | Choose_VM_option | { send VM_Message to target VoiceMailbox } |
| or-else | Send_Message | { prompt user "Invalid Input!" } |
| state Quit_VM | | |
| Button1 | Choose_VM_Option | { exit system but re-initialize for next access } |
| or_else | Choose_VM_Option | { abort quit, no action required } |
| start-state Choose_VM_Option | | |

From this description, it is apparent that this machine has 4 states. The last line (start-state Choose_VM_Option) indicates that the starting state is the Choose_VM_Option state. Once in this state, the transition pairs determine both the next state and action taken for any given input. For example, if Button1 is pressed, the FSM changes to state Play_Messages and the action routine causes the messages to be retrieved. The other states and transition pairs operate in a similar manor.

During the first few passes, the action routine may do nothing more than return a message that the desired action occurred without actually performing any action at all. This allows the designer to implement the FSM. Once the FSM is functioning, the actions routines can then be defined in greater detail. As stated above, the action routines may contain FSM (sub-machines) as well.

Tables 7 and 8 provide definitions for the FSML and FMTOS words along with a few screens for the more complicated words.

Object Oriented Language—200L

The other major extension to the forth operating system is 200L. 200L supports the object classes with the following language characteristics:

1. Information Hiding Instance data is normally private and accessible only indirectly via an object's methods.
2. Polymorphism Method names may be common across classes, with specific functionality bound to each class.
3. Multiple-Inheritance Object classes all inherit the methods of the base class, CLASS0, and can comprise elements of other classes whose specific methods are automatically inherited.
4. Early And Late Binding Objects may be instantiated at compile time and be created as "static named objects". Both the class and the methods are bound at compile time (early binding). Objects may be instantiated at execution time (dynamic objects). When a method is to be applied ("sent to") an object, either the method index or the class descriptor or both may be supplied at execution time (late binding).

Object classes provide methods for creating objects that are named, static instances of a class or as dynamic, un-named instances of a class. 200L provides convenient access to un-named objects via named Object Handles which can be temporarily attached to dynamic objects, allowing them to be referenced by the Object Handle name as if they were named static objects. 200L supports object association via an alias method which allows an object's instance data to define a kind of pointer to another object, still inheriting all that object's methods as if the object itself were included.

In 200L, there are two kinds of objects; "classes" and "objects". A class is a specialized kind of object which may be "instantiated" to create specific objects whose form and operations are determined by the class definition. All class objects are members of the underlying 200L base class, called "CLASS0:". 200L classes can inherit the instance variables and methods of other classes by directly incorporating objects from those other classes within the class instance data definition. An instance of a class is created by using the MAKE method. The MAKE method will allocate the required amount of memory for all the instance data of the class, including the instance data that comprises objects of other classes. In other words, instances of inherited classes will be created at the same time an instance of the class is created.

200L syntax is consistent with the underlying Forth language suffix notation in which operation verbs apply to the contents of the parameter stack.

<parameters><object name><method name>

For example, "3 5 +" will leave "8" on the stack. Operation verbs for 200L objects are called methods. A "method" is the object-oriented terminology for a function or procedure.

Object oriented design encourages a change in mindset from thinking of data and procedures that operate upon the data as separate entities to the viewpoint that a program consists only of Objects which have various behaviors, determined by the methods supported by each object. The objects are then viewed as building blocks to be combined in many ways to build programs that accomplish the desired tasks.

Accordingly, an object named X in 200L could be printed by the statement:

X PRINT, where PRINT is a method defined for the object class of object X.

200L class data definitions allow a wide variety of primitive data types, including signed and unsigned variables of various sizes, structures, unions, and arrays. These elements may be combined as needed for the applications, creating arrays of structures of variables, or structures including arrays of elements, for example. Instance data may include objects of other classes and inherit all the methods applicable to those objects. Of course, these may also be arranged in structures and arrays, as required. 200L class methods and instance data may be declared as private or public. Object instance data is normally private, and cannot be referenced outside the object, and must be accessed only by the methods defined for its class.

The MAKE method is used only for static named objects. For example, to make an instance of a class named classx: and name the instance X the following coding would be used:

classx: MAKE X

Although not required, by convention all classes in 200L have names ending with a colon. Another convention is to use upper case (or mostly upper case) letters in method names. There is no particular convention for object names.

There is no UNMAKE for static named objects. They are created at compile time and remain persistent as long as the load exists.

The DMAKE method is used to create dynamic instances of a class. Dynamic objects do not have names. The DMAKE method returns an object address on the parameter stack. It is up to the programmer to manage the addresses of dynamic objects. 200L provides the ability to define named object handles which can be assigned the class descriptor and the object address of any dynamic object. Typically, object handles are associated permanently with a particular class descriptor and then assigned different object addresses dynamically as the system operates. The object handles allow dynamic objects to be referenced by the object handle name in the same way a static named object can be referenced by its name. The only difference is that the object handle must be attached to the object address at execution time as it is used to reference different instances of objects of its class.

There is a DUNMAKE method that can be used to destroy dynamic objects and return their memory resources to the system.

The following small example shows how to create an object handle and attach it to a dynamic instance of classx:

| | |
|---|---|
| object-handle: X | ( creates a static object handle entity called X ) |
| classx: assign-type: X | ( initializes X with the classx: type descriptor ) |
| classx: | ( creates a dynamic instance of classx: and ) |
| DMAKE becomes: X | ( attaches it to the object handle X ) |
| . | |
| . | |
| X DUNMAKE | ( unmakes the dynamic instance of classx: ) |
| 0 becomes: X | ( resets the object address of X to zero ) |

After all the discussion about instantiating classes to create objects, the user will still be unprepared to use this information if he or she doesn't know how to define a class in the first place.

A class consists of a definition of the "instance variables" and the class-specific definition of the methods that operate upon those variables. The class "instance variables" are defined as a structure of the data elements that act as a template for the data to be created for each instance of the class. The class instance data structure defines an organization of data elements of several kinds:

primitive data elements: byte, ubyte, short, ushort, long, ulong, . . . etc.

object class elements: objects of other 200L classes object class alias elements: typed pointers to objects of other 200L classes arrays of any of the above elements unions of any of the above elements Example class definition from Intelligent Network application:

```
class: CsID:
    ?method: CLONE
    ?method: $ASN
    private:
    \ CLASS DATA
    \ ===========
    ulong: +CsID
    \ ===========
    dup define-memQ CsID-memQ
    public:
    m: DMAKE ( -- 'obj ) CsID-memQ mget ;m
    m: DUNMAKE ( 'obj -- )
      .UNMAKE? iftrue cr ." UNMAKING CsID INSTANCE "
      oa ADDR d. cr ifend
      oa ADDR CELL - @ [ ' CsID-memQ >body ] literal =
      if oa ADDR mput then ;m
    m: !! ( val -- ) oa +CsID !! ;m
    m: @@ ( -- val ) oa +CsID @@ ;m
    m: PRINT ( -- ) cr ."        CsID= " oa +CsID @@ d. ;m
    m: CLONE ( -- 'obj ) CsID: DMAKE ( 'obj )
      oa +CsID @@        ( 'obj CsID )
      over member-of: CsID: +CsID !! ;m
    m: $ASN ( Token -- ) 1 needed drop
      " CsID " >>AB
      oa +CsID @@ x,>>AB
      nl>>AB
      ;m
;class
```

The class: and ;class words bracket the class definition.

The ?method: word is used to pre-define the method names. This is a conditional definition, only if the name has not already been defined as a method before. Method names are associated with an arbitrary system index which is used to link the definition of the method for a specific class in the class descriptor table compiled uniquely for each class definition. Method names are all placed into the OOL vocabulary to avoid conflicts with user defined words in other vocabularies. The ?method: definitions do not have to be within the class: and ;class words. There is an alternative method: word that will redefine the word with a new index, but this would be an unusual thing to do.

Note that ?method: definitions were only used in this class definition for the CLONE and $ASN methods, because the other method names are all predefined within 200L itself. Method names are global, but must be bound to each specific class. The specific definition within a class is provided by the m: definitions. Note that other generic methods, such as DUMP, LIST-METHODS, SIZE, etc. may also be applied to instances of this class, but have not been redefined specifically for this class. These will inherit the CLASS0: definitions provided within 200L.

The user may provide a new definition of any of the CLASS0: methods within a new class, and the new definition will be used on objects of this class. The new definition can reference the CLASS0: definition of the method as part of the new definition, if desired.

For example, if the user wanted to redefine the DUMP method for the example class above so that it printed out an additional string before dumping the object with the CLASS0: dump, the new definition could be coded:

m: DUMP ( -- ) cr 20 spaces ."DUMP OF CsID OBJECT:" [also (OOL)]oa DUMP [previous] ;m The private: word is used to declare the following definitions to be hidden from access from anywhere outside the class definition. The instance data definitions are typically made private. The names of instance data elements, such as +CsID in the example, are also a form of method. These names return the offset of the data element from the top of the object's address space. The public: word makes following definitions accessible outside the object. The private: and public: mode words can be interspersed in the class definition as desired to control the information hiding for any methods.

By convention, instance data element names begin with "+" to emphasize the offset they return must be added to the object address. This shows up within the m: definitions where the object address operator "oa" must be used for referencing the instance data. The oa operator satisfies the compile time requirement of providing the class descriptor needed when compiling a reference to a data element, and at execution time it provides the object's base address to which the element's offset is automatically added for element references.

Tables 2 to 5 list the added forth words for 200L. Table 6 provides a definition for the 200L words along with a few screens for the more complicated words.

Description of Inner-Workings of 200L and FSML

Both FSML and 200L may be thought of as special purpose compilers, extending the syntactic constructs which can be handled in the FORTH environment: the FSML compiler supporting those constructs associated with a Finite State Machine Language and the 200L compiler supporting those constructs associated with Object Oriented Programming.

In order to understand the implementation of these two special purpose compilers, it is first necessary to have a basic understanding of the compilation and interpretation process supported by the underlying C4TH system. The C4TH implementation provides for three basic types of words: primitives, threads and created words.

Figure 2:
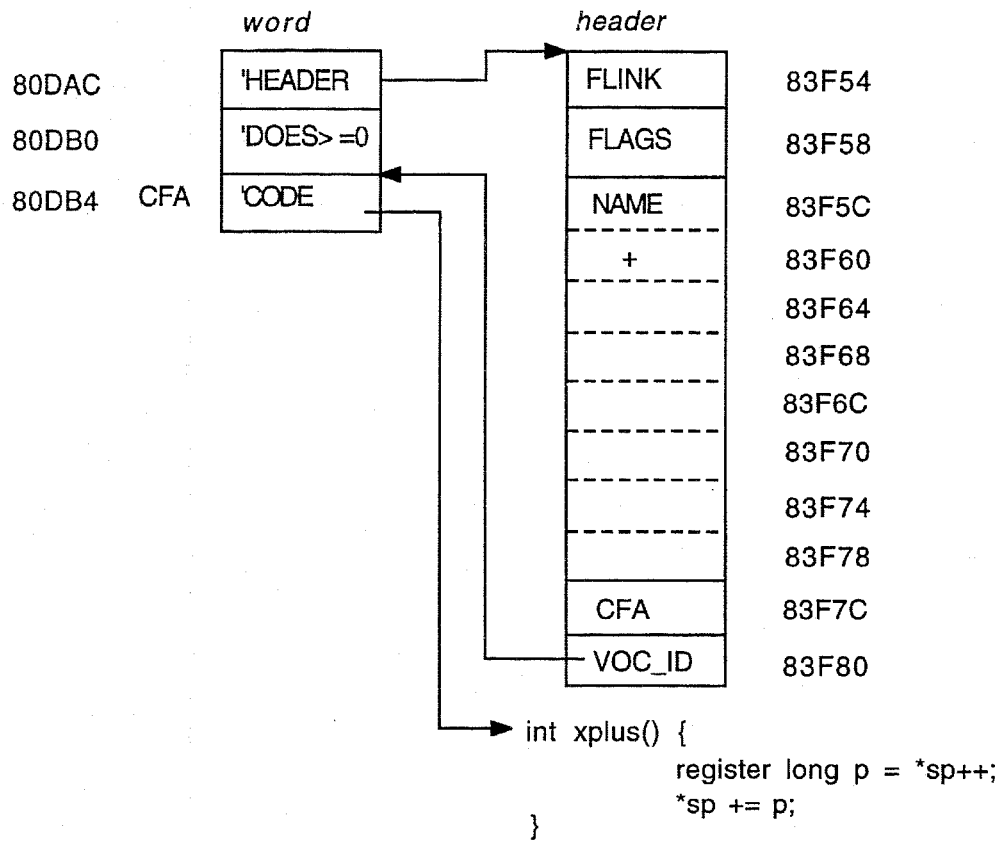
FIG. 2 is a pictorial representation of memory usage by the C4TH primitives + and swap.
Figure 2:
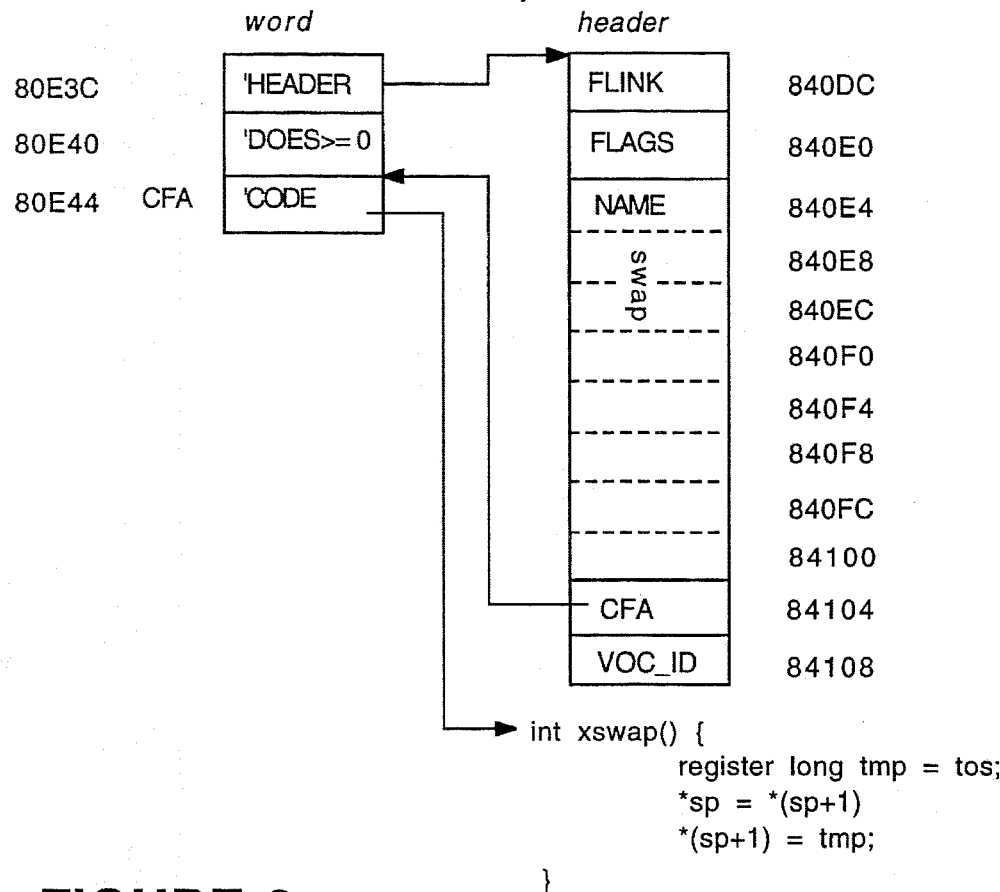

A primitive word is one whose behavior is provided by a single C function which is called any time the primitive is executed. There is a one to one relation between the primitive and the C function. The implementation of two primitives, + and swap, is illustrated in FIG. 2. The + primitive takes the top two items on the parameters stack, adds them together, and leaves the result on the parameter stack. The swap primitive takes the top two items on the parameter stack and interchanges their relative positions—the top item becomes the second item and the previously second item is now on top; i.e., it swaps one for the other.

The implementation consists of two portions, a header and the word, which are linked together. The main content of the header is a string of ASCII characters giving the symbolic name of the word. When the user types in the name of a word to be executed or compiled, the headers are searched to find one matching the name typed in by the user, and once a match is found, a pointer in the header indicates where the word itself is stored.

The word in turn indicates what action should be taken when the word is executed. In the case of all words, the CFA points to a C function which is to be executed when the word is executed. For a primitive, there is no other action which will occur beyond the execution of the associated function. In a primitive the DOES> field is always 0.

Figure 3:
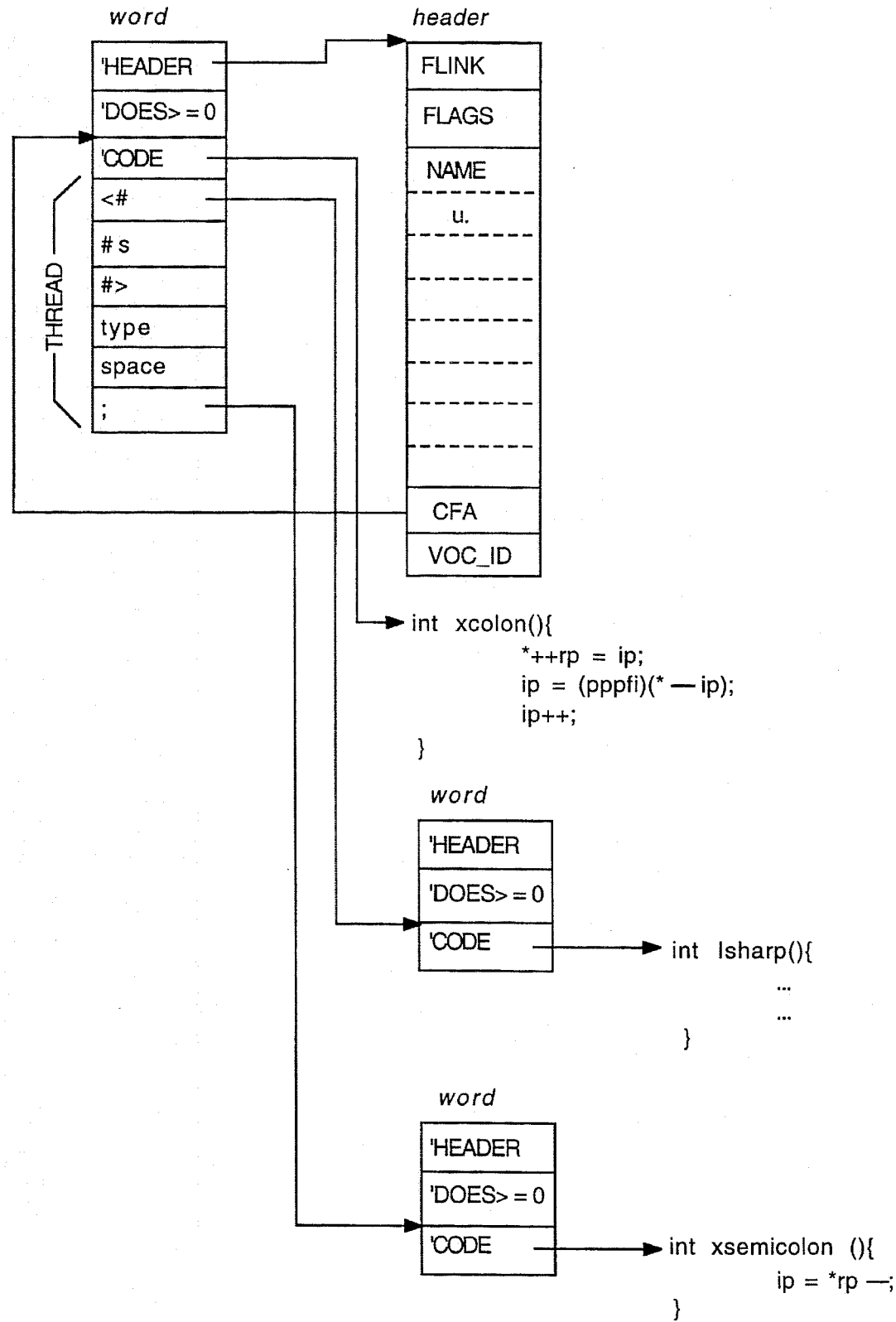
FIG. 3 is a pictorial representation of memory usage by a C4TH typical thread.

FIG. 3 illustrates the implementation of a typical thread. In this case, it represents the execution behavior of the word "u." whose behavior is commonly defined by the colon definition : u. <# #s #>type space ;

Like all words in C4TH, it has an associated header and it begins with three fields:

1 'HEADER—points to the associated header
2 DOES>—if this word was created by a defining word using the CREATE—DOES>construct, this field points to the DOES>portion of the defining word. Otherwise this field is 0.
3 'CODE—points to an associated C function which will be immediately executed to start the execution of this word. In the case of a primitive, this C function will be the only thing executed when this word is executed. In the case of a thread, this field points to a C function named xcolon.

Figure 4:
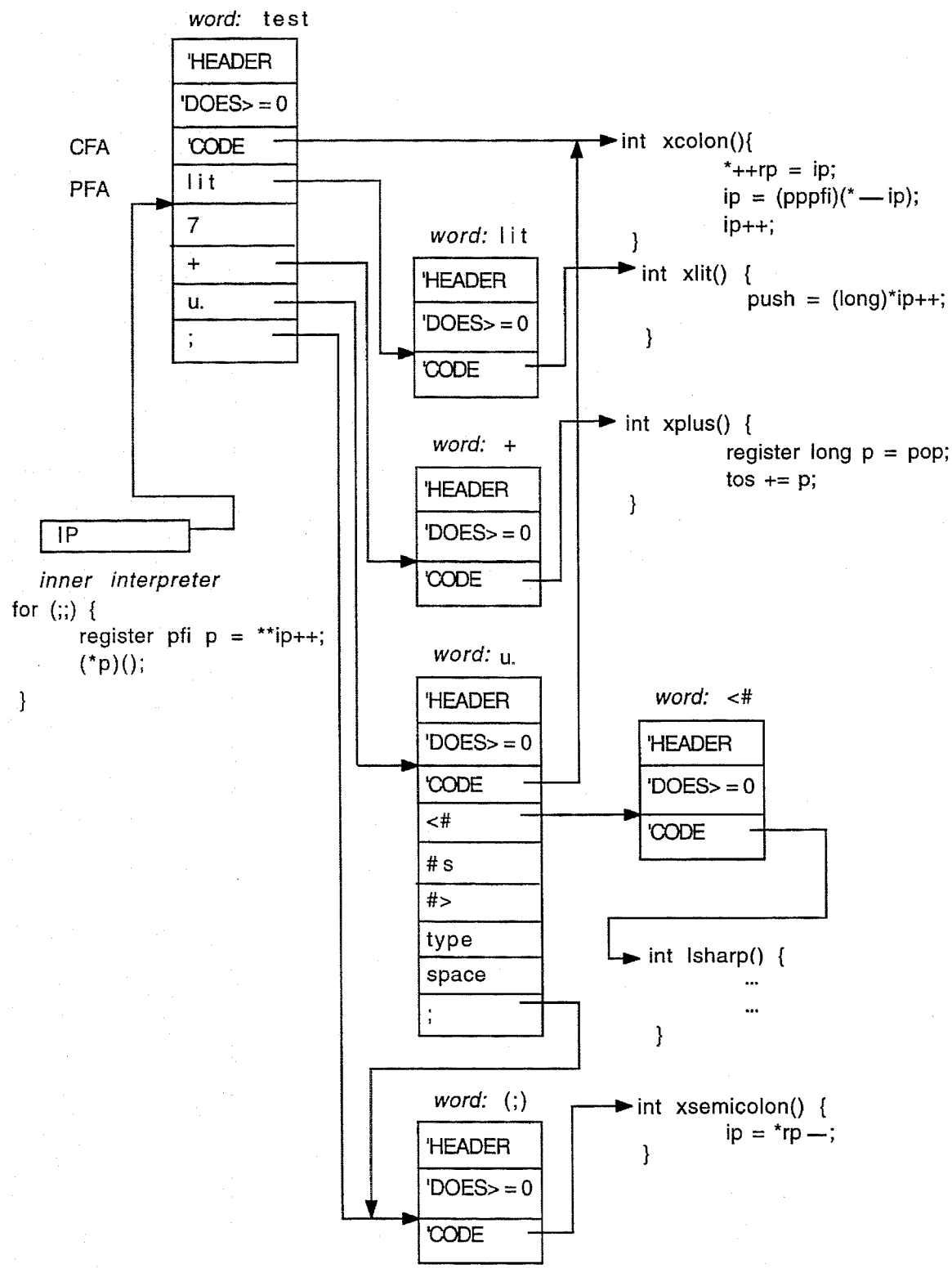
FIG. 4 is a pictorial representation of memory usage by a more complicated C4TH thread.

These three fields are followed by the parameter field of the thread. This consists of a series of pointers to words which are to be consecutively executed when the thread is executed. Data parameters serving as inputs to these words may be intermixed with the pointers. This is not illustrated in FIG. 3 but can be seen in FIG. 4. FIG. 4 shows a more complicated arrangement of threads, such as would be produced by the compilation of the following two statements:

: u. <# #s #>type space ;
: test 7+u. ;

The effect of the word test is to add seven to the value on the top of the parameter stack and print the results. When the word test is executed, the interpreter pointer (IP) points to the beginning of the parameter field as shown in FIG. 4.

The code for the inner interpreter is shown immediately below the interpreter pointer. As it executes, it performs a doubly indirect function call to the C function xlit, advancing the interpreter pointer to the next position in the thread, leaving it pointing to the literal value 7. The xlit function places the value pointed to by the interpreter pointer, 7, onto the parameter stack and advances the interpreter pointer, leaving it pointing to the reference to +. xlit then returns control to the inner interpreter.

The inner interpreter then performs a doubly indirect function call to the C function xplus, advancing the interpreter pointer to the next position in the thread, pointing to the reference to "u.". xplus adds the top two values on the parameter stack and leaves the result on the parameter stack. It then returns control to the inner interpreter.

The inner interpreter then performs a doubly indirect function call to the C function xcolon, advancing the interpreter pointer to the next position in the thread, pointing to the reference to ";". xcolon pushes the current value of IP onto the return stack, and then sets IP so it points to the beginning of the thread in the word "u.". It then returns control to the inner interpreter. In effect, xcolon has performed a transfer of control from the thread test to the thread "u." in a manner analogous to a subroutine call. At the completion of execution of the thread "u." control can be returned to the thread test using the value saved on the return stack.

The inner interpreter then consecutively executes the code for each of the words specified in the thread for "u.". At the conclusion of the thread for u. the inner interpreter will execute the code associated with the reference to ";"—the C function xsemicolon This function pops the top of the return stack, placing the return address back into IP. This is analogous to a return from a subroutine call, and at the conclusion of this operation, xsemicolon returns control to the inner interpreter which will resume interpretation of the thread for test.

At this point the end of the thread test has been reached and xsemicolon is called once again, returning control to whatever routine had originally invoked test.

Created words come in two flavors:

1. Simple data words, and
2. more complicated doer words.

Figure 5:
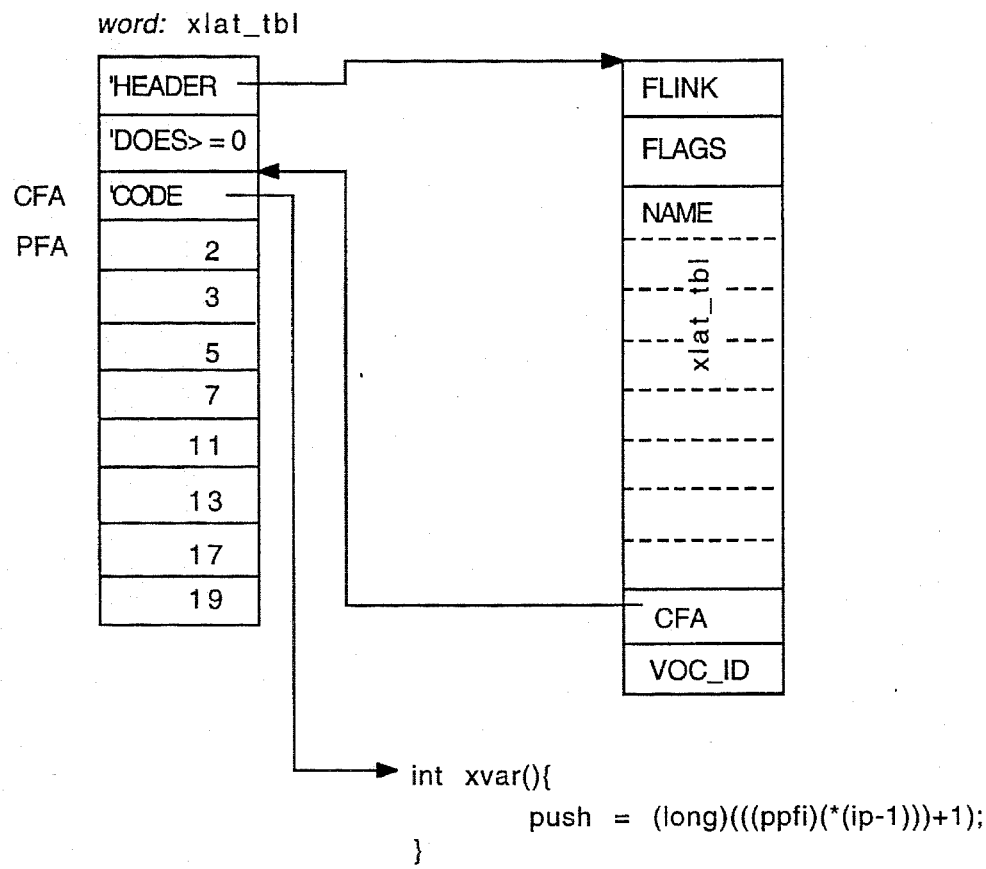
FIG. 5 is a pictorial representation of memory usage by a simple C4TH data word.

A simple data word provides storage for one or more items of data. When it is executed, it simply returns the address where the data can be found. An example is shown in FIG. 5. The 'CODE field of a simple data word always points to a C routine called xvar and the DOES> field is 0. When executed, xvar returns the address of the parameter field for the word which called it.

Simple data words are commonly brought into being using the word create which will create a word whose 'CODE field points to xvar. The user will then store data into the word using storage allocation words such as ",", or allot. The example shown in FIG. 5, which contains the values of the first eight prime numbers, could be created using the following C4TH code:

create xlat_tbl 2, 3, 5, 7, 11, 13, 17, 19,

Such a word could be used together with another word to return the value of any of the first eight primes, given a number as an input. An example of such a word would be : Nth-prime (u1—u2) CELL * xlat_tbl +@;

In practice, one could view xlat_tbl as a simple array, and Nth-prime as a word which accesses the Nth entry of that array.

The more complex doer words also provide storage for data, but in addition they provide an associated access routine which determines what happens when the doer word is executed. In every doer word the 'CODE field points to the C function xxdoes and the 'DOES> field points to a thread which describes the access behavior for the word.

Figure 6:
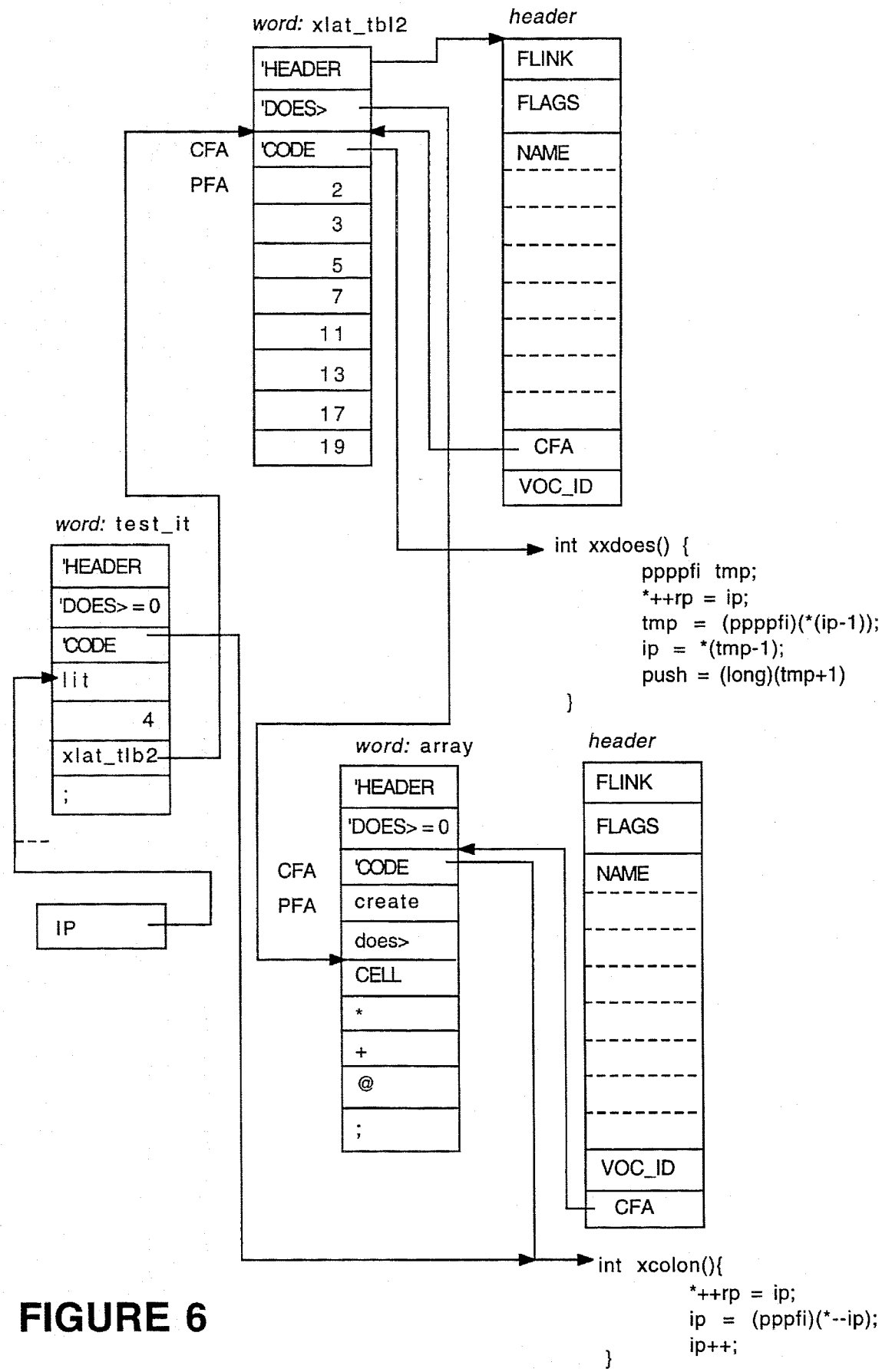
FIG. 6 is a pictorial representation of memory usage by the C4TH doer word.

An example is shown in FIG. 6. The arrangement illustrated in FIG. 6 would be created by the following code:

array ( -- ) create does>(u1 -- u2 ) swap CELL * +@;

array xlat_tbl2 2, 3, 5, 7, 11, 13, 17, 19,
: test_it 4 xlat_tbl u. ;

This is similar to the previous example, in which we created a word called xlat$_{13}$ tbl. However, this time the word xlat$_{13}$ tbl2 is a doer word. Any time it is referenced, it will use the top value on the parameter stack as an index into its contents and return the corresponding value. The word test$_{13}$ it is a simple test word illustrating the behavior of xlat$_{13}$ tbl2.

When test$_{13}$ it is executed, it will place the value "4" onto the parameter stack and then execute xlat$_{13}$ tbl2. When xlat_tbl2 is executed, the C function xxdoes takes control and does the following:

1. It pushes the current value of IP onto the return stack.
2. It loads IP with the address contained in the 'DOES> field of xlat_tbl2. In effect it has transferred control to the access routine specified by the does> portion of the word array.
3. It pushes the parameter field address of xlat_tbl2 onto the parameter stack. This will provide an input to the access routine, letting it know where the data can be found.
4. It then returns control to the inner interpreter, which will then proceed to execute the thread given by the access routine in array.

The access routine uses the index value "4" (second item on parameter stack) together with the address of the data (first item on the stack) to compute the address of the fourth item of data and fetch its contents. At the end of the access routine, the primitive xsemicolon is executed, returning control to the thread in test_it which then prints the result—11. Note that the index value "4" actually accesses the fifth element of the array in xlat_tbl2; i.e., it uses 0-based indexing.

200L and FSML operate by creating words and data structures which appear to be ordinary words to the inner interpreter; i.e., it can interpret their behavior just like any other words.

Figure 7:
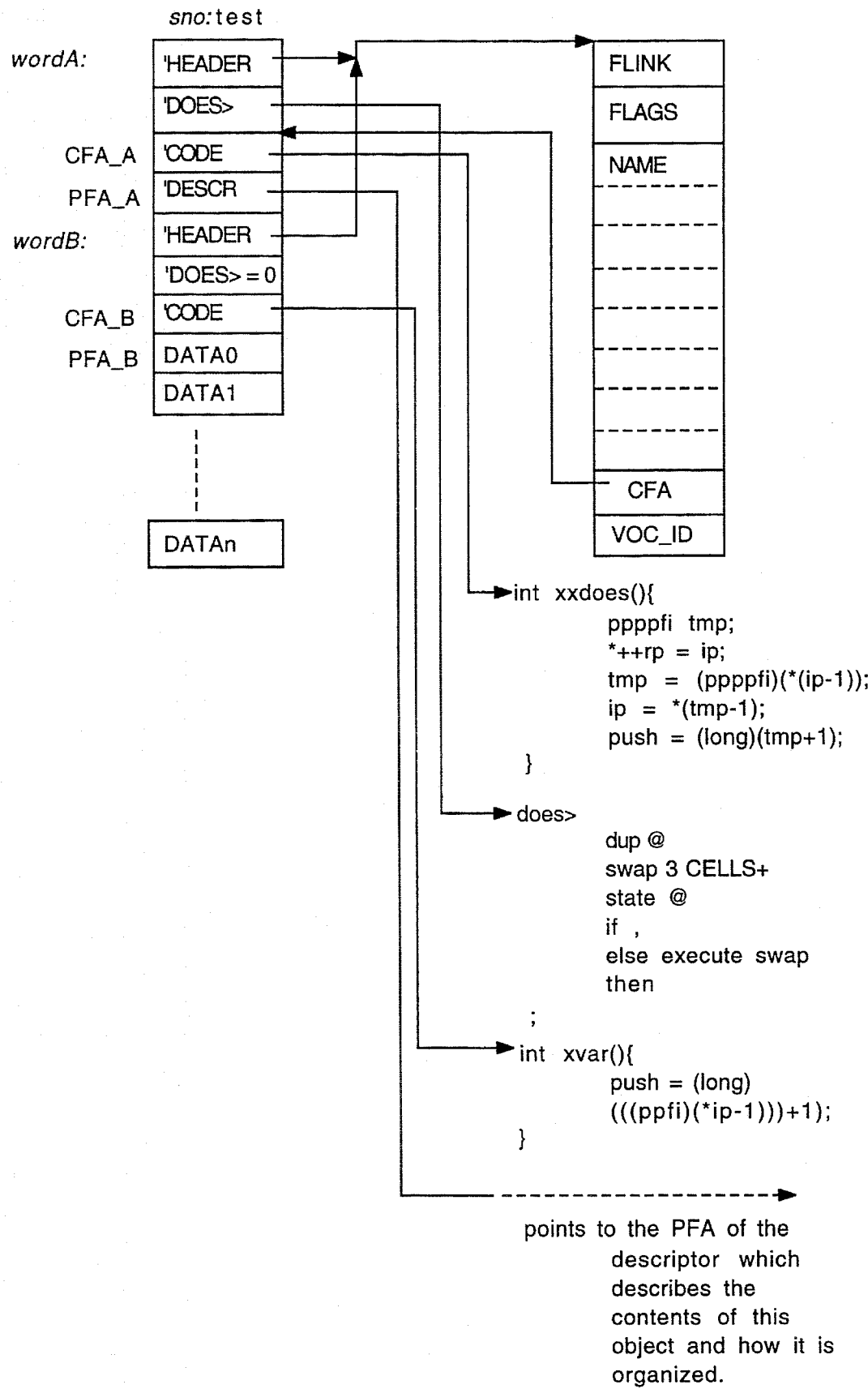
FIG. 7 is a pictorial representation of memory usage by 200L for a static named object (SNO).

FIG. 7 illustrates the format of an important data structure created by 200L called a static named object (SNO). Such an object could be created by the 200L syntax <classname>MAKE test A static named object has the following properties:

1. It has a header in the dictionary and an associated symbolic name; i.e., it has a name by which it can be referenced.
2. It is actually implemented as two related words—wordA and wordB. wordA is executed any time the word is being referenced by its symbolic name (note that the CFA field of the header points to wordA).
3. When an SNO is referenced by its symbolic name, wordA is executed and generates a reference to the second word, wordB. It also leaves the address of the descriptor for the SNO on top of the parameter stack. In generates the reference to wordB in one of two different fashions, depending on whether the C4TH system is in interpret or compile mode (identified by the contents of the user variable state):
   a) If state is 0, indicating that C4TH is in interpret mode, wordA will leave the address of the parameter field of wordB as the second item on the parameter stack. It will leave the address of the descriptor on top of the parameter stack.
   b) If state is non-zero, indicating that C4TH is in compile mode, wordA will compile the address of the code field of wordB into the dictionary. It will also leave the address of the descriptor on top of the parameter stack. When the thread which is being compiled executes, it will in turn execute wordB which will at that time leave the address of its parameter field on top of the parameter stack.
4. When a reference to wordB is executed, it will leave the address of its parameter field on the parameter stack, indicating where the data can be found.

Any time a reference is made to a SNO using its symbolic name, the address of its descriptor is left on top of the parameter stack. This address is used by the following method name to determine what class the SNO belongs to. Knowing the class to which the object belongs and the name of the method which is to be applied to that object, it is then possible to generate a reference to the thread for the appropriate method to be used to operate on the object.

200L

The implementation of 200L is presented by describing, step by step, how the 200L system handles a typical example of 200L code. The example is as follows:

```
01   method: set_seed
02   method: raw_random
03   method: rand
04   class: random
05   private:
06   short: +seed1
07   short: +seed2
08   public:
09   m: set_seed ( u -- ) oa +seed1 !!
10   0 oa +seed2 !! ;m
11   m: raw_random ( -- u ) oa +seed1 @@ 307 *
12   23 + dup oa +seed1 !!
13   oa +seed2 @@ 521 * 29 +
14   dup oa +seed2 !! + ;m
15   m: rand ( u1 -- u2 ) oa raw_random
16   swap mod ;m
17   ;class
18   random MAKE my_random
19   478 my_random set_seed
20   6 my_random rand
```

Note that each line is preceded by a line number. These line numbers would not normally be present in 200L code, but are placed in the example to facilitate referencing individual lines in the description which follows.

Figure 8:
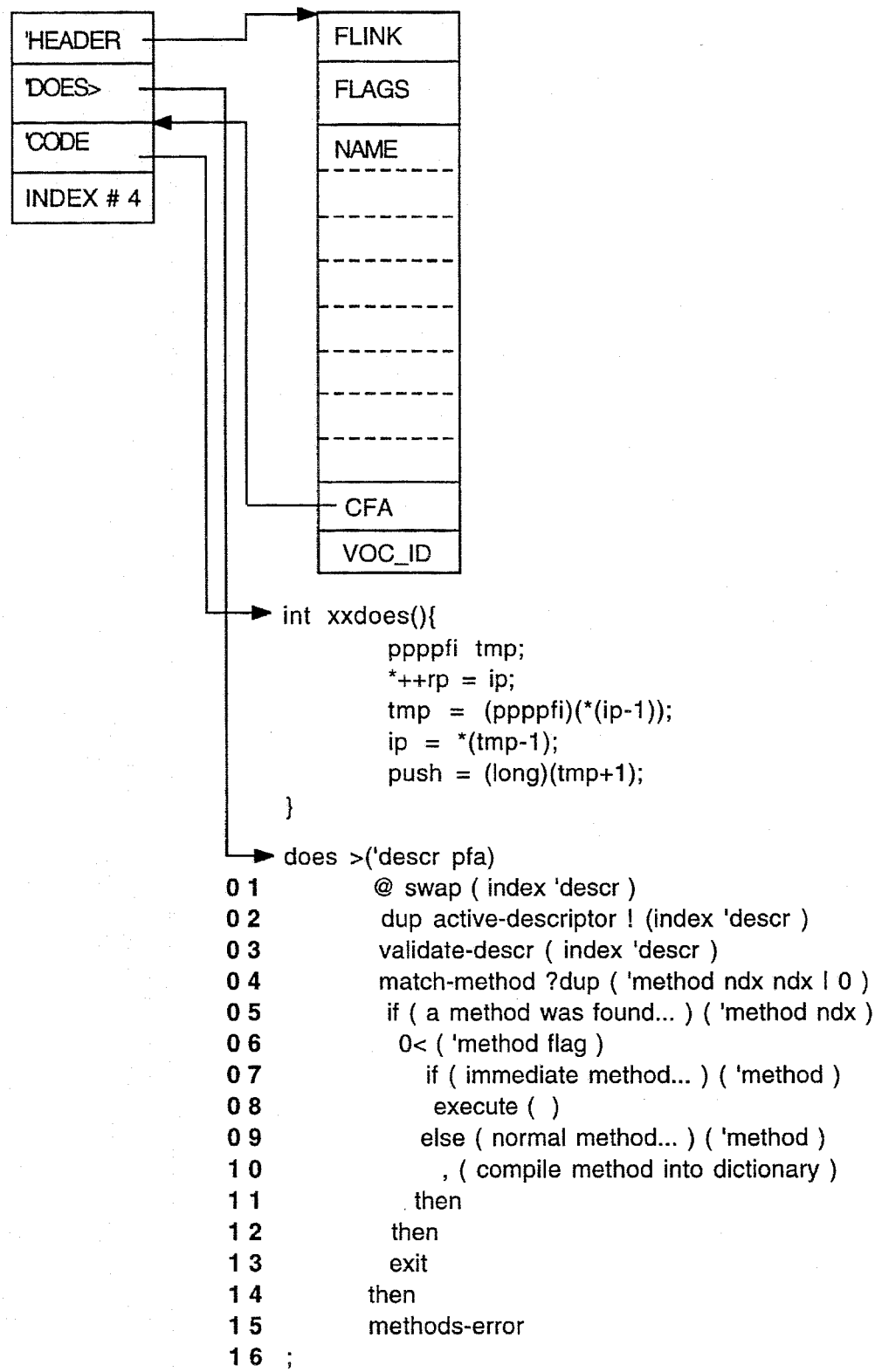
FIG. 8 is a pictorial representation of data structure built by the word method: in 200L.

Line 01: the word method: is a keyword defined in 200L. It takes the following word provided by the user, in this case the word set_seed, and defines it as the name of a method. It does this by defining the word set_seed as a doer word method: allocates a unique index number which it assigns to set_seed. This index number is subsequently used to cross-reference the symbolic name set_seed with the actual method code defined in the class. The data structure built by method: is illustrated in FIG. 8.

Index values are assigned starting with the value 4. Each new index value is four greater than the preceding value; i.e., the two least significant bits are zero. These bit positions will be modified depending on whether the method is public or private method: also provides the access routine used by set_seed any time set_seed is referenced. This access routine expects that, at the time of reference, the top value on the parameter stack will point to a class descriptor. The access routine takes the following actions:

1. It performs a sanity check to verify that the top item on the parameter stack was a pointer to a class descriptor.

2. It then searches through the methods-list of that class descriptor, looking for a methods_node whose index field matches the index value assigned to this method. If it does not find such a methods_node, then this method is not valid for that class and an error message will be output.

3. Assuming that a methods_node can be found, then the access routine will determine the address of the code for the method and will either execute that code immediately or compile it into the dictionary, as appropriate.

Figure 9:
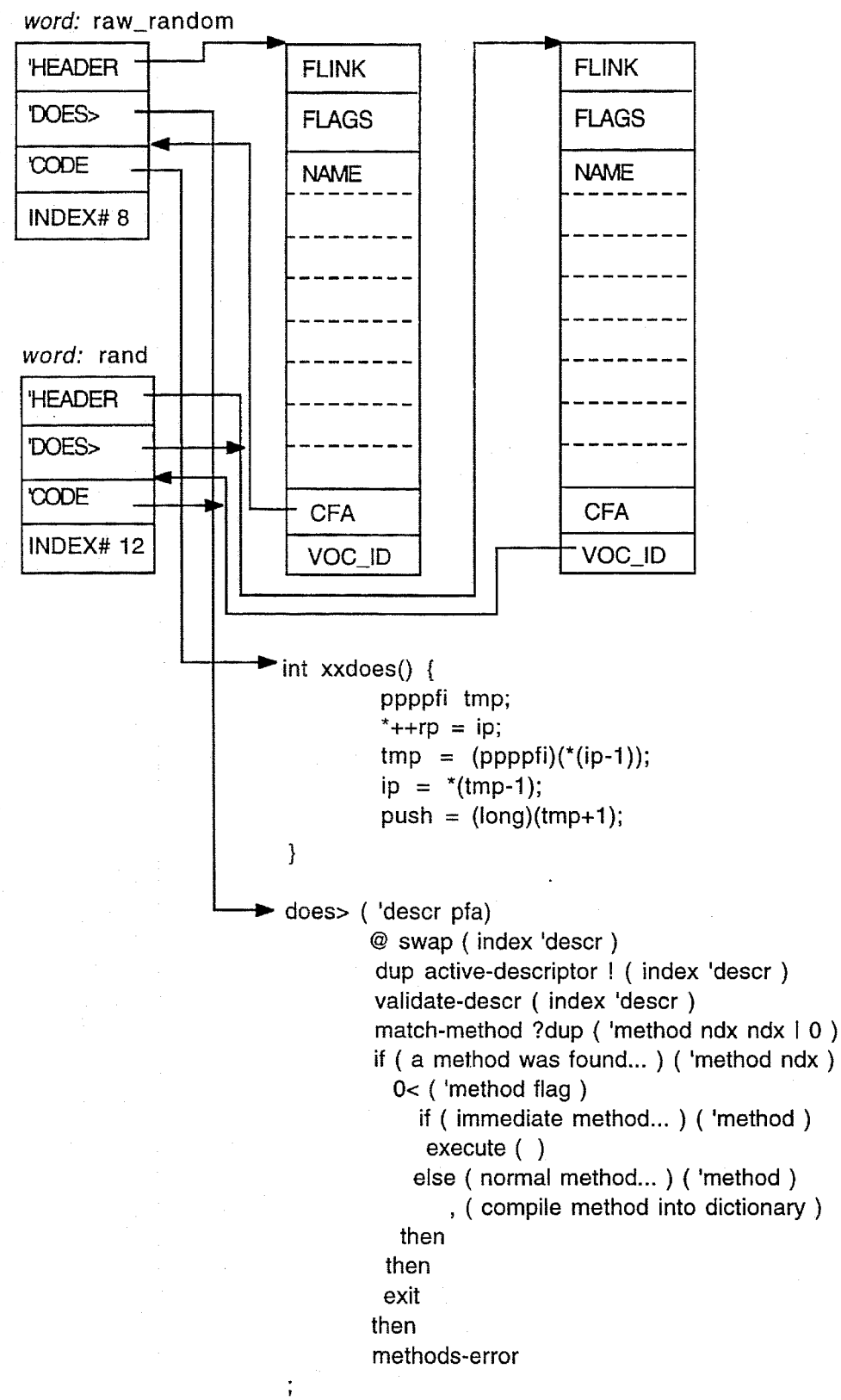
FIG. 9 is a example of data structure built by the word method: in 200L.

Lines 02 and 03: like Line 01, these lines define two additional method names: raw_random and rand. The corresponding data structures are illustrated in FIG. 9.

Line 04: the word class: is a keyword defined in 200L. It starts the definition of a new class by doing the following:

It creates and initializes a descriptor for the class random.

It loads the variable curr-class with the address of the descriptor for random.

It leaves a value of 0 on the top of the parameter stack. As each element making up the structure of the class random is defined, this value will be incremented by the number of bytes of space required by that element. At any given time this value indicates the offset from the beginning of the object to the position occupied by the next element to be defined. After all elements have been defined, this value will indicate the size of an object of this class.

Figure 10:
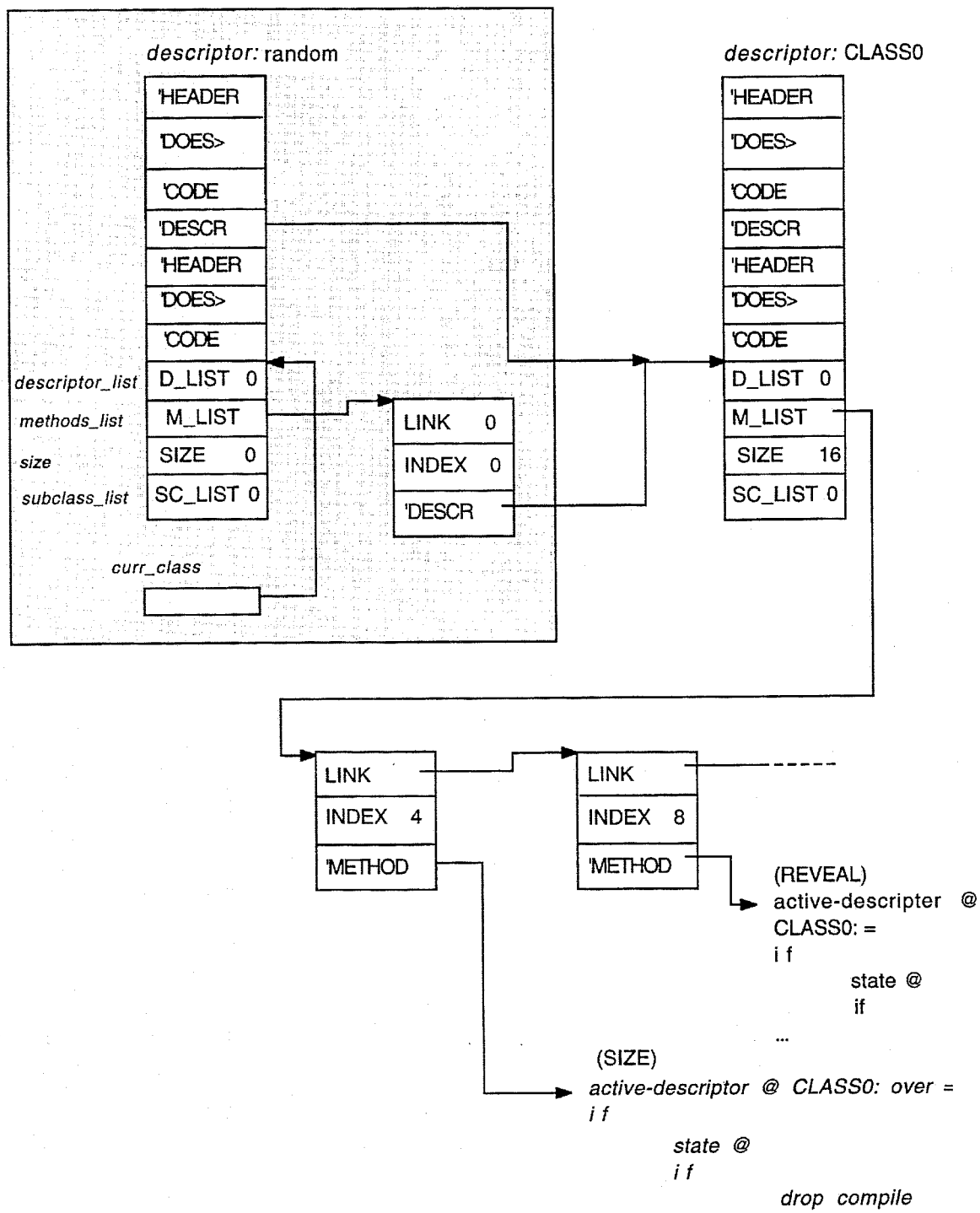
FIG. 10 is a pictorial representation of memory usage by a 200L descriptor.

The initial data structure for the descriptor is illustrated in FIG. 10. The contents of this descriptor will be modified as the class is further defined.

The descriptor consists of four elements:

1. A descriptor list which will eventually comprise a linked list of descriptor nodes, each of which will describe a portion of the structure of an object belonging to this class. At the time the descriptor is created by the word class:, the descriptor list is empty, indicated by the 'DN_NODE field being null (0).

2. A methods list which will eventually consist of a list of method_nodes, each of which identifies one or more methods which are defined for this class. At the time the descriptor is created by the word class:, the method list consists of a single item—a method_node which points to the descriptor for CLASS0. This method node indicates that all of the methods defined for CLASS0 are also defined for the new class random.

3. A size field which indicates the natural size in bytes occupied by an object which belongs to this class. At the time the descriptor is created by the word class:, the size is not known and this field is initialized with a value of 0.

4. A subclass list which links together all the subclasses which may be defined within this class. At the time the descriptor is created by the word class:, the subclasses are not yet defined and the subclass list is empty, indicated by the 'subclass field being null (0).

Line 05: private: indicates that those methods which are subsequently defined should be treated as local to this class and not accessible to words which are defined outside the scope of this class definition. The word private: is very simple—it clears a flag in the variable public-flag. Those keywords which define methods always examine this flag at the time they define a method and make it public or private accordingly.

Line 06: the word short: is a keyword defined in 200L. It takes the following word provided by the user, in this case the word +seed1, and defines it as the name of a method. It also indicates that the first element of any object belonging to the class random should be treated as a short (2-bytes long), signed integer. As the word short: executes, it performs the following actions:

It defines a new method, much as method: does, giving it the name +seed1.

It creates a descriptor node indicating that the first element within an object of the class random is a short, signed integer.

It attaches this descriptor node to the end of the descriptor list.

It creates a method node, indicating that the method +seed1 is a valid method for the class random.

It attaches this method node to the beginning of the methods list of the descriptor for the class random.

It creates a word sharing the symbolic name +seed1 and having the execution time behavior necessary to access this element in any object belonging to class random.

It increments the offset value found on the top of the parameter stack by two, indicating that the size of an object belonging to class random is known to be at least two bytes long and that the next element to be defined will be at an offset of two from the beginning of the object.

Figure 11:
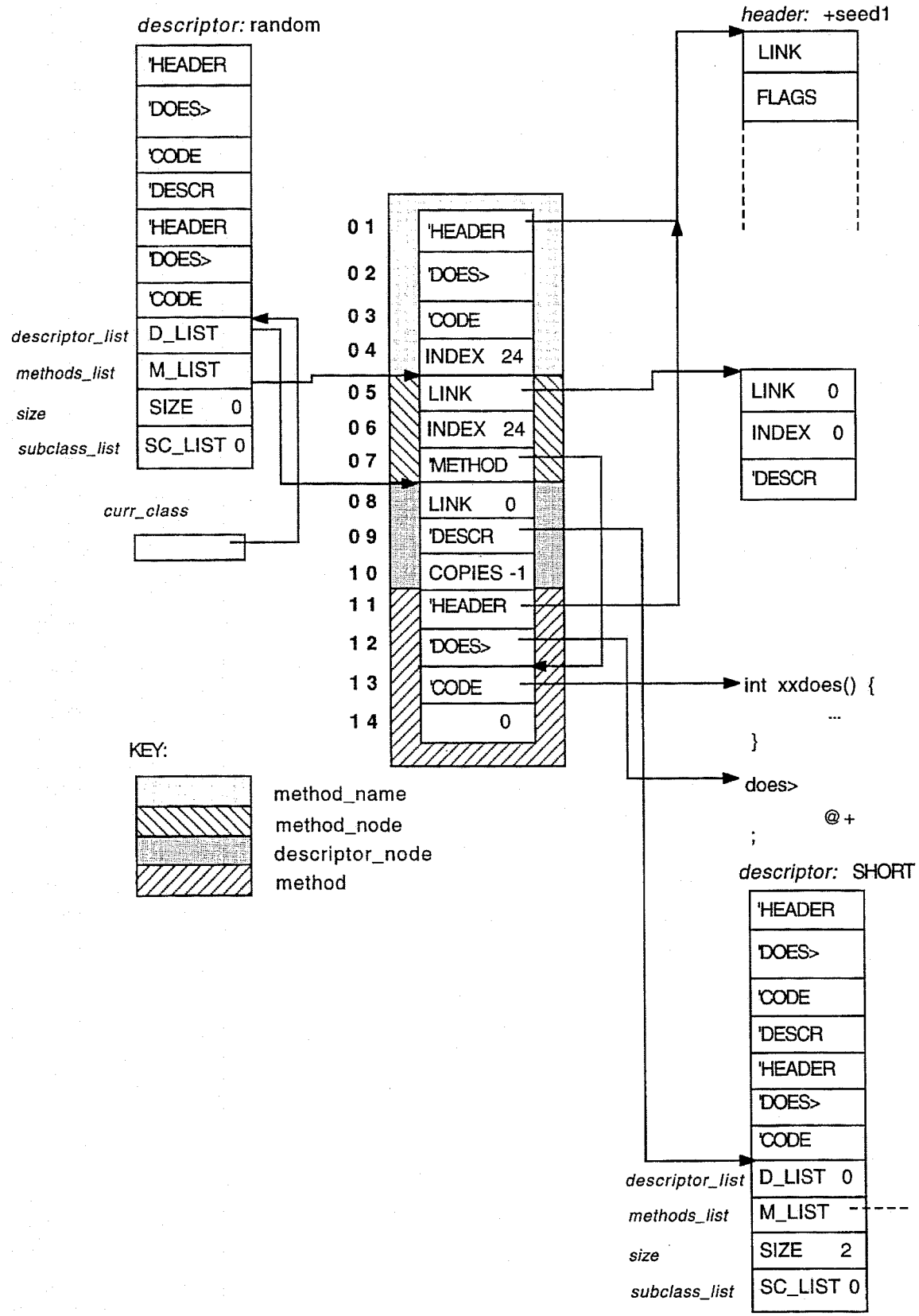
FIG. 11 ms a pictorial representation of memory usage by 200L as a result of the execution of short: +seed1.

The results of executing short: +seed1 are illustrated in FIG. 11. Those portions of the figure which are shaded indicate data structures created and initialized by the word short:. The format of the method_name (lines 1–4) is virtually the same as that created by method: and its 'DOES> field points to an access routine that is essentially identical to that generated by method:. Like any method name, it has a unique index value.

A method_node created by short: has three fields:

1. A link field used to link method_nodes together into a linked list—the methods-list.

2. An index field which stores the same index value that is associated with the method name; i.e., there is a one-to-one association between the contents of this field and the method name. When this field is initialized, the least significant bit is set to "1" if the public-flag indicates that this method should be treated as public for this class. Otherwise this bit is cleared to zero.

3. A 'method field which stores the address of the word which specifies the behavior of this method for this class.

Given the symbolic name of a method, it is easy to determine the associated index value. It is then possible to search the methods_list of any given class descriptor to find a method_node having a corresponding index value. If no such method_node can be found, then that method is not defined for that class. Assuming it is found, it is then possible to go from the method_node to the address of the code which is to be executed when that method is applied to an object belonging to the class.

A descriptor_node has three fields:

1. A link field used to link descriptor_nodes together into a linked list—the descriptor-list.

2. A 'descr field which points to a descriptor providing information about the element.

3. A copies field which indicates whether the element is actually an array of items described by the 'descr field, or whether it is in fact a single item of the type specified by the 'descr field. A value of −1 indicates that this is a single item, not an array.

short: will always create a descriptor node whose 'descr field points to a descriptor for the class SHORT. This descriptor is provided as part of 200L. This descriptor indicates that the size of an object (or element) of type SHORT is 2 bytes. Its descriptor_list is empty. This is characteristic of a data type which does not contain any substructure. Its methods_list contains methods_nodes for a number of methods which are defined by OOL as being applicable to an object (element) or type SHORT. This includes methods such as PRINT, DUMP, A DDR, SIZE, !!, MAKE, etc.

The method created by short: is relatively simple and is structured like a doer word. Its 'HEADER field points back to the header for the symbolic name +seed1. Its 'DOES> field points to an access routine which adds the offset of the element to the top value on the parameter stack which contains the base address of the object. The effect of this is to generate the address of the element +SEED1. Like all create-does> words, the 'CODE field points to the C function xxdoes(). The parameter field contains a single value—the offset of the element. Since +seed1 is at the first element in the object, the offset value is 0.

Line 07: the word short: is encountered once again. It takes the following word, +seed2, and handles it almost identically to +seed1. A different, unique index value is assigned and the offset value is now 2 instead of 0. The value on top of the parameter stack is incremented by 2 (the size of a short element), leaving a result of 4.

Line 08: public: indicates that those methods which are subsequently defined should be treated as publicly known; i.e., not restricted to use only by methods defined within this class. public: is the opposite of private: and like private: it is easily implemented—it sets a flag in the variable public-flag.

Line 09: m: starts the definition of the method set_seed by performing the following actions:

1. It uses the C4TH dictionary search routines to verify that there is a method-name defined for set_seed. If it cannot find such a method-name, it returns an error message.
2. Assuming the method-name is found, it obtains the index number assigned to that method-name.
3. It constructs a method-node, using that index value, and links the method-node into the methods-list.
4. It constructs the first part of a word definition—the 'HEADER, 'DOES>, and 'CODE fields.
5. It initializes 'HEADER to point to the header for the method-name; 'DOES> to 0; and 'CODE points to the C function xcolon(). This word will be a thread.
6. It compiles the CFA for set-oa as the first entry in the thread.
7. It then puts C4TH into compile mode, allowing C4TH to compile the rest of the method.

The word set-oa handles a simply utility function required at the beginning of the execution of any method—it saves the current value of the constant oa onto the return stack and places the top value from the parameter stack into the constant oa. By convention, this value will be the base address of the object that the method is acting on.

Figure 12:
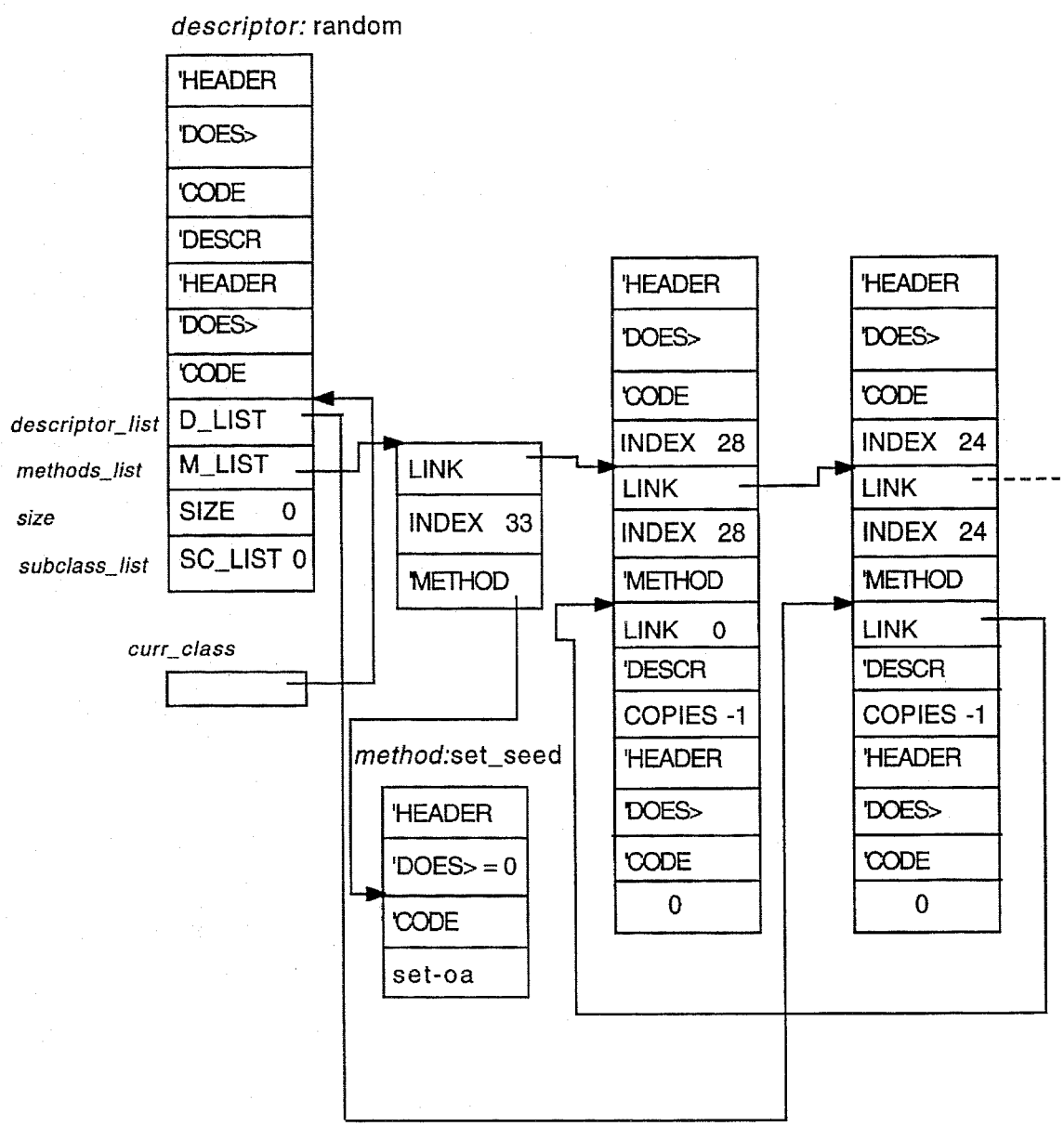
FIG. 12 is a pictorial representation of memory usage by 200L as a result of the execution of m:.

When the word m: completes execution, that data structures are as shown in FIG. 12. Note that descriptor-nodes are inserted into the descriptor list at the tail of the list. This ensures that a traversal of the descriptor list from the beginning to the end corresponds to a traversal of the elements in the object from base address to the end of the object.

Methods-nodes are inserted into the methods-list at the front of the list. This allows a method to be defined multiple times within a class but only the most recent, public version of the method will be recognized.

Figure 13:
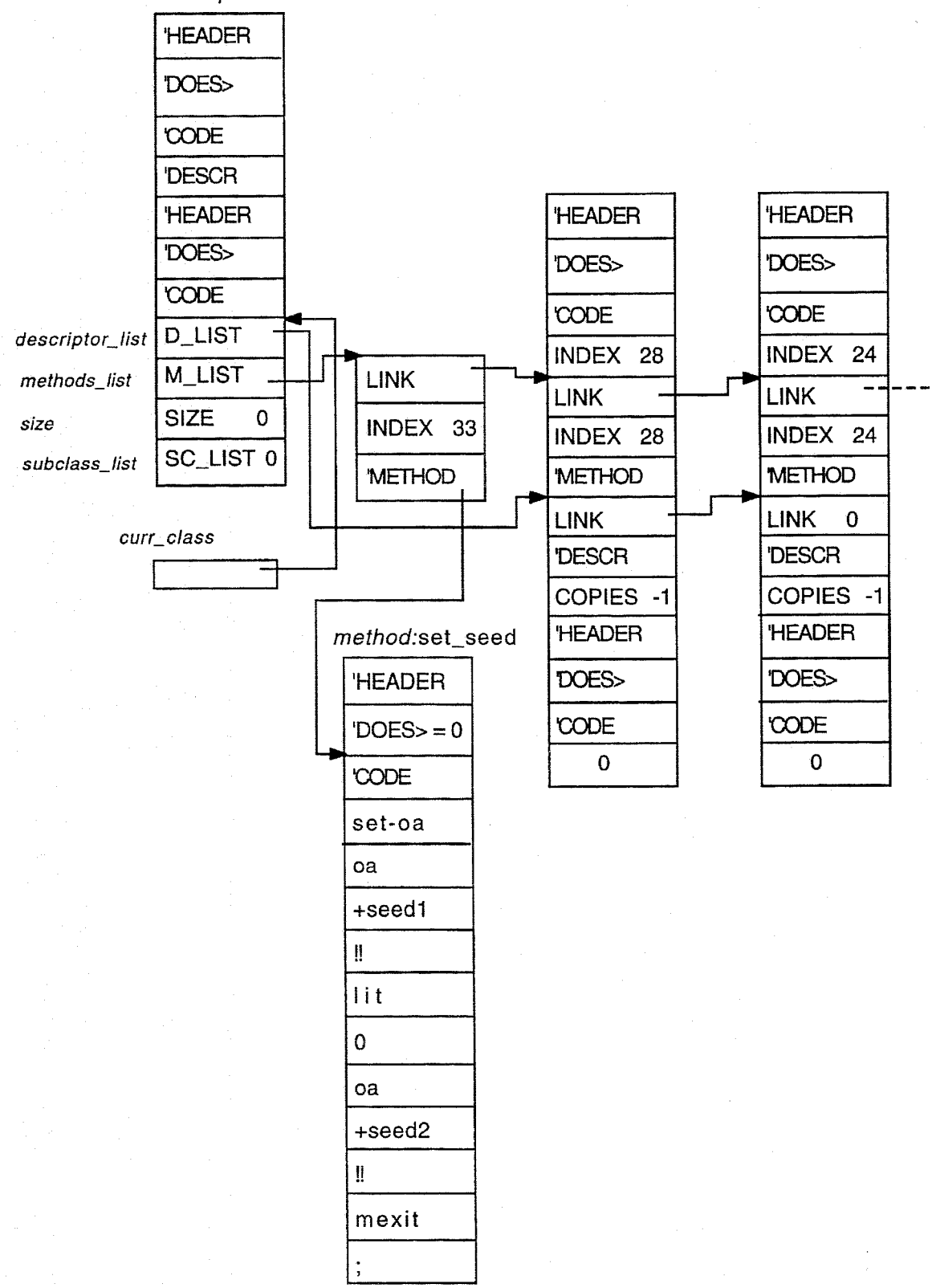
FIG. 13 is a pictorial representation of memory usage by 200L.

Line 10: ;m completes the definition of a method. It compiles the word mexit into the dictionary and then invokes the word ";". The word mexit performs the inverse function of set-oa—it pops the top value from the return stack and places it into the constant oa, restoring the value that oa had prior to the start of execution of the method. The result of compiling lines 9 and 10 is shown in FIG. 13.

Lines 11 to 16: define two more methods—raw random and rand. The compilation of these lines is no different than that of lines 9 and 10.

Line 17: ;class completes the definition of the class random. It does so by performing the following actions:

1. It takes the top value from the parameter stack and places it into the size field of the class descriptor. In the case of the class random, this value will be 4.
2. It then invokes the conceal routines to mark the private methods as invalid. The conceal routines traverse the methods-list, searching for those method-nodes whose index field has the least significant bit clear, indicating that they are private, not public. It then sets bit 1 of the index field for each of these method-nodes. When bit 1 is set, the search routines which search the methods-list for a given index value will fail to find a match on these methods-nodes; i.e., they will no longer be detected as valid for this class.

This method of hiding methods-nodes which are private was chosen because it is easily reversible for debugging or for exceptional cases where two classes need to share information which is otherwise private.

Line 18: random MAKE my_random will create an instance of the class random and give it the symbolic name my_random. The following actions take place as these words are executed:

1. The word random is the name of a class descriptor which is itself an object belonging to CLASS0:. Its behavior is the same as any other object name: It places the address of its contents (the descriptor for the class random) onto the parameter stack. It then places the address of the descriptor of the class to which it belongs, CLASS0:, on top of the parameter stack.
2. The word MAKE is the name of a method. Like any other method-name, it expects to find the address of a class descriptor on top of the parameter stack. It then searches the methods-list for this class, CLASS0:, to see if there is a method-node whose index value matches that of the method MAKE. Such a method-node exists and points to the code which will construct an object belonging to the class random. This code will now be executed.
3. The MAKE method expects to find the address of a descriptor on top of the parameter stack. This was provided by the word random. The code for MAKE examines the size field of the descriptor and creates a static, named object having the specified amount of storage. The word which follows MAKE will be used as the symbolic name for the object—my_random. The contents of my_random will be undefined.

Line 19: 478 my_random set_seed will initialize the contents of my_random. The following actions take place as this code is executed:

1. 478 leaves the literal value 478 on top of the parameter stack.

2. my_random is the name of an object. It places the address of its data contents onto the parameter stack. It then places the address of its class descriptor on top of the parameter stack.

3. the word set_seed is a method. Like any other method-name, it expects to find the address of a class descriptor on top of the parameter stack. It then searches the methods-list for this class, random, to see if there is a method-node whose index value matches that of the method set_seed. Such a method-node exists and points to the thread which was defined for set_seed. This code will now be executed.

4. As the code for set seed executes, it first finds the address of the object, my_random, on top of the parameter stack. The word set-oa saves the value of oa and places the object address into oa so that future references to oa will return the object address. set_seed then performs the initialization, placing the value 478 into the +seed1 element of my_random, and 0 into the +seed2 element. At the end of set_seed, the word mexit restores the original contents of oa.

Line 20: 6 my_random rand operates in a manner perfectly analogous to that of line 19.

FSML

The implementation of FSML is presented by describing, step by step, how the FSML system handles a typical example of FSML code. The example is as follows:

```
01    input in0
02    input in1
03    input tm1
04    tm1 20 create-timer timer1
05    user t1
06    machine m1
07       ." activating instance of m1" cr
08       states
09          s0
10          s1
11       end-states
12       state s0
13          in0 s0 { ." received in0 while in s0" }
14          in1 s1 { ." received in1 while in s0"
15                   timer1 start-timer t1 ! }
16          or-else s0 { ." unexpected input while in s0" }
17       state s1
18          in0 s1 { ." received in0 while in s1" }
19          in1 s0 { ." received in1 while in s1"
20                   t1 @ stop-timer }
21          tm1 s0 { ." timer1 expired" }
22          or-else s1 { ." unexpected input while in s1" }
23       start-state s0
24    m-schedule m1 alias mtm ( mtm == my test machine )
25    select mtm
26    in1 >>>
27    73 >>>
```

Line 01: input is a keyword defined in FSML. It takes the following word and makes it the symbolic name for referencing an input to a machine. It does the following:

1 It generates a unique token value that will be used to uniquely identify this input when received by a machine.

2 It creates a constant having the symbolic name (in this case in0) and initialized to the value of the unique token.

3 It links the new word into a linked list of all inputs.

4 It compiles the value 0CCE8H as the next entry in the dictionary.

Figure 14:
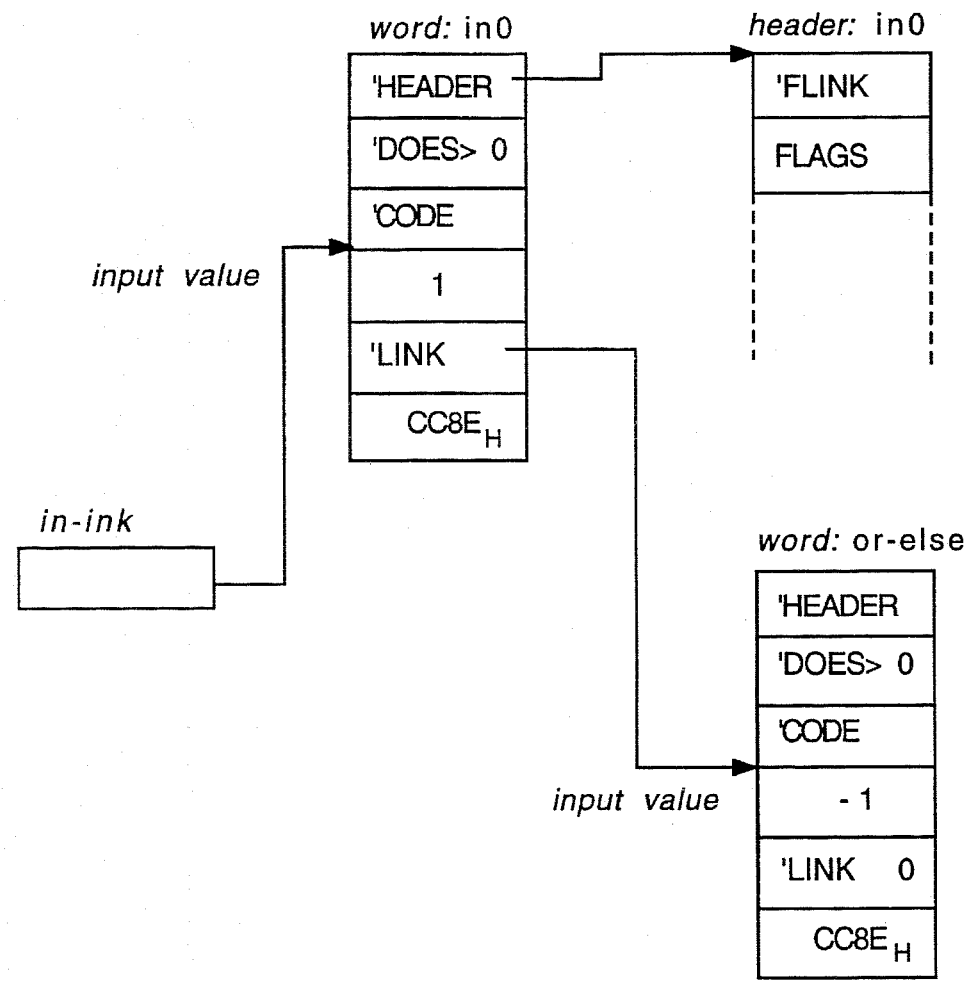
FIG. 14 is a pictorial representation of memory usage by FSML for the keyword input.

The results of this are shown in FIG. 14. The value CCE8H is compiled to provide a convenient means of checking whether a particular entry in the dictionary is an FSML input—if the third entry in its parameter value is 0CCE8H, it is assumed to be an FSML input.

Figure 15:
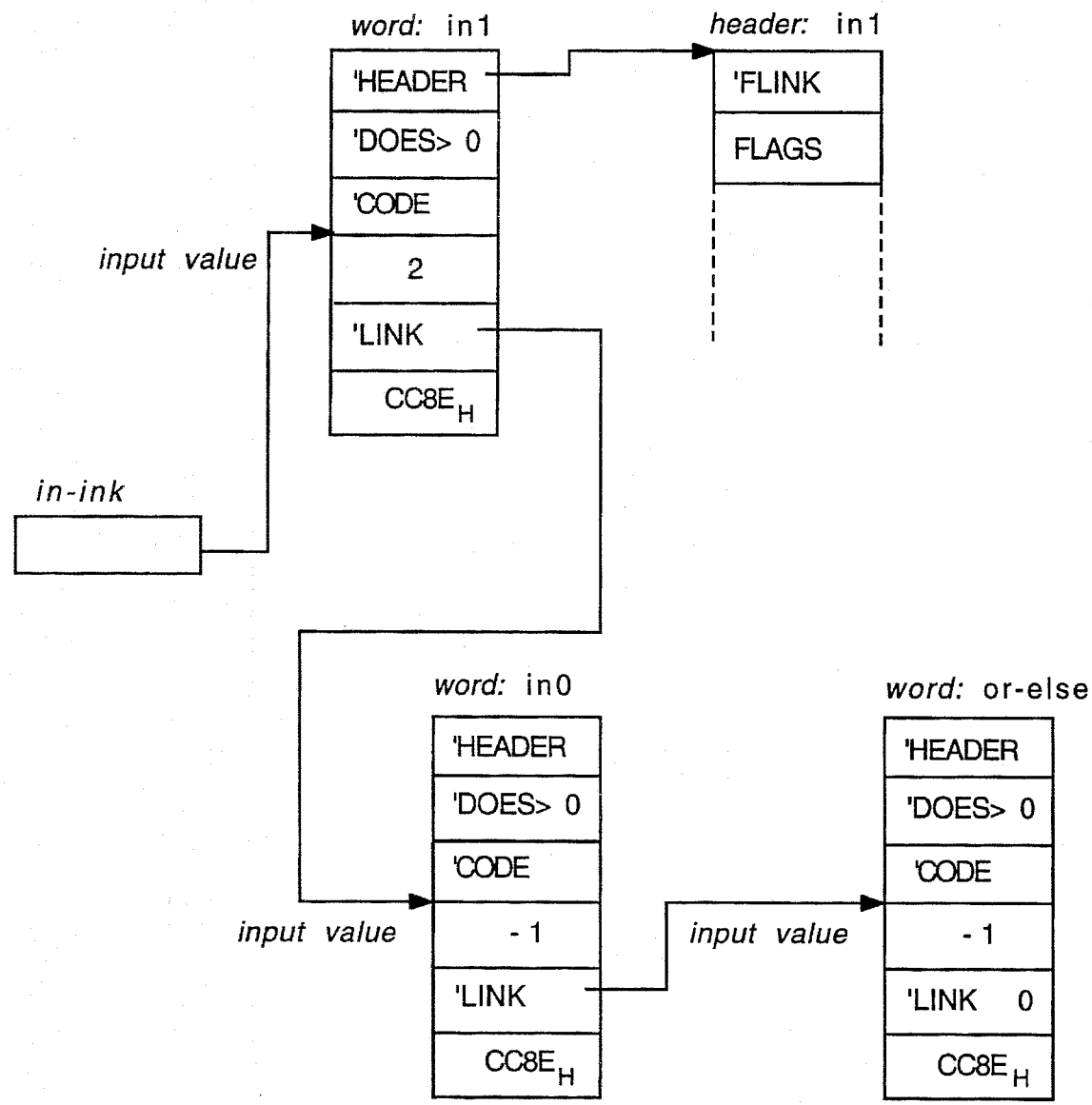
FIG. 15 is a pictorial representation of memory usage by FSML for the keyword input.

Line 02: defines another logical input name—in1. The actions taken are virtually the same as those indicated for Line 01. The results are shown in FIG. 15.

Line 03: defines another logical input name—tm1. The actions taken are virtually the same as those indicated for Lines 01 and 02.

Line 04: tm1 20 create-timer timer1 has the effect of defining a type of timer whose symbolic name is timer1. It does this in the following steps:

1 tm1 is the name of an input, and like all inputs acts like a constant. When it is executed it returns its value on the parameter stack. In this case the value 3.

2 20 is a literal value which leaves the value 20 on top of the parameter stack.

3 create-timer does most of the work. It creates a timer structure whose symbolic name is timer1. Execution of a reference to timer1 will return the address of the timer structure.

Figure 16:
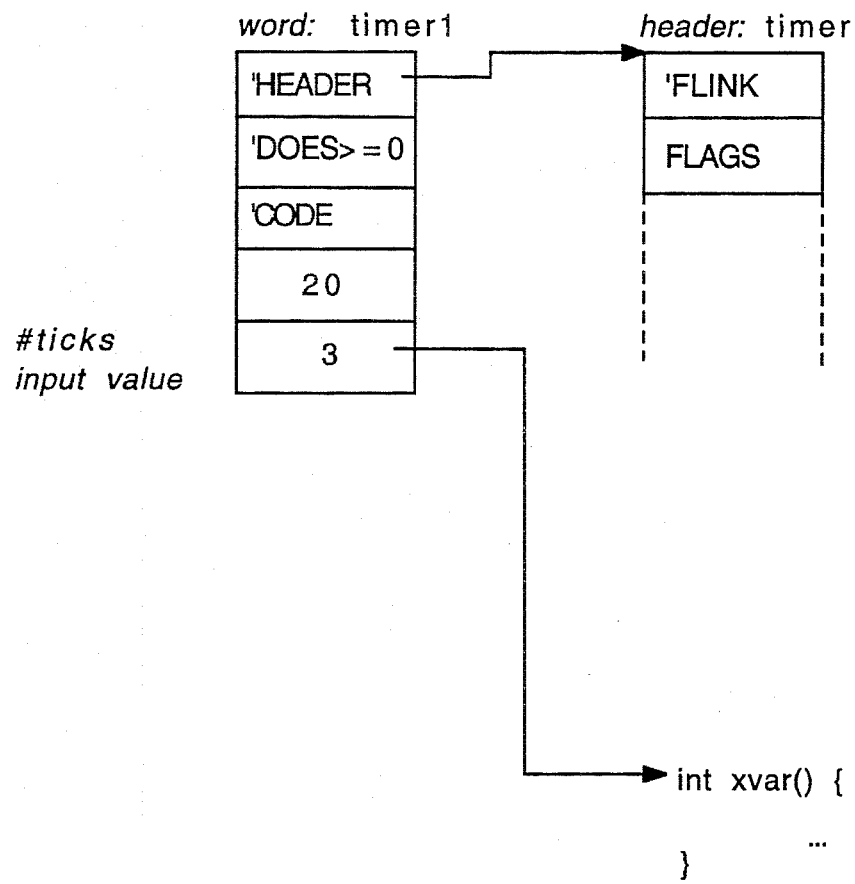
FIG. 16 is a pictorial representation of memory usage by FSML for create-timer timer1.

The results of this code are shown in FIG. 16.

Line 05: user t1 is just ordinary C4TH code, reserving a user variable which will subsequently be used to store the timer token returned by starting the timer.

Line 06: machine m1 begins the definition of a type of machine which will be named m1. The work is done by the word machine which does the following:

1 It creates a simple data word whose symbolic name is m1. It then proceeds to initialize the contents of this word, making it something of a hybrid between an ordinary data word and a thread.

2 It initializes the variable curr-mach to point to the parameter field of the word m1.

3 It compiles the literal value 0FEESH as the first entry in this word. This value is used for sanity checking—verifying whether a word is a valid machine type.

Figure 17:
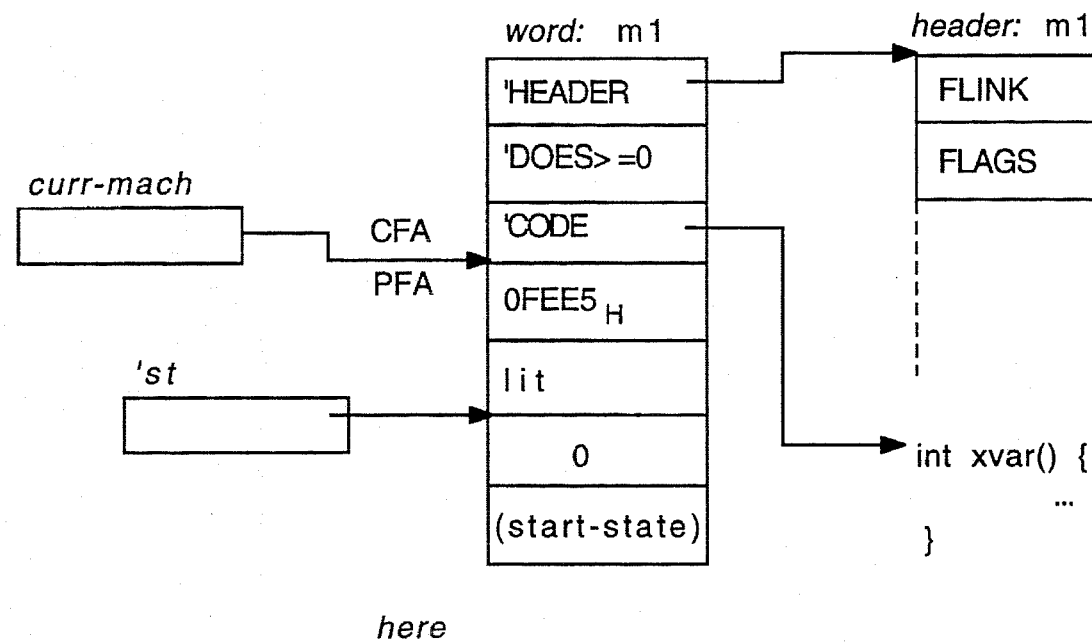
FIG. 17 is a pictorial representation of memory usage by FSML showing a part of the thread for machine m1.

4 It begins compiling a thread; starting with a section of code which will initialize the starting state of the machine when it is executed. Because the starting state is not known at this time, the variable 'st is set up pointing to the fragment of code which will need to be fixed up later to identify the proper starting state. The results of this are illustrated in FIG. 17.

5 It then switches C4TH into compiling mode, allowing the normal C4TH compilation process to complete the compilation of the thread.

Line 07: ."activating instance of m1" cr specifies a fragment of code which is to be executed any time a machine of type m1 is created and starts running. Normally this would be problem specific initialization code. In this case it is a simple message indicating that the machine has been created and started executing.

Lines 08 to 10: states terminates the definition of the initialization code and begins a block of code which will identify the symbolic names of all of the states for the machine m1. It performs the following actions:

1 It compiles a reference to (run-mach) at the end of the initialization code. (run-mach) is the actual routine which handles input processing for a machine; i.e., when initialization processing is complete, (run-mach) gets control and starts processing inputs as they become available.

2 It executes the word ; allowing it to finish the thread.

3 It then loops through the next series of words, making each of them the symbolic name for a state. The looping process terminates when it encounters the keyword end-states.

Figure 18:
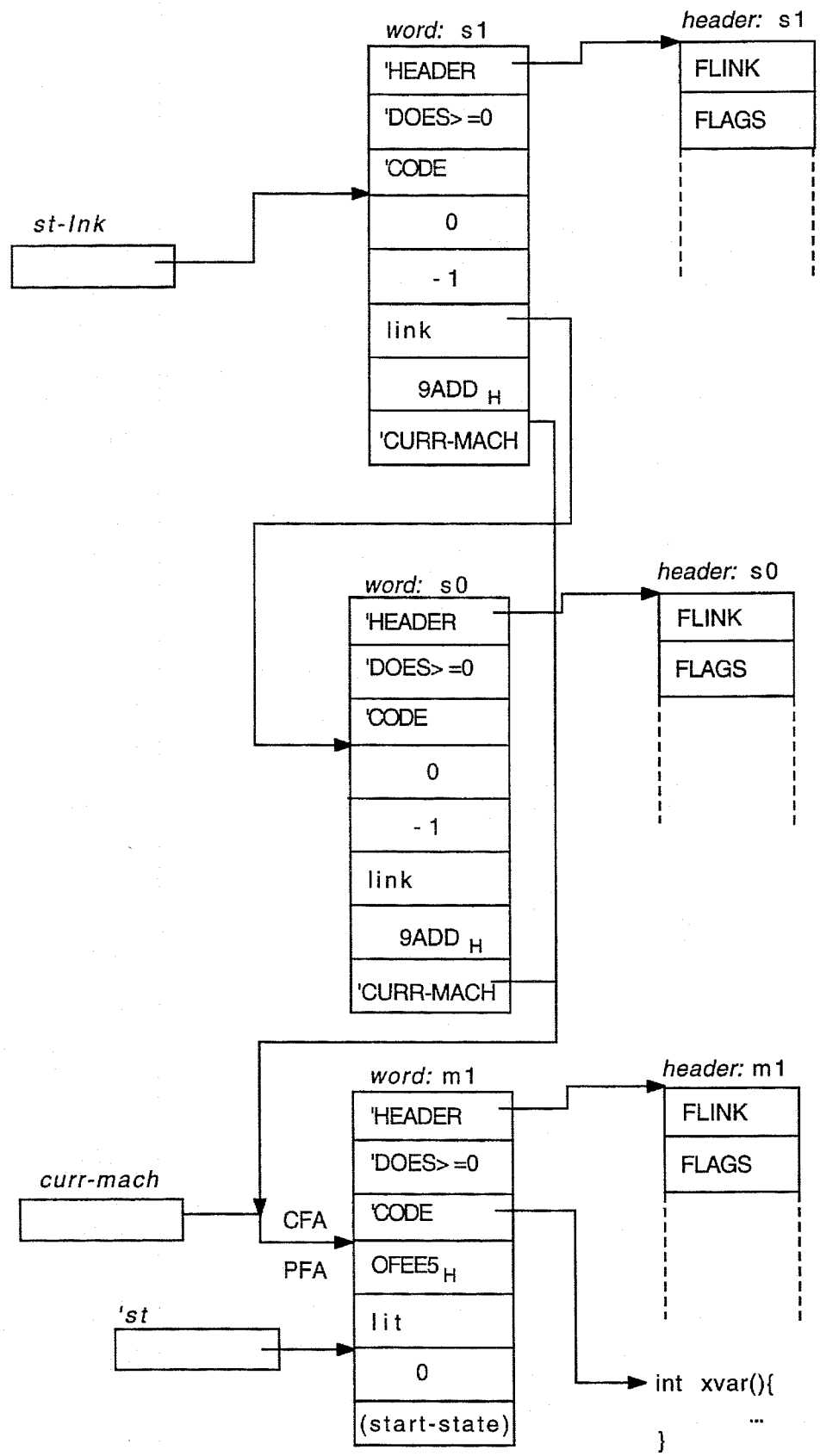
FIG. 18 is a pictorial representation of partial memory usage by FSML when creating states.

The result of this process is shown in FIG. 18. The data structures for each of the state names have the following properties:

The state names are simple data words, so their execution time behavior is to return the address of their data contents.

The first field is initialized to 0. While the behavior of the state is being defined, this field will serve as the head of a linked list of all the threads of code which specify the actions for each of the inputs which are defined for this state.

The second field is initialized to −1. This is a flag indicating that the state name has been defined but has not yet been used in a statement such as state s0. When the state behavior is specified, this field will point to the State Input Table associated with that definition.

The third field is a link field. All state names for a particular machine are linked together in a linked list. st-lnk is a variable which points to the first entry in this linked list.

The fourth field is the constant value 09ADDH which is used for sanity checking to determine whether a particular word corresponds to a valid state name.

The fifth field is a pointer to the data structure generated by the word machine. In this fashion, given a state name, it is possible to determine what machine it is associated with.

Line 11: end-states has no behavior of its own. It simply serves as a terminal indicator for states, indicating the end of the list of states.

Line 12: state s0 begins the definition of the behavior exhibited by the machine while it is in state s0. All of the work is done by the word state which takes the following actions:

1 It checks s0 to verify that it is a valid state name, defined by states . . . end-states.

2 It verifies the fact that this is the first occurrence of state s0; i.e., the behavior of s0 has not been previously defined.

3 It begins building the State Input Table entries required to define this states behavior.
  a) It places an entry in the SIT that points back to the body of the state name.
  b) It places a pointer to the routine process-input into the SIT, indicating that this routine should be used to evaluate the contents of the subsequent entries in the SIT.

4 It stores in the second field of the state name definition of s0 a reference to the relative position in the SIT of the link to process-input. This information will be needed at a later time to patch up address references which cannot be initially resolved.

Figure 19:
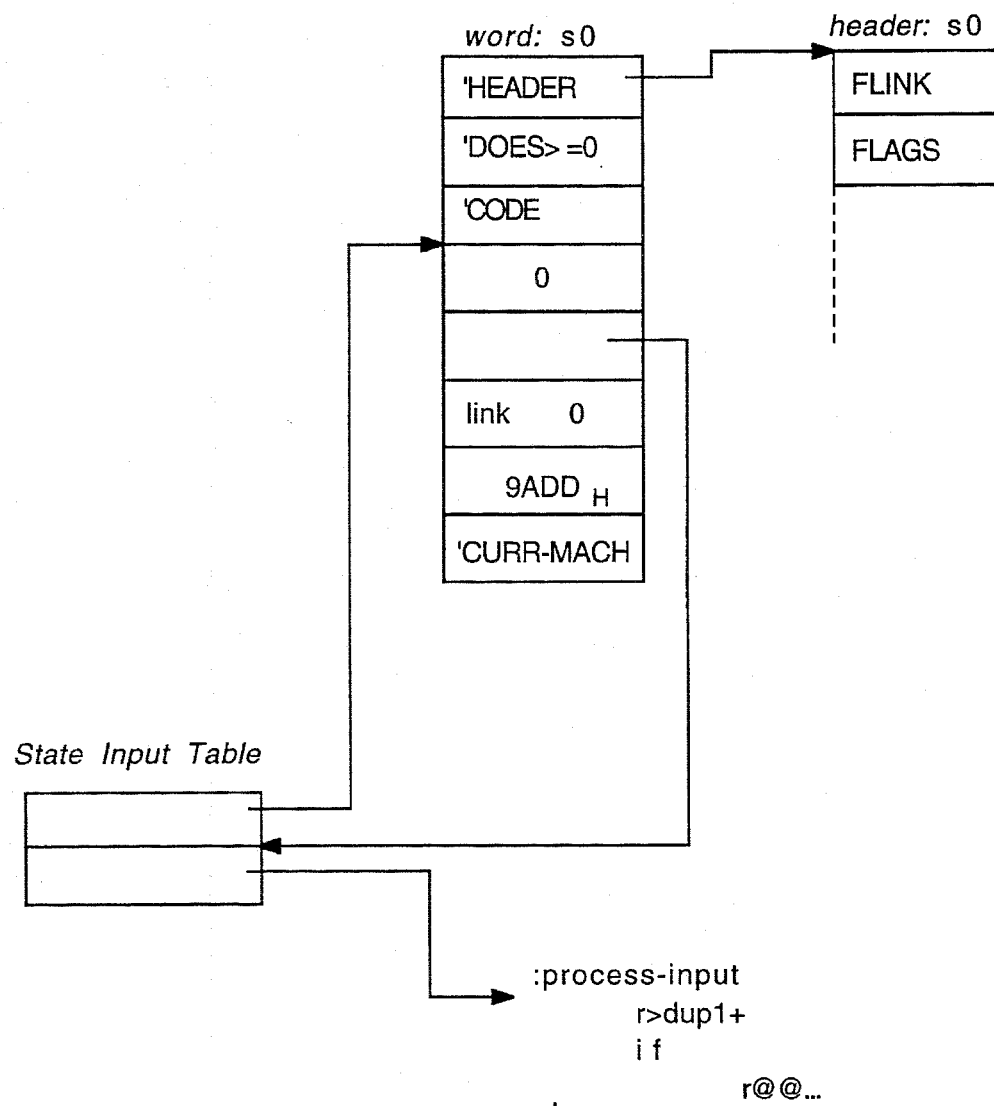
FIG. 19 is a pictorial representation of partial memory usage by FSML when creating state S0.

The results of this processing are illustrated in FIG. 19.

Line 13: in0 s0 {. "received in0 while in s0"} specifies the behavior of state s0 When input in0 is received. Most of the work is done by the word {. The following actions occur:

1 The word in0 is executed and leaves its value on the stack, a "1".

2 The word s0 is executed and leaves the address of its associated data on the stack.

Figure 20:
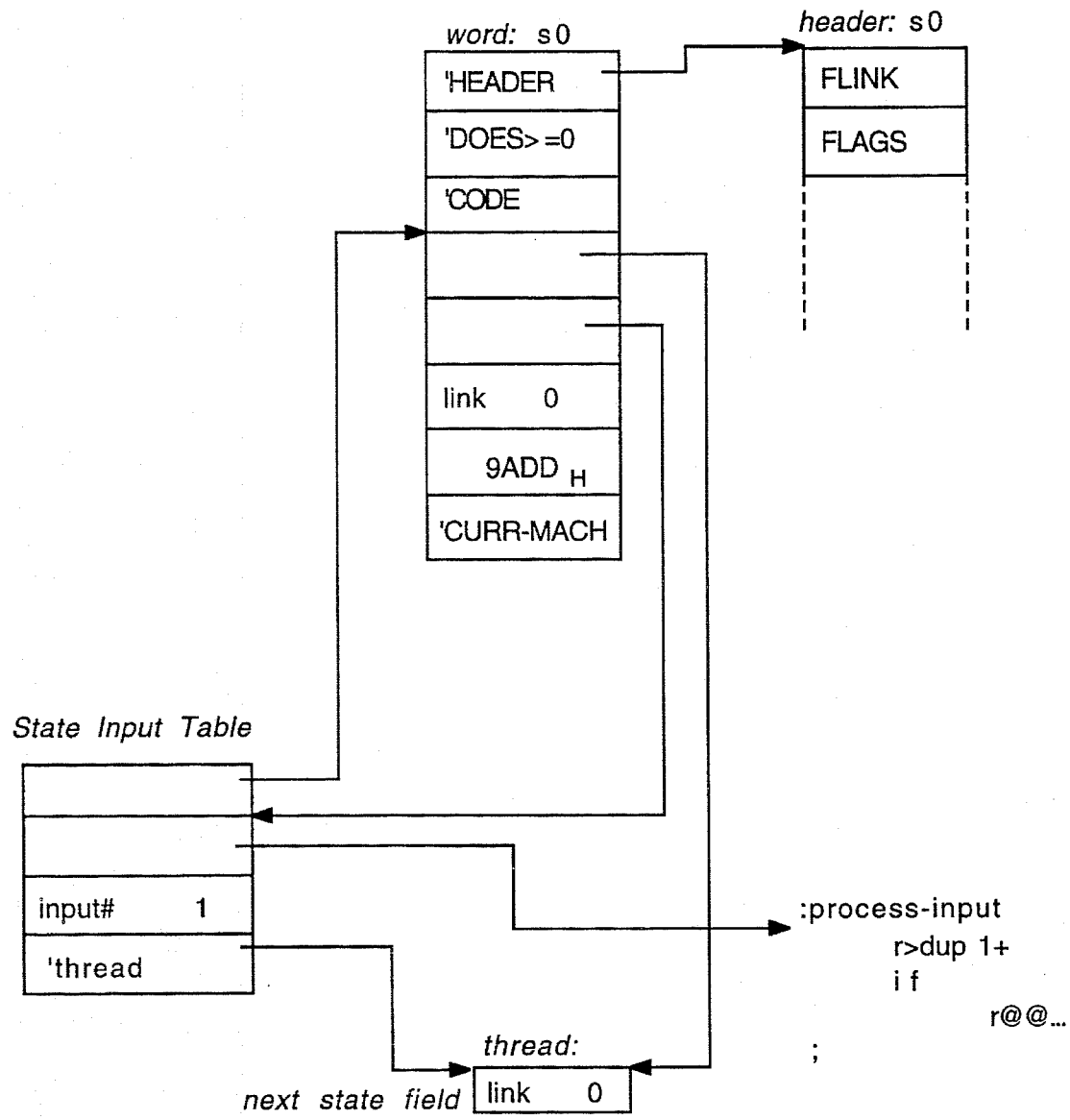
FIG. 20 ms a pictorial representation of memory usage by FSML once state SO is created.

3 The word { is executed and performs the following actions:
  a) It verifies that the input value left on the stack is valid and produces an error indication if it is not.
  b) Assuming the input value is valid, it is entered into the SIT.
  c) The current value of here is entered into the SIT. This provides a pointer to the location in the dictionary where the thread which defines the action associated with the input will be located.
  d) The preceding three steps will be repeated until there are no more input values remaining on the parameter stack. In the case of this example there is only a single input value, but the syntax of FSML allows for multiple values.
  e) It checks the address left by s0 to verify that it is indeed the address of a valid state name.
  f) It begins to construct the thread which will be executed any time a machine of type m1 receives an input value of in1 while in state s0. It links this thread into a linked list of threads associated with the state name s0. This is done via the first element in the data for the state name. Eventually this link field in the thread will be replaced with the identity of the next state s0.
  g) It then concludes by putting the C4TH system into compile mode, allowing the regular C4TH compilation process to finish compiling the thread. At this point in time, the appropriate data structures are as illustrated in FIG. 20.

4 The C4TH compiler processes the code fragment ."received in0 while in s0" and compiles it into the thread.

5 The C4TH compiler encounters the word } which is immediate and executes it.

6 The word } terminates the compilation of the thread. Depending on a user option, it may compile a reference to (stk-chk) at the end of the thread. This word performs a runtime check for spurious data left on the stack. } then calls ; to terminate the definition.

Figure 21:
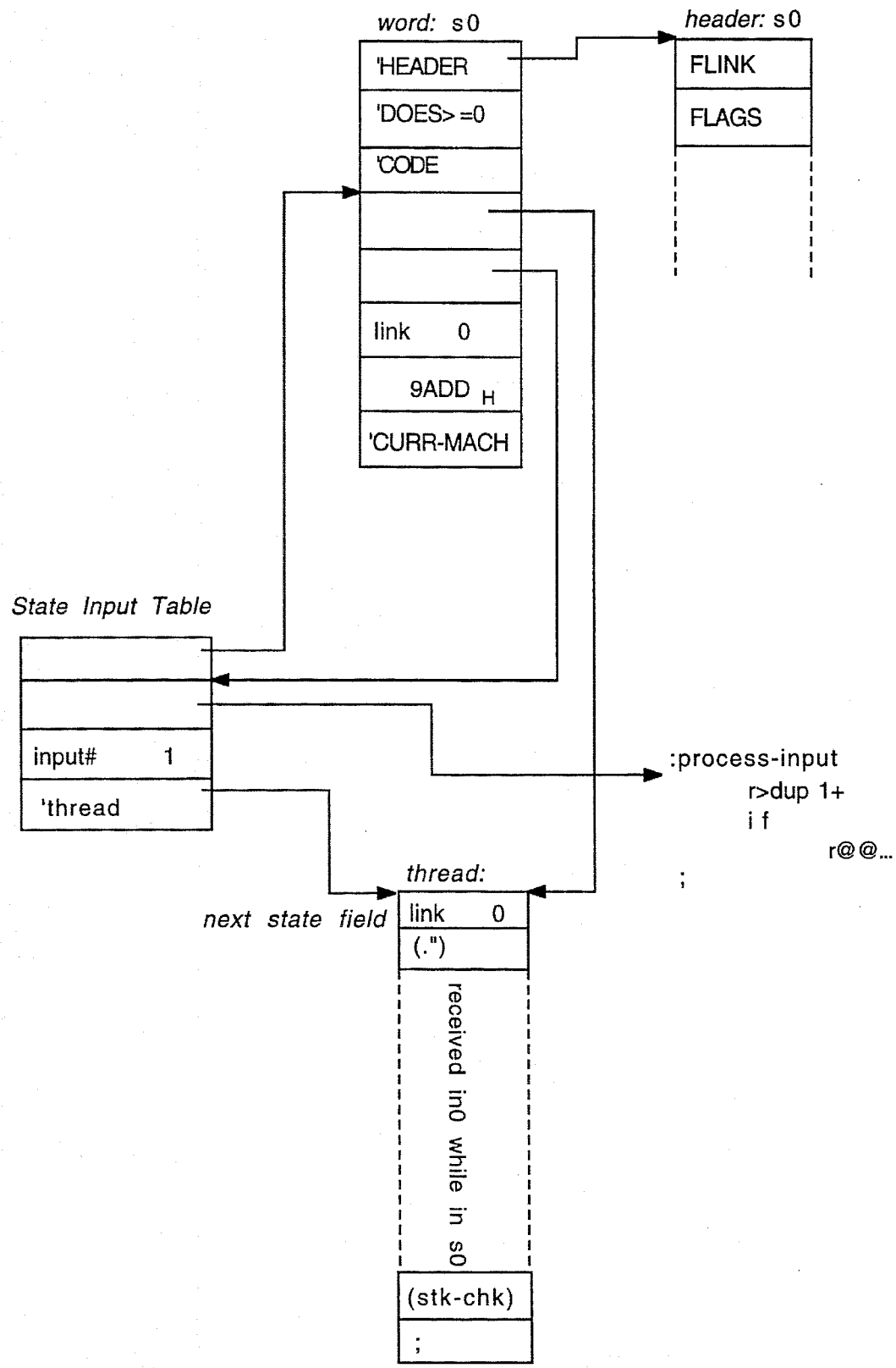
FIG. 21 is a pictorial representation of memory usage by FSML for the word }.

The results of all this processing are shown in FIG. 21.

Figure 22:
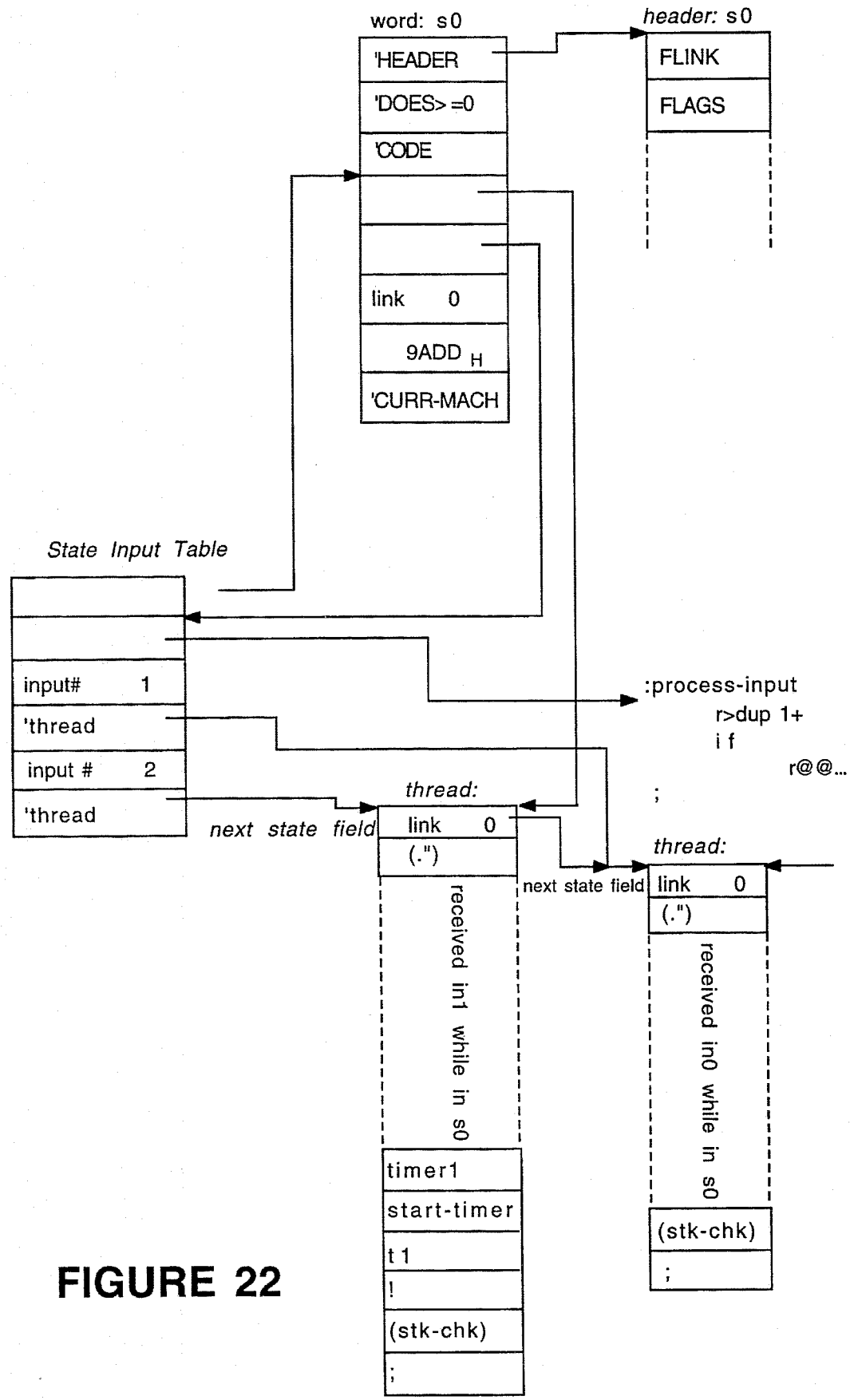
FIG. 22 is a pictorial representation of memory usage by FSML for the word }.

Lines 14 and 15: in1 s1 {. "received in1 while in s0" timer1 start-timer t1! } is processed in virtually the same fashion as the preceding line. The result of this processing is illustrated in FIG. 22.

Line 16: or-else s0 {. "unexpected input while in s0" } is processed in the same manner as the preceding lines. Note that as far as FSML is concerned, or-else is just another input whose value happens to be −1. FSML does enforce a syntax rule that if an or-else input occurs, it must be the last input within the state definition.

Lines 17 to 22: these lines are processed in the same manner as lines 12 to 16.

Line 23: start-state s0 concludes the definition of the machine m1. start-state has a lot of work to do as follows:

1 It verifies that the word which follows, s0, is the name of a state which has been defined for machine m1. If it is not it generates an error message.

2 Assuming it is a valid state, it patches the reference in the initialization code to refer to the portion of the State Input Table which is associated with this state.

3 It then copies the State Input Table into the dictionary.

4 It then traverses the list of all state names associated with the machine m1, verifying that all states are reachable and resolving all pointers to the State Input Table, replacing them with the actual addresses occupied by the SIT in the dictionary. It is at this point that the next state field of all of the action threads is updated to indicate the next state value.

5 It then reinitializes various compilation state variables to allow the definition of any additional machines.

Line 24: m-schedule m1 alias mtm creates an instance of the machine m1 and creates an alias name for the instance, making it convenient to refer to the machine instance by the symbolic name mtm. The following actions take place:

1. m-schedule creates a task using the facilities of FMTOS. It initializes this task such that when the task begins to execute, it will start interpreting the thread of initialization code associated with the machine m1.
2. m-schedule also creates a pipe for handling input messages and initializes the new task's user variable my-pipe to point to that pipe.
3. m-schedule then initializes the recovery procedure for the new task to point to mrcvy-rout, the default recovery routine for an instance of a finite state machine.
4. m-schedule completes its activity by placing the new task in the scheduling queue and returning a token pointing to the task control block.
5. alias takes the token provided by m-schedule and creates a constant having that token as its value and the symbolic name mtm.

As soon as the machine mtm gets control from the task scheduler it will begin executing its initialization code. It will print out the message activating instance of m1 followed by a carriage return. As it reaches the end of the initialization code, it will begin executing the routine (run-mach) which will essentially loop forever, waiting for inputs and processing them as they arrive. (run-mach) will immediately attempt to remove an input message from the input pipe. In all likelihood, none will be available and the task will block, waiting for an input.

Line 25: select mtm makes the machine specified by mtm the "current machine". This is a convenience provided for debugging, making it easy to interactively send inputs to the selected machine.

Figure 23:
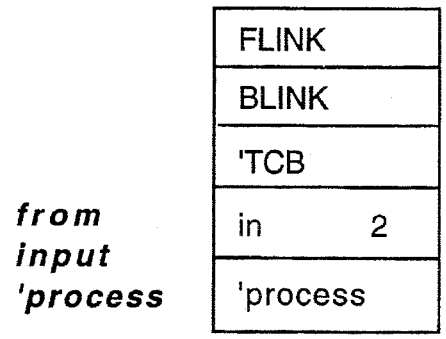
FIG. 23 is a pictorial representation of memory usage by FSML showing the format of the "input" message.

Line 26: in1 >>> sends the input in1 to the currently selected machine. Most of the work is done by >>>. The following activity occurs:

1. in1 leaves its value, 2, on top of the stack.
2. >>> takes the top value from the parameter stack and makes an input message from this input value
3. >>> then sends the input message to the selected machine, mtm. The format of the input message is illustrated in FIG. 23. Sending the message will unblock mtm, placing it back into the scheduling queue.

The message has five fields:

FLINK and BLINK and linked list pointers used to link the message into the input pipe of the receiving machine.

'TCB gives the task identity of the task which sent the input. This is provided primarily for debugging.

IN contains the value of the actual input.

'PROCESS contains the value that the user variable process had at the time the input message was sent.

As soon as the machine mtm gets control from the task scheduler, (run-mach) resumes execution and does the following:

1. It saves the current state in a variable mstate,
2. It removes the value of 'process from the input message and places it into the user variable 'process.
3. It removes the input value from the input message and places it into the user variable in-save.
4. It checks to see whether the input message originated from a timer operation. If so, the buffer is not attached to the input pipe and should be released using an input operation. Otherwise, the empty input message is returned to the pipe.
5. It then transfers control to input processing routine specified for the current state, commonly process-input.
6. process-input will search the State Input Table associated with the current state, looking for an input value which matches the received input. Once this is found, it will transfer control to the thread indicated by the SIT and update the current state to indicated next state. This thread will perform the actions specified for the received input. When the thread is completed, it will return control to (run-mach) which will once again wait upon another input.

Line 27: 73 >>> sends the input value 73 to the currently selected machine. The processing is virtually the same as that for line 26, however, 73 will not be a recognized input value, causing activation of an or-else action.

HOW TO DESIGN A MODEL

With an understanding of the FMTOS, 200L, and FSML extensions to C4th, the user is ready to create a model which simulates a target real-world system being investigated.

First Level—Identify and Classify Main System Objects a. Describe the system as a collection of objects which relate as directly as possible to the target system components. Identify the objects as "controlling objects" and "controlled objects". "Controlling" objects can receive input stimuli from and possibly send outputs to the environment (which can be a user at a terminal, data link to another system, another controlling object, etc.) There must be at least one controlling object.

b. Inputs and outputs must be defined as event messages which, at a minimum, must correspond to event tokens (an event token is unique value specifying a specific event). A message may also contain other information elements whose forms may be later specified in detail by 200L (non-controlling) object class definitions.

c. Controlling objects should be specified as Finite State Machines, using FSML. When a Finite State Machine receives an input event, it generally executes a state transition and manipulates other non-controlling objects which represent the elements of the system that are being controlled.

d. Controlled objects do not need to be implemented until the controlling processes of the controlling objects are operational and well understood. This implies the controlling can accept all input events and make all state transitions properly.

To define new controlled objects, the user will usually need to create new 200L object classes corresponding to the objects that represent the system being modeled. New classes comprise a definition of instance data for the class and a set of methods that (usually) operate upon that data. The instance data is defined in terms of primitive data objects pre-defined in 200L, and as instances of other pre-defined 200L object classes.

Define new methods as required:

a. Methods defined generally in the Forth language primitives within the context of 200L class definition.

b. Methods which invoke the inherited methods of the objects that comprise the new class's instance data.

c. Methods which invoke other methods of the new class that were defined earlier in the class definition.

Second Level—Refinement of Finite State Machine (FSM) Controlling Objects

Designing an FSM requires the following steps:

a. Determine all the states.

b. Identify all inputs, and which inputs are valid in each state.

c. Define which state the machine should transition to for each valid input.

d. State what action should be performed for each input-transition pair. The "action routine" during initial design should be nothing more than a printed message to the user about the action to be taken.

Third Level—Communicating FSMs

Each FSM definition defines a "machine type". When the system executes, One or more instances of each machine type must be created as an synchronously executing task. FSML provides several communication mechanism alternatives for both "connection-oriented" and "connectionless" communication linkages. Establish the most appropriate type according to the system being modeled and implement these mechanisms.

Fourth Level—Expand Detail

The complete system operation consists of communicating FSM processes. In the VoiceMailbox example, inter-FSM communication takes place between coexisting Voice-Mailbox FSMs sending and receiving messages with each other. With each iteration of development of the model, the "controlled object" classes are implemented and the "action routines" are expanded to execute the methods of these objects. In the end, the model replaces the text display of desired action routing function by the actual execution of those actions upon the controlled objects of the system.

Basic Call Model Example

By way of an example, the present invention was used to model the Intelligent Network (IN) as characterized by a Basis Call Model comprising a set of call state, called Points-In-Call (PICS), to define Originating and Terminating Basic Call models in conjunction with a model of the switch connectivity state defined in terms of a set of Connection View (CV) objects. With the Basic Call Model (BCM) as simulated by the present invention, a generic switching systems is simulated in terms of finite state machine states and CV objects. Message communication between this simulated switching system and Service Logic Execution Environments (SLEEs) is modeled according to various protocol alternatives.

The IN concept is intended to make the public telecommunication network more flexible and responsive to the changing needs of the network users. This is to be achieved by modifying existing central office switching systems, and designing new switches, so that their call processing logic can be controlled or influenced by other network elements (external computers programmed by telephone operating company personnel). The motivation for this is the long lead time required by switch vendors to provide new services and features in the switches' embedded generic software packages and the amount of-time needed to deploy the new services and features to all switches within a network.

Figure 25:
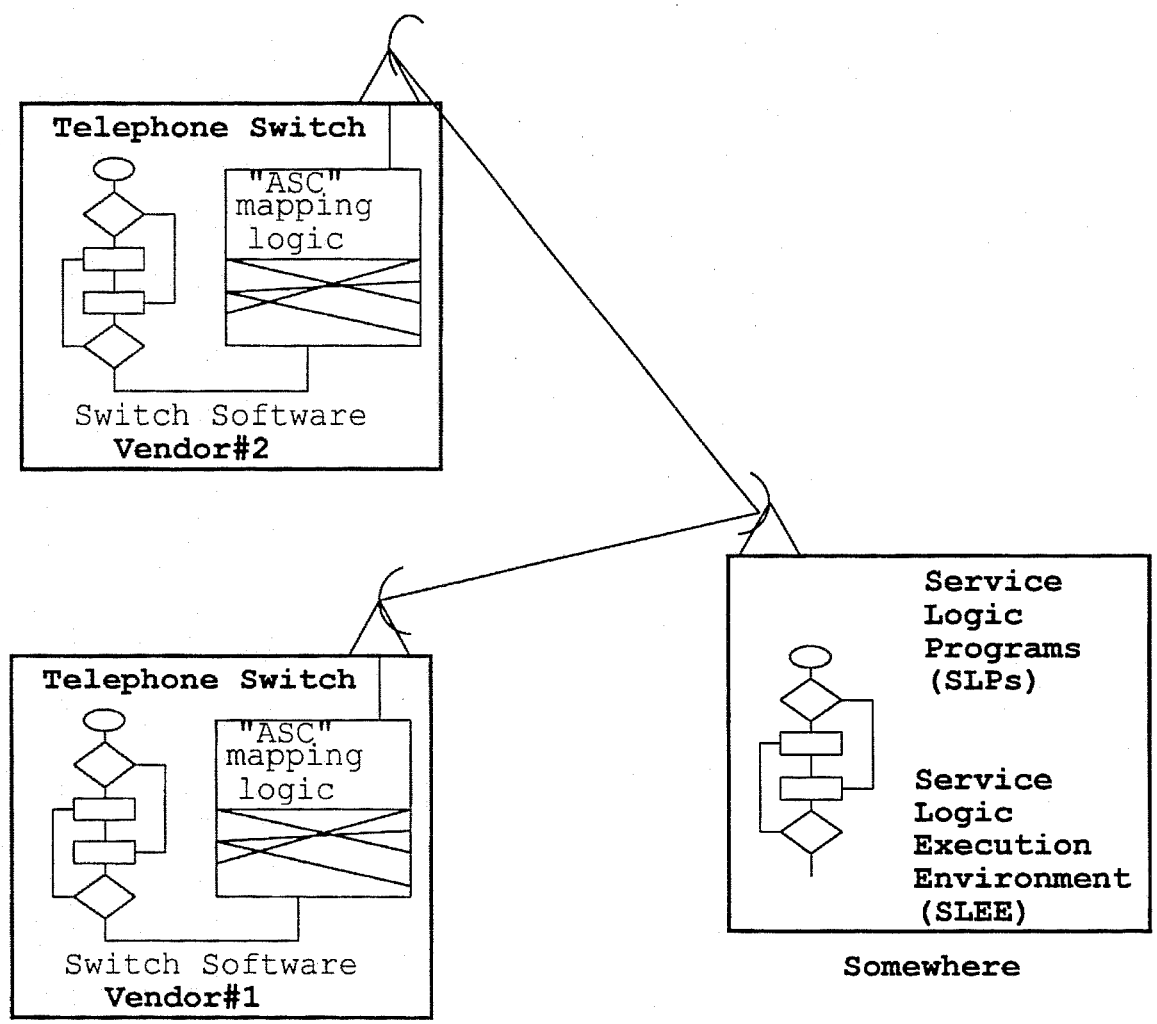
FIG. 25 shows an intelligent network environment.

Prior to IN, it has been impractical to support large-scale local customization of central office switch-based features, to accommodate unique requirements of specific customers, and to introduce interfaces to other external computerized services. The IN concept makes these arrangements more feasible. Referring to FIG. 25, The IN strategy is to define a small set of standardized points of control, called Detection Points (DPs), within new and existing central office switch software. At these points the switch will suspend normal processing logic and send messages to Service Logic Programs (SLPs) within other computers, called Service Logic Execution Environments (SLEEs), external to the switch. The SLP then responds to the switch query with a response message that indicates which of several actions the switch should take as the next step in processing the call. Through a sequence of such interactions, an SLP can control a central office switch to effect service scenarios not provided directly by the switch software. The IN concept brings with it a variety of concerns including: stability of existing network elements, development costs, complexity management, inter-vendor compatibility, OAM&P issues, future evolution paths, and others.

Figure 24:
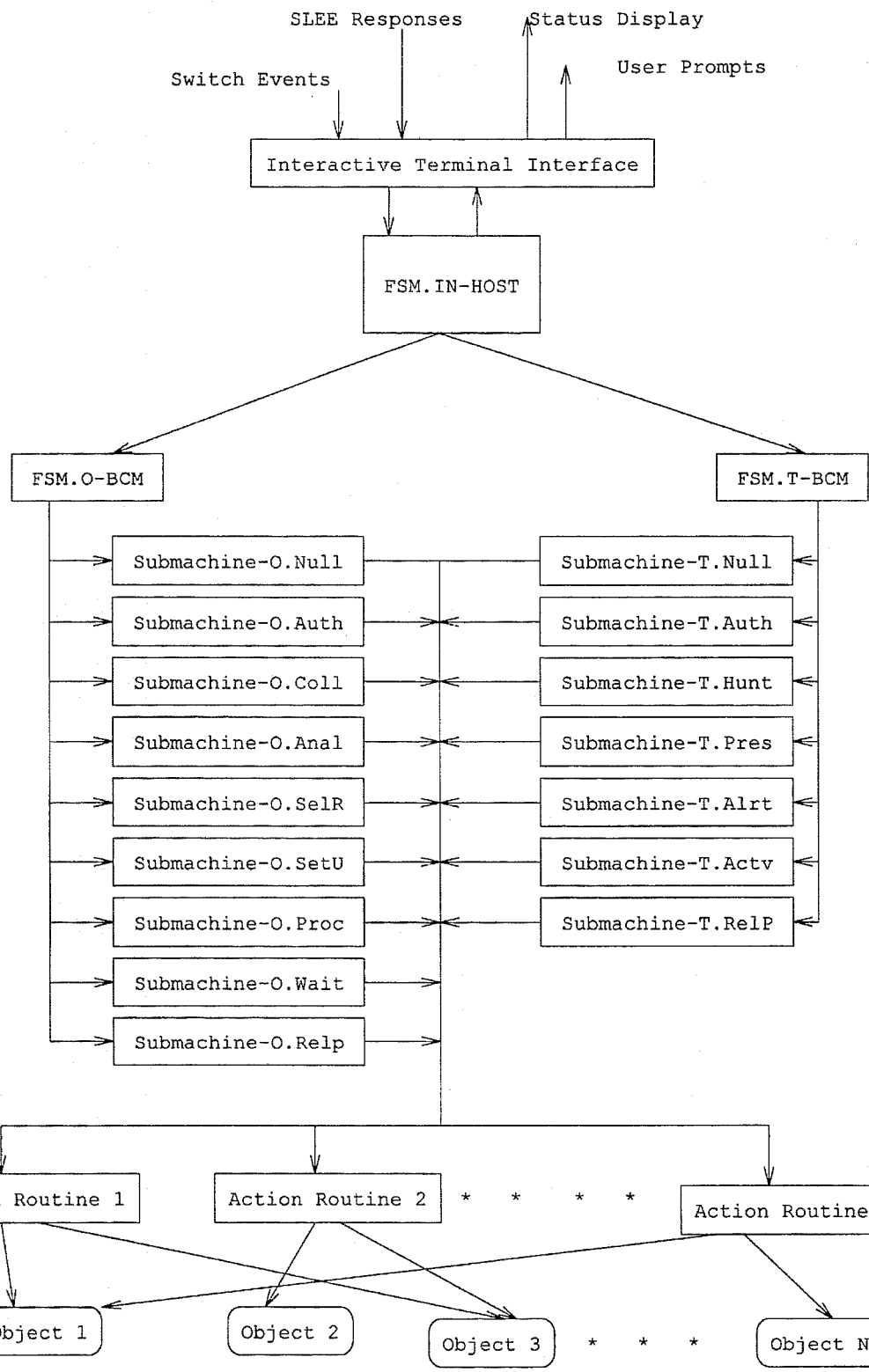
FIG. 24 shows a rapid prototype for a basic call model

In creating the Basic Call Model Rapid Prototype (BCMRP), two major FSM classes were defined; one for the Bellcore Originating Basic Call Model (FSM.O-BCM), and one for the Terminating Basic Call Model (FSM.T-BCM). See FIG. 24. The BCM PICs are represented as states in FSML. A typical, simple two-party telephone call requires an instance of an O-BCM and an instance of a T-BCM. More complex telephone calls may involve many more separate O-BCM and T-BCM instances which are interconnected and able to communicate by messages.

Although FSML syntax allows any arrangement of Forth code to be provided to specify the actions to be performed when a particular input occurs in a particular state, the BCMRP is implemented by combining all actions into special action words so that for every state-input pair, the action to be taken is defined by a single action word. This improves the clarity of the FSML code, emphasizing the table-like structure for states, inputs, next-states, and actions. Table 1 shows an excerpt of actual FSML code for the O.Actv (Originating BCM ACTIVE PIC) submachine.

In the BCMRP, the main control logic is implemented as a set of communicating FSMs, implemented in FSML. The action words invoked by the FSMs perform their work by applying the Method operations to the objects which define the fabric of the system. The BCMRP represents all CV elements (Call Segments, Legs, Call Segment Associations, etc.), all messages and parameters as 200L objects. The BCMRP represents elements of an actual prototype's database as a set of 200L objects. For example, a line accessed via jack C38 on the prototype can be referenced by object name C38 in the BCMRP. Since C38 is an instance of a telephone line object class, it can respond to methods such as ORIGINATING, DIALING, ANSWER, HANGUP, MAKE-BUSY, and so forth, in addition to primitive 200L methods such as DUMP and PRINT.

To initiate a new telephone call from line C38, one could input:

C38 ORIGINATING

The BCMRP would create a new Originating BCM instance and prompt the user for the valid next inputs for the AUTHORIZING_ORIG_ATTEMPT PIC. If the Originated detection point is not activated for that particular line in the switch's database, the BCMRP would automatically Continue and enter the COLLECTING_INFO PIC at which time the user could input:

C38 DIALING '854-9123 and the BCMRP would prompt the user for the valid next inputs for the AUTHORIZING_ORIG_ATTEMPT PIC and the BCMRP would advance the O-BCM to the INFORMATION COLLECTED PIC.

Every switch event is analyzed for Detection Point criteria, and if the criteria are satisfied, a SLEE message is created. The message is displayed in user-readable form on the terminal, and the user is then prompted with a list of all valid SLEE responses. At this time, the user can select which SLEE response is to be received, and a SLEE message is constructed. All valid SLEE response messages are derived from the current FSM state (PIC) whose specifications are encoded in FSML for the specific call model implemented. Once a particular message is selected, the user is prompted for all parameter values and optional parameters. Depending upon the user's choices, the BCMRP will simulate various switch actions in terms of the abstract switching machine defined by the BCM PICs and conductivity states represented by the CV objects. These are displayed after each response, and the user is again prompted for all valid next events.

Ordinarily, the BCMRP attempts to simulate most switch actions automatically, but the user can override almost any switch action with whatever actions are valid within the BCM and message protocol specifications.

The BCMP interactive mode is usually used to create scripts which can then be saved as text files and run through the BCMRP in batch model This makes it easy to build a large library of call scenarios by deriving new call variations from previous call scripts.

An optional output mode causes the BCMRP to create a Feature Test Plan (FTP) output file, where the human actions, such as call origination, are listed along with the resulting switch-to-SLEE messages and SLEE-to-switch messages in a formal ASN.1 syntax form that is post-processed into specific GTD-5 EAX TCAP messages used in conjunction with switch testing tools. In this way, call scenarios that have been verified on the BCMRP are then automatically compared with the actual switch operation.

Although the preferred embodiment of the invention has been illustrated, and that form described, it is readily apparent to those skilled in the art that various modifications may be made therein without departing from the spirit of the invention or from the scope of the appended claims.

```
        .Actv Submachine
        \ ************************************************************
        \ * COPYRIGHT(C) 1991-1993 AG COMMUNICATION SYSTEMS CORP. *
        \ ************************************************************
5
        \ ----------------------------------------------------------------------------------
        \ O.Actv -- Originating Active PIC Submachine
        \ ----------------------------------------------------------------------------------
        user O.Actv
10      : O.Actv.NI   ( -- ) O.Actv @ Response->NOT-IMPLEMENTED ;
        : O.Actv.response>> ( -- ) O.Actv @ response>> ;

O.Actv submachine >O.Actv
          states
15          Awaiting_Event.09
            Call_Terminated.09
            Cleared.09
            Disconnected.09
            Feature_Requested.09
20          Leg_Attached.09
            Operation_Failure.09
            Operation_Success.09
            Reconnected.09
            Sw_Contextual_Failure.09
25          Timeout_Occurred.09
          end-states : O.Actv.ELSE ( InputToken -- ) dup events =
          if drop Awaiting_Event.09 O.Actv set-state >>event>>
30        else
            O.Actv @ Awaiting_Event.09 @ @ =
            if O.Actv @ or-else.prompt
            else
                O.Actv @ ProcessIntOrQevent
35          then
          then ;

state Awaiting_Event.09
            Call_Terminated        Call_Terminated.09       { O.Actv.response>> }
40          Cleared                Cleared.09               { O.Actv.response>> }
            Disconnected           Disconnected.09          { O.Actv.response>> }
            Feature_Requested      Feature_Requested.09     { O.Actv.response>> }
            Leg_Attached           Leg_Attached.09          { O.Actv.response>> }
            Operation_Failure      Operation_Failure.09     { O.Actv.response>> }
45          Operation_Success      Operation_Success.09     { O.Actv.response>> }
            Reconnected            Reconnected.09           { O.Actv.response>> }
            Sw_Contextual_Failure  Sw_Contextual_Failure.09 { O.Actv.response>> }
            Timeout_Occurred       Timeout_Occurred.09      { O.Actv.response>> }
            or-else                Awaiting_Event.09        { O.Actv.ELSE }
50
          state Call_Terminated.09
            Continue               Awaiting_Event.09        { Call_Terminated_Ack.act }
            or-else                Call_Terminated.09       { O.Actv.ELSE }

55        state Cleared.09
            Analyze_Route          Awaiting_Event.09        { Analyze_Route.act }
            Continue               Awaiting_Event.09        { Cleared_Ack.act }
            Disconnect             Awaiting_Event.09        { Disconnect.act }
            Ignore_Event           Awaiting_Event.09        { Ignore_Event.act }
60          Move_Leg               Awaiting_Event.09        { Move_Leg.act }
            or-else                Cleared.09               { O.Actv.ELSE } state Disconnected.09
            Continue               Awaiting_Event.09        { Disconnected_Ack.act }
65          Disconnect             Awaiting_Event.09        { Disconnect.act }
            Ignore_Event           Awaiting_Event.09        { Ignore_Event.act }
```

```
            Move_Leg                   Awaiting_Event.09      { Move_Leg.act }
            or-else                    Disconnected.09        { O.Actv.ELSE } state Feature_Requested.09
            Continue                   Awaiting_Event.09      { Cont.Feature_Requested.act }
            Disconnect                 Awaiting_Event.09      { Disconnect.act }
            Ignore_Event               Awaiting_Event.09      { Ignore_Event.act }
            Move_Leg                   Awaiting_Event.09      { Move_Leg.act }
            or-else                    Feature_Requested.09   { O.Actv.ELSE } state Leg_Attached.09
            General_Ack                Awaiting_Event.09      { General_Ack.act }
            Continue                   Awaiting_Event.09      { General_Ack.act }
            or-else                    Leg_Attached.09        { O.Actv.ELSE } state   Operation_Failure.09
            Continue                   Awaiting_Event.09      { Operation_Failure.act }
            or-else                    Operation_Failure.09   { O.Actv.ELSE } state   Operation_Success.09   ( only generated in response to a Move_Leg )
            Continue                   Awaiting_Event.09      { General_Ack.act }
            Disconnect                 Awaiting_Event.09      { Disconnect.act }
            General_Ack                Awaiting_Event.09      { General_Ack.act }
            Ignore_Event               Awaiting_Event.09      { Ignore_Event.act }
            or-else                    Operation_Success.09   { O.Actv.ELSE } state Reconnected.09
            Continue                   Awaiting_Event.09      { Reconnected_Ack.act }
            or-else                    Reconnected.09         { O.Actv.ELSE } state Sw_Contextual_Failure.09
            Continue                   Awaiting_Event.09      { Sw_Contextual_Failure.act }
            or-else                    Sw_Contextual_Failure.09 { O.Actv.ELSE } state Timeout_Occurred.09
            Disconnect                 Awaiting_Event.09      { Disconnect.act }
            General_Ack                Awaiting_Event.09      { General_Ack.act }
            Move_Leg                   Awaiting_Event.09      { Move_Leg.act }
            or-else                    Timeout_Occurred.09    { O.Actv.ELSE } end-submachine
```

Table 1

```
Vocabulary = ool ( contains user-level 2OOL words )
-----------------------------------------------------------------
    !!           DMAKE         assign:        longalign   private:
    (ool)        DUMP          assigns:       longs:      public:
    ..           DUNMAKE       becomes:       m:          short:
    .bname       INIT          binding-set:   member-of:  shortalign
    ;binding-set LIST-METHODS  byte:          method-is:  shorts:
    ;class       MAKE          bytes:         method:     subclass:
    ;m           NAME          class-is:      mexit       ubyte:
    ;subclass    PRINT         class-of:      mrecurse    ubytes:
    ;union       REVEAL        class:         oa          ulong:
    ?bname       SIZE          dcm            obj-handle: ulongs:
    ?method:     T.bname       index-of       object:     union:
    @@           alias:        is-bound?      objects:    ushort:
    ADDR         aliases:      late-binding;  pointer:    ushorts:
    CLASS0:      assign-type:  long:          pointers:   with:
    CONCEAL
-----------------------------------------------------------------
#WORDS = 71
```

Table 2

```
Summary of 2OOL user words
--------------------------------------------------------------------------
ool       ( -- ) ( ool user word vocabulary; [defined in forth vocabulary] )
(ool)     ( -- ) ( vocabulary for internal 2OOL words )
```

Table 3

| Vocabulary = (ool) | ( contains internal 2OOL words not normally accessed by user ) | | |
|---|---|---|---|
| #deferred | +hdr-cfa | b->l | modified-hdr |
| '(;)active-descriptor | +mf-genword | balance | mrd-descr-node |
| '(colon) | +mf-index | binding-table+dn-target | msmudge |
| '(constant) | +mn-branch | binding-type | oa |
| '(create) | +mn-index | bt-error | old-cfa |
| 'oh->addr | +mn-link(CONCEAL) | build-binding-template | print_general |
| 'oh->type | +mn-list | byte_dump | ptr_dump |
| ((DMAKE)) | +mn-target | byte_print | ptr_size_of |
| ((MAKE)) | +mn-zero | conceal | public-flag |
| ((conceal)) | +sd-subclass | ctime | recurse-dlist |
| ((reveal)) | +sno-body | curr-class | redirect-header |
| (ADDR) | +sno-call | curr-elt | resolve-binding-set |
| (DMAKE) | +sno-descriptor | current-binding-set | restore-header |
| (DUMP) | +sno-does> | deferrals-list | reveal |
| (DUNMAKE) | +sno-link-to-name | describe-object | s->l |
| (INIT) | +subclass-link | descriptor | set-oa |
| (LIST-METHODS) | +subclass-list | descriptor-node | set-oa-trace |
| (MAKE) | .descr | dno | short_dump |
| (NAME) | .dnode | dump_general | short_init.mnodes |
| (PRINT) | .dnodes | element | short_make |
| (REVEAL) | .mnode | element-error | short_print |
| (SIZE) | 1sdmp | elt-method: | short_size_of |
| (bind-it) | ludmp | generic-word | sno-head |
| (binding) | 22id.r | immediate-method | subclass-descriptor |
| (class-is) | 2sdmp | init-bt-ntry | tracingon |
| (conceal) | 2udmp | init_general | ubyte_dump |
| (is-bound?) | 32id.r | legal? | ubyte_init |
| (method-is) | 4sdmp | link-deferred-method | ubyte_make |
| (reveal) | 4udmp | list-methods_general | ubyte_print |
| +class-size | ADDROF | long_dump | ubyte_size_of |
| +dn-array-multiple | BYTE | long_print | uid# |
| +dn-link | DEBUGGING | make-descr-node | ulong_dump |
| +dn-list | LONG | make-method-nod | ulong_init |
| +elt-descrnode | POINTER | make-sno-hdr | ulong_make |
| +elt-genword | SHORT | make-snol | ulong_print |
| +elt-methform | UBYTE | match-bindings | ulong_size_of |
| +elt-methnode | ULONG | method-format | unique-id# |
| +gw-cfa | USHORT | method-node | ushort_dump |
| +gw-does | [']oh.addr | methods-error | ushort_print |
| +gw-header | [']oh.type | mlink | validate-descr |

WORDS = 165

Table 4

```
CLASS0: METHODS - inherited by any new 2OOL class
+------------------------------------------------
|   !!              ( value 'element -- ) ( store value according to element type )
|   @@              ( 'element -- value ) ( read value to stack with sign extension when
                                            appropriate )
|   ADDR            ( 'obj 'descr -- 'object )
|   CONCEAL         ( 'obj 'descr -- ) ( conceals all the methods of the class and its
                                         subclasses )
|   DMAKE           ( 'obj 'descr -- 'obj ) ( makes a dynamic instance of a class )
|   DUMP            ( 'obj 'descr -- ) ( recursive object dump )
|   DUNMAKE         ( 'obj 'descr -- ) ( unmake a dynamic object instance )
|   INIT            ( 'obj 'descr -- ) ( initialize an object )
|   LIST-METHODS    ( 'obj 'descr -- ) ( list methods of object or class )
|   MAKE            ( 'obj 'descr -- ) ( makes a static named instance of class )
|   NAME            ( 'obj 'descr -- 'name ) ( returns name of object )
|   PRINT           ( 'obj 'descr -- ) ( print object values )
|   REVEAL          ( 'obj 'descr -- ) ( recursively reveal all methods of class and its
                                         subclasses )
|   SIZE            ( 'obj 'descr -- #bytes ) ( return size of object or class )
+-------------
     ..             ( -- 'descr )
                    \ a shorthand notation for specifying that at execution
                    \ time, the value on stack will point to an object
                    \ whose TYPE is consistent with the class currently
                    \ being defined
     .bname         ( -- ) ( <bname> )
                    \ display class currently associated with binding name
     T.bname        ( 'tcb -- ) ( <bname> )
                    \ display class currently associated with binding name
     ;binding-set   ( bt cbs dl -- )
     ;class         ( current-size -- ) ( terminate definition of class )
     ;m             ( -- ) ( terminate m: definition )
     ;subclass      ( see subclass: )
     ;union         ( see union: )
     ?bname         ( a -- a ) \ error if not the cfa of a binding-set name
     ?method:       ( -- , <name> )
     assign-type:   ( 'classobj 'descr -- , <name> )
                    \ assigns a class type to an obj-handle
                    ( usage: <classname> assign-type: <obj-handle-name> )
     becomes:       ( 'obj -- ) \ associates dynamic object address with obj-handle
                    ( usage: <classname> DMAKE becomes: <obj-handle-name> )
     binding-set:   ( <name> ) ( --- bt cbs dl )
     class-of:      ( -- ,obj-handle-name )
     dcm            ( 'descr 'CLASS0 -- ) ( <method-name> ) \ decompile a method
     is-bound?      ( compiling: -- ) ( <method-name> <binding-set-name> )
                    ( interpreting: -- flag ) ( <method-name> <binding-set-name> )
     late-binding;  ( -- ) ( sets up late binding via binding sets )
     obj-handle:    ( -- , <name> )
                    \ defines a handle to be used for referencing dynamic objects
     alias:         ( when defining: <classname> <alias-elt-name> -- )
                    \ within a class data definition, creates a pointer to
                    \ an object of a particular class. An alias: type element must be
                    \ initialized using assign:
     aliases:       ( when defining: <count> <classname> <alias-array-name> -- )
                    \ within a class data definition, creates an array of pointers to an
                    \ object of a particular class. An aliases: type element must be
                    \ initialized using assigns:
     assign:        ( 'obj oa <alias-elt-name> -- ) \ assigns val to <alias-elt-name>
                    ( usage: <obj-name> ADDR assign: <alias-elt-name>    )
                    ( <alias-eltname> behaves as object of class specified by alias: )
     assigns:       ( 'obj <index> oa <alias-array-name> -- )
                    \ assigns val to <alias-array-element>
                    \ usage: <obj-name> ADDR <index> assigns: <alias-array-name>
                    \ <alias-array-element> behaves as object of class specified by alias:
     byte:          ( <eltname> -- addr )
     bytes:         ( count <eltname> -- addr )
```

```
    class-is:     ( -- ) ( <class-name> )
                  \ used to defer evaluation of method/class
                  \ when class is known at compile time but method is not known
    class:        ( <Class-name> -- 0 )
5   index-of      ( <method-name> -- u ) \ returns index value of a method
    long:         ( <eltname> -- addr )
    longalign     ( offset -- offset' ) \ aligns with long word boundary
    longs:        ( count <eltname> -- addr )
    m:            ( <method-name> ) \ define action for a method
10  member-of:    ( <classname> )
    method-is:    ( -- ) ( <method-name> )
                  \ used when the method is known at compile time but the class is not
                  \ known.  Has the effect of deferring evaluation of the method-index
                  \ until execution time
15  method:       ( -- ) ( <name> ) \ define (or redefine) a method name
    ?method:      ( -- ) ( <name> )
                  \ conditionally define a method name, if it does't exist
    mexit         ( -- ) \ restore previous value of oa and return
    oa            ( -- 'obj ) \ returns pointer to current object
20  object:       ( <eltname> -- addr )
                  ( when defining: <classname> object: <eltname> )
    objects:      ( count <eltname> -- addr )
                  ( when defining: count <classname> object: <eltname> )
    pointer:      ( <eltname> -- addr )
25  pointers:     ( count <eltname> -- addr )
    private:      ( -- ) \ set following definitions within class to be private
    public:       ( -- ) \ set following definitions within class to be public
    short:        ( <eltname> -- addr )
    shortalign    ( offset -- offset' ) \ aligns with even byte boundary
30  shorts:       ( count <eltname> -- addr )
    subclass:     ( subclass: <subclassname>            )
                  ( subclass data and method definitions )
                  ( see ;subclass                       )
    ubyte:        ( <eltname> -- addr )
35  ubytes:       ( count <eltname> -- addr )
    ulong:        ( <eltname> -- addr )
    ulongs:       ( count <eltname> -- addr )
    union:        ( <classnameX> union: <eltname1>  )
                  ( <classnameY> with:  <eltname2>  )
40                (              .                  )
                  (              .                  )
                  ( <classnameZ> with:  <eltnameN>  )
                  (              ;union             )
    ushort:       ( <eltname> -- addr )
45  ushorts:      ( count <eltname> -- addr )
    with:         ( see union: )
```

Table 5

```
     \ ************************************************************
     \ * COPYRIGHT(C) 1991-1993 AG COMMUNICATION SYSTEMS CORP.    *
     \ ************************************************************
     only forth definitions 0 cload task-2OOL
5    create task-2OOL \ dummy word for ?include check
     vocabulary ool
     \* stack: ( -- )
     \* defined in: forth
     \* category: 2OOL
10   \* topic: class definition
     \* description:
     \* +-----------------------------------------------------------------------------+
     \* | ool is the name of the vocabulary for user-oriented 2OOL words. The ool vocabulary |
     \* | is also used as the vocabulary for all method names defined for any classes,  both |
15   \* | pre-defined  classes that are part of the 2oolbox platform and new classes defined |
     \* | as part of an application program. There is  also  an  internal  (ool)  vocabulary |
     \* | which  contains  words  used  internally  by  other  2OOL words. These should not |
     \* | normally be used by someone using 2OOL as a programming language.                  |
     \* +-----------------------------------------------------------------------------+
20
     also ool definitions vocabulary (ool)
     \* stack: ( -- )
25   \* defined in: ool
     \* category: 2OOL
     \* topic: class definition
     \* description:
     \* +-----------------------------------------------------------------------------+
30   \* | (ool)  is a vocabulary for keeping the internal 2OOL implementation words separate |
     \* | from the user-oriented words of the system. Words in (ool) should normally only be |
     \* | used or modified when changing or extending the 2OOL language. Also see ool.       |
     \* +-----------------------------------------------------------------------------+

35   base @ hex
     also (ool) definitions
     ( determine the cfa value for a created word and store it in a constant )
     create tst ' tst @ forget tst constant '(create)
     0 constant tst ' tst @ forget tst constant '(constant)
40
     ( define uid# --- a variable which identifies the last value of a methods )
     (    index which has been previously assigned )
     create uid# 0 , 45   ( define curr-class --- a pointer which points to the class structure )
     (    of any class which is currently being defined )
     create curr-class 0 , ( define curr-elt -- a constant whose value points to the element )
50   (    currently being defined )
     0 constant curr-elt ( define oa -- a constant which will normally point to the object which is )
     (    being acted upon by a method )
55   0 constant oa
```

```
    ool definitions (ool)
    : ., ( -- 'descr ) ( a shorthand notation for specifying that at execution)
                       ( time, the value on stack will point to an object )
                       ( whose TYPE is consistent with the class currently )
5                      ( being defined )
        curr-class @ ; immediate definitions
    ( define active-descriptor -- a pointer to the most recently used )
10  (   descriptor )
    create active-descriptor 0 , ( define mrd-descr-node --- a pointer to the most recently defined )
    (   descriptor node )
15  create mrd-descr-node 0 , ( define public-flag --- a flag which indicates whether the next method )
    (   to be defined should be public or private.  A TRUE value indicates )
    (   that the method will be publically available; i.e., can be accessed )
20  (   outside of the scope of the class definition. )
    create public-flag 0 , ( define public: and private: --- a couple of words whose effect is to set)
    (   or clear the value of public-flag respectively.  Methods which follow )
25  (   the word public: will be publically accessible whereas those following)
    (   the word private: cannot be accessed outside the scope of the class )
    (   definition. )

ool definitions (ool)
30  : public:
    \* +----------------------------------------------------------------------+
    \* | Sets  mode  within  class  definition  so  subsequent  method  definitions will be |
    \* | accessable outside the class definition.                             |
    \* +----------------------------------------------------------------------+
35
    : private: ( -- )
    \* +----------------------------------------------------------------------+
    \* | Sets  mode  within  class  definition  so  subsequent  method  definitions will be |
    \* | accessable only from within the class definition.                    |
40  \* +----------------------------------------------------------------------+
    definitions ( The following define some of the major data structures used by OOL )

45  structure descriptor-node
        pointer: +dn-link          ( pointer to next descriptor-node in list )
        pointer: +dn-target        ( pointer to associated descriptor )
           long: +dn-array-multiple ( indicates number of copies in array )
                                   (   n=-1 => not an array )
50                                 (   all other n => number of copies )
    structure.end
```

```
    structure method-node
        pointer: +mn-link          ( pointer to next method-node in list )
        union{
            long: +mn-index        ( if <>0, gives index value of associated )
5                                  (   method )
            pointer: +mn-target    ( points to execution code for method )
        }union{
            long: +mn-zero         ( when value is zero... )
            pointer: +mn-branch    ( points to inherited descriptor )
10      }union
    structure.end structure descriptor
        pointer: +dn-list          ( points to first entry in descriptor list )
15      pointer: +mn-list          ( points to first entry in methods list )
        long: +class-size          ( static size of object being defined )
        pointer: +subclass-list    ( points to list of associated subclasses )
    structure.end 20  structure subclass-descriptor
        descriptor struct: +sd-subclass
        pointer: +subclass-link
    structure.end 25  structure sno-head
        pointer: +sno-descriptor    ( points to associated descriptor )
        pointer: +sno-link-to-name  ( points to associated header )
        pointer: +sno-does>         ( field pointing to does clause )
        pointer: +sno-call          ( pointer to (does>) )
30      long: +sno-body             ( beginning of body of object )
    structure.end structure generic-word
        pointer: +gw-header
35      pointer: +gw-does
        pointer: +gw-cfa
    structure.end structure method-format
40      generic-word struct:   +mf-genword
        pointer: +mf-index
    structure.end structure element
45      method-format struct: +elt-methform
        method-node struct: +elt-methnode
        descriptor-node struct: +elt-descrnode
        generic-word struct: +elt-genword
    structure.end
50
    : unique-id#  ( -- u )  ( returns a unique number suitable for use as )

: methods-error ( -- )  ( print an error message indicating that the )
55                          ( method and class are not compatible )

: element-error ( -- )  ( print an error message indicating that the )
                            ( element name is not appropriate for the class )
```

```
    ool definitions (ool)
    : index-of
    \* +-----------------------------------------------------------------------------------+
    \* | In 200L, method names are global and unique. Each one is associated with an index |
 5  \* | value that must be bound to an actual code thread (defined using the m: word)    |
    \* | before it can be executed. index-of <method-name> returns the index value for any |
    \* | defined method name.                                                              |
    \* +-----------------------------------------------------------------------------------+

10  definitions

: (method-is) ( 'obj 'descr index -- ) ( performs a deferred search of )
                  ( the methods list at execution time )

15  ool definitions (ool)
    : method-is:
    \* +-----------------------------------------------------------------------------------+
    \* | method-is: is used when the method is known at compile time but the class is not |
    \* | known. Has the effect of deferring evaluation of the method-index execution time. |
20  \* | See the system help on 200L late-binding for more information.                    |
    \* | Example:                                                                          |
    \* | : test.method-is: ( -- ) 'testobj test.descriptor method-is: DUMP ;              |
    \* +-----------------------------------------------------------------------------------+

25  definitions
    : (class-is) ( 'obj index 'descr -- )
                 ( performs a deferred search of )
                 ( the methods list at execution time )

30  ool definitions (ool)
    : class-is:
    \* +-----------------------------------------------------------------------------------+
    \* | class-is: is used to defer evaluation of method/class when class is known at     |
    \* | compile time but method is not known.                                             |
35  \* | See the system help on 200L late-binding for more information.                    |
    \* | Example:                                                                          |
    \* | : test.class-is: ( -- ) 'testobj index-of DUMP class-is: TestClass: ;            |
    \* |                                                                                   |
    \* +-----------------------------------------------------------------------------------+
40      find ?dup
        if ( the class name was found... )
           >body +sno-body
           state @
           if ( compiling... )
45            [compile] literal compile (class-is) exit
           then ( not compiling... )
              (class-is) exit
        then ( class name was not found... )
        cr ." ool: class-is: could not find class name " 105 throw ; immediate
50
    definitions
    0 constant old-cfa   ( saves previous value of a header's cfa )
    0 constant modified-hdr ( saves address of modified header )
    : +hdr-cfa   028 + ;
55  : restore-header ( -- )
        old-cfa ?dup
        if ( a header has been tampered with... )
           modified-hdr +hdr-cfa !  0 is old-cfa
        then ;
60
    : redirect-header ( cfa 'hdr -- )  ( redirect a header to point to a new cfa )
                                       ( the previous cfa of the header is saved in old-cfa )
        restore-header
        dup is modified-hdr
65      +hdr-cfa  dup @ is old-cfa ! ;
```

```
       ( The following code creates the first part of a static named object )
       : make-sno1  ( <sno-name> 'descriptor -- )
           create immediate ( create the object name and make it immediate )
           ,           ( save its descriptor address )
 5         here 10 - @ ,   ( compile a pointer to its pseudo header )
           0 ,             ( compile 0 for its "does>" field )
           '(create) ,     ( compile create as its cfa )
       ;

10     : make-sno-hdr  ( <sno-name> 'descriptor -- )
           make-sno1
           does>
             dup @   ( addr 'descr )
             swap 0c +  ( 'descr cfa )
15           state @    ( 'descr cfa state )
             if ( compiling... )   ( 'descr cfa )
                , ( compile the cfa )  ( 'descr )
             else ( interpretting... ) ( 'descr cfa )
               execute swap   ( pfa 'descr )
20           then
       ;

also ool definitions
       ( The following code creates the basic skeleton for CLASS0: )
25     0 make-sno-hdr CLASS0: restore-header (ool) definitions previous
           here ' CLASS0: >body !  ( patch descriptor of CLASS0: to be itself )
           0 ,     ( list of descriptor nodes, to be patched up later )
           0 ,     ( list of methods nodes, to be patched up later )
           10 ,    ( size of objects belonging to CLASS0: --- sixteen bytes )
30         0 ,     ( list of subclasses, there won't be any )

: validate-descr ( 'descr -- 'descr )
           dup body> [ ' nucleus ] literal over u<   ( 'descr cfa-descr FLAG )
           over here u< and   ( 'descr cfa-descr FLAG )
35         if ( so far, it lies in a reasonable range of addresses... ) ( 'descr cfa-descr )
               @ '(create) = ( 'descr FLAG )
               over 4 cells - @ CLASS0: [ drop ] = and
               if exit then
           then ( looks like we're in trouble... )
40         cr ." 2OOL: invalid descriptor " u. 106 throw ;

ool definitions (ool)
       also decompiler
       : dcm
45     \* +----------------------------------------------------------------------------+
       \* | Decompile a method. Example usage:                                         |
       \* | <myclassname> dcm <methodname>                                             |
       \* +----------------------------------------------------------------------------+
```

```
: method:
\* +---------------------------------------------------------------------------+
\* | method:  is  used  to  define  a  unique  method name that may be used in multiple |
\* | classes. method names are forced into the ool vocabulary, and associated with a |
\* | method  index  that  is  bound to a specific code thread defined within each class |
\* | using the m: word. Also, see the ?method: word.                           |
\* | Example usage:                                                            |
\* |   method: <methodname>                                                    |
\* +---------------------------------------------------------------------------+ method: MAKE
\* +---------------------------------------------------------------------------+
\* | This method makes a static named object of the specified class.           |
\* | Usage: <classname> MAKE <objectname>                                      |
\* +---------------------------------------------------------------------------+ method: CONCEAL
\* +---------------------------------------------------------------------------+
\* | This  method  is  used to conceal the private methods of the specified class. This |
\* | would normally be used following the use of REVEAL.  This  is  normally  used  for |
\* | debugging.                                                                |
\* | Usage: <classname> CONCEAL                                                |
\* +---------------------------------------------------------------------------+ method: REVEAL
\* +---------------------------------------------------------------------------+
\* | This  method  is  used  to reveal the private methods of the specified class. This |
\* | would normally be used for debugging.                                     |
\* | Usage: <classname> REVEAL                                                 |
\* +---------------------------------------------------------------------------+ method: DMAKE
\* +---------------------------------------------------------------------------+
\* | This  method  makes a dynamic instance of the specified class. It has no name, and |
\* | only its object address is returned. Normally  an  obj-handle:  will  be  used  to |
\* | reference the object.                                                     |
\* | Usage: <classname> DMAKE                                                  |
\* +---------------------------------------------------------------------------+ method: DUNMAKE
\* +---------------------------------------------------------------------------+
\* | This  method  destroys  a  dynamic  object and returns its memory resources to the |
\* | operating system memory manager.                                          |
\* | Usage: <obj-handle name> DUNMAKE                                          |
\* |       or assuming 'obj is on stack: member-of: <classname> DUNMAKE        |
\* +---------------------------------------------------------------------------+ method: INIT
\* +---------------------------------------------------------------------------+
\* | This  method  is  used  to  initialize  an object. Unless redefined for a specific |
\* | class, the default INIT will zero the information elements of an object.  |
\* | Usage: <objectname> INIT                                                  |
\* +---------------------------------------------------------------------------+
```

```
        method: @@
        \* +-------------------------------------------------------------------------------+
        \* | This   method   will   fetch  the  contents  of  an  information  element. It is |
        \* | type-sensitive, and will perform sign extension for signed objects shorter than 32 |
  5     \* | bits. Values are fetched to a single 32-bit cell of the forth parameter stack.    |
        \* | Usage: (within m: definition) oa <elementname> @@                                 |
        \* +-------------------------------------------------------------------------------+ method: !!
 10     \* +-------------------------------------------------------------------------------+
        \* | This  method  assumes  a  value is on the forth parameter stack. It will store the |
        \* | value into the referenced object information element. If the  element  is  shorter |
        \* | than  32-bits,  the  value  will  be  truncated,  if necessary, to store the value |
        \* | without overwriting adjacent data.                                                 |
 15     \* | Usage: (within m: definition) ( valueonstack ) oa <elementname> !!                 |
        \* +-------------------------------------------------------------------------------+ method: SIZE
        \* +-------------------------------------------------------------------------------+
 20     \* | This  method returns the static size of an object. It does not calculate the total |
        \* | storage associated with a complex object that may consist of  a  chain  of  linked |
        \* | objects  unless it has been specifically redesigned to do so within the particular |
        \* | object class.                                                                      |
        \* | Usage: <objectname or classname> SIZE                                              |
 25     \* +-------------------------------------------------------------------------------+ method: ADDR
        \* +-------------------------------------------------------------------------------+
        \* | This method returns the address of an object.                                      |
 30     \* | Usage: <objectname> ADDR                                                           |
        \* +-------------------------------------------------------------------------------+ method: DUMP
        \* +-------------------------------------------------------------------------------+
 35     \* | This  method  performs  a  formatted  dump  of  an  object,  listing  the  related |
        \* | information element names.                                                         |
        \* | Usage: <objectname> DUMP                                                           |
        \* +-------------------------------------------------------------------------------+

40     method: PRINT
        \* +-------------------------------------------------------------------------------+
        \* | This  method simply prints out the values of the information elements of an object |
        \* | with no symbolic information provided. This method is  expected  to  be  redefined |
        \* | within  each  class  to provide a formatted display of the object according to the |
 45     \* | requirements of the application program being developed.                           |
        \* | Usage: <objectname> PRINT                                                          |
        \* +-------------------------------------------------------------------------------+ method: NAME
 50     \* +-------------------------------------------------------------------------------+
        \* | This  method  will  return  a pointer to the count byte of the name string for the |
        \* | object.                                                                            |
        \* | Usage: <objectname> NAME                                                           |
        \* |        or assuming the address of the object is on the stack:                      |
 55     \* |        member-of: <objectclassname> NAME                                           |
        \* +-------------------------------------------------------------------------------+
```

```
    method: LIST-METHODS
    \* +------------------------------------------------------------------------------+
    \* | This method will list the method names defined for the specified class, or for the |
    \* | class of the specified object.                                               |
 5  \* | Usage: <object or class name> LIST-METHODS                                   |
    \* +------------------------------------------------------------------------------+ definitions
    : mlink    ( cfa -- ) ( <method-name> ) ( create methods node and link )
10             ( to current class )
       curr-class @ +mn-list here over @ ,  swap !
       find >body @
       public-flag @ or , ( get the index of the methodname and compile it )
       , ;
15  : immediate-method ( -- ) ( make the immediately preceding method immediate )
       here method-node - +mn-index dup @  ( 'index index )
       0fffffffe and ( get rid of the public bit )
       negate        ( mark it as immediate )
20     public-flag @ or   ( OR back in the public bit )
       swap ! ;       ( store it back in the methods node )

ool definitions {ool}
    : obj-handle: ( <name> -- )
25  \* +------------------------------------------------------------------------------+
    \* | Static Named Objects may be manipulated by name. The name carries with it the |
    \* | object's address and its class. Dynamic objects do not have names, and have only |
    \* | an address. obj-handle: will define a static named element that can be assigned |
    \* | the class of objects it is supposed to be a handle for. this is done using the |
30  \* | assign-type: word.  The object handle is assigned the address of an object using |
    \* | the becomes: word. Typically, an object handle will be assigned a class type only |
    \* | once when it is defined, and then be attached to dynamic object addresses |
    \* | dynamically. Typical usage:                                                  |
    \* |     object-handle: <myclasshandlename>                                       |
35  \* |     <myclass> assign-type: <myclasshandlename>                               |
    \* |     <myclass> DMAKE becomes: <myclasshandlename>                             |
    \* +------------------------------------------------------------------------------+

: becomes:
40  \* +------------------------------------------------------------------------------+
    \* | becomes: is used to assign an object address to an object handle. See obj-handle: |
    \* | Typical usage:                                                               |
    \* |     object-handle: <myclasshandlename>                                       |
    \* |     <myclass> assign-type: <myclasshandlename>                               |
45  \* |     <myclass> DMAKE becomes: <myclasshandlename>                             |
    \* +------------------------------------------------------------------------------+
```

```
     : assign-type:
     \* stack: ( 'descr 'descr-descr | 'descr-descr )
     \* defined in: ool
     \* category: 20OL
 5   \* topic: dynamic objects
     \* description:
     \* +--------------------------------------------------------------------------------+
     \* | assign-type:  is  used  to  assign  a  class  descriptor  to an object handle. See |
     \* | obj-handle:                                                                    |
10   \* | Typical usage:                                                                 |
     \* |     object-handle: <myclasshandlename>                                         |
     \* |     <myclass> assign-type: <myclasshandlename>                                 |
     \* |     <myclass> DMAKE becomes: <myclasshandlename>                               |
     \* +--------------------------------------------------------------------------------+
15       drop  ( 'descr | -- )
         find ?dup
         if ( name was found... )
           dup 4 cells +
           @ '(constant) =
20         if ( it looks like an object handle... )
             >body
             state @
             if ( we're compiling... ) ( 'body )
               [compile] literal compile !
25           else ( we're interpreting... ) ( 'descr 'body )
               !
             then exit
           then ( it doesn't look like an object handle... )
           cr ." assign-type: following word is not an object handle "
30       then 108 throw ;  immediate : class-of:
     \* +--------------------------------------------------------------------------------+
     \* | This  word  returns  the class descriptor ('descr) for the class that is currently |
35   \* | assigned to the named object handle.                                           |
     \* +--------------------------------------------------------------------------------+ definitions
     : 'oh->addr   ( 'obj-handle -- 'obj-handle-address-cell ) >body ;
40   : 'oh->type   ( 'obj-handle -- 'obj-handle-type-cell ) [ f cells ] literal + ;
     : [']oh.addr  ( -- 'addr, <obj-handle-name> ) [compile] ' >body ; immediate
     : [']oh.type  ( -- 'type, <obj-handle-name> ) [compile] ' [ 5 cells ] literal + ;  immediate ( Define tracingon -- a flag which if TRUE causes recurse-dlist to output )
45   (    tracing information as it recurses through the descriptor list )
     0 constant tracingon
     : 32id.r ( cfa -- ) 0a cells - >name count 1f and 20 over - 3 max spaces type ;
     : 22id.r ( cfa -- ) 5 cells - >name count 1f and 16 over - 1 max spaces type ;
```

```
      false constant DEBUGGING immediate
    : recurse-dlist ( 'obj 'descr index -- )
        rot ?dup
        if
 5        >r
        else
          cr ." >>00000000<< invalid object address for "
          drop @ CELL - @ 32id.r exit
        then
10      begin            ( 'dnode index )
          swap @         ( index 'dnode )
          ?dup           ( index 'dnode 'dnode | index 0 )
          DEBUGGING iftrue cr ." dumping dnode (maybe)..." .s cr ifend
        while ( not at end of descriptor list... )  ( index 'dnode )
15        dup +dn-array-multiple @    ( index 'dnode array-mult )
          dup 1+          ( index 'dnode array-mult array-mult+1 )
          ( an array-mult == -1 indicates it is not really an array )
          if ( it is an array... )  ( index 'dnode array-mult )
            DEBUGGING iftrue cr ." think it's an array??!" .s cr ifend
20          ?dup        ( index 'dnode array-mult array-mult | )
                        ( index 'dnode 0 )
            if ( the array is not empty... )  ( index 'dnode array-mult )
              r> swap 0  ( index 'dnode 'obj array-mult 0 )
              do   ( index 'dnode 'obj )
25              2dup   ( index 'dnode 'obj 'dnode 'obj )
                i swap rot  ( index 'dnode 'obj i 'obj 'dnode )
                14 +     ( index 'dnode 'obj i 'obj 'method )
                tracingon if ( tracing is enabled... )  ( index 'dnode 'obj i 'obj 'method )
                  dup cr 32id.r 3 pick ." [ " u ." ] "   ( index 'dnode 'obj i 'obj 'method )
30              then    ( index 'dnode 'obj i 'obj 'method )
                execute  ( index 'dnode 'obj 'elt | index 'dnode 'obj 0 )
                ?dup tracingon 0= or
                if           ( index 'dnode 'obj 'elt )
                  2over      ( index 'dnode 'obj 'elt index 'dnode )
35                +dn-target @  ( indexs 'dnode 'obj 'elt index 'descr )
                  tracingon if dup 22id.r 2 spaces then
                  active-descriptor @ >r dup active-descriptor !
                  validate-descr
                  match-method  ( index 'dnode 'obj 'elt cfa ivalue | )
40                              ( index 'dnode 'obj 'elt 0 )
                  if ( we found a match... )  ( index 'dnode 'obj 'elt cfa )
                    execute  ( index 'dnode 'obj )
                  else ( no match... )  ( index 'dnode 'obj 'elt 0 )
                    2drop             ( index 'dnode 'obj )
45                then              ( index 'dnode 'obj )
                  r> active-descriptor !
                else
                  tracingon if 0b spaces ." NULL OBJECT" then
                then
50            loop                 ( index 'dnode 'obj )
              >r                   ( index 'dnode )
            then ( index 'dnode ) .
          else ( it is not an array... ) ( index 'dnode array-mult )
            DEBUGGING iftrue cr ." figured out it's not an array!" .s cr ifend
55          drop r@              ( index 'dnode 'obj )
            over 14 +            ( index 'dnode 'obj 'method )
            tracingon if dup cr 32id.r 2 spaces then   ( index 'dnode 'obj 'method )
            DEBUGGING iftrue  cr ." ready to compute the address..." .s cr ifend
            execute              ( index 'dnode 'elt | index 'dnode 0 )
60          DEBUGGING iftrue  cr ." here's the address..." .s cr ifend
            ?dup tracingon 0= or
            if                   ( index 'dnode 'elt )
              0 2over            ( index 'dnode 'elt 0 index 'dnode )
              +dn-target @       ( index 'dnode 'elt 0 index 'descr )
65            tracingon if dup 22id.r 2 spaces then
              active-descriptor @ >r dup active-descriptor !
```

```
            validate-descr
            match-method      ( index 'dnode 'elt 0 cfa ivalue | )
                              ( index 'dnode 'elt 0 0 )
            if ( we found a match... )  ( index 'dnode 'elt 0 cfa )
              DEBUGGING iftrue  cr ." ready to execute the method..." .s cr ifend
              swap drop execute       ( index 'dnode )
            else ( no matching method... )  ( index 'dnode 'elt 0 )
              DEBUGGING iftrue  cr ." couldn't find a method..." .s cr ifend
              drop drop               ( index 'dnode )
            then
            r> active-descriptor !    ( index 'dnode )
          else                        ( index 'dnode )
            tracingon if 0b spaces ." NULL OBJECT" then
          then
        then                          ( index 'dnode )
        swap                          ( 'dnode index )
        DEBUGGING iftrue cr ." ready to take another pass..." .s cr ifend
      repeat                          ( index )
      r> 2drop ;

: print_general  ( 'obj 'descr -- )
    [ index-of PRINT ] literal recurse-dlist ;

: ctime  ( cfa -- )
    create
    ,
    does>                 ( 'obj addr | addr -- )
      @ state @           ( 'obj cfa state | cfa state )
      if ( compiling... )    ( cfa )
        active-descriptor @ [compile] literal ,
      else ( interpreting... )   ( 'obj cfa )
        active-descriptor @ swap ( 'obj 'descr cfa )
        execute
      then ;

create dno ," DYNAMIC_OBJECT"

: (NAME)     ( sno-object-addr -- name-addr )
  '(create) over 4 - @ = >r 0 over 8 - @ = r> and
  \ if ( this is a static named object ) body> >name \ circumvent hash problem
  if ( this is a static named object ) 5 cells - >name
  else drop dno then ;

: ADDROF   ( object-addr -- descriptor-addr )   ;

' print_general ctime (PRINT)

: dump_general  ( 'obj 'descr -- )
    [ index-of DUMP ] literal tracingon >r
      1 is tracingon recurse-dlist
      r> is tracingon ;

' dump_general ctime (DUMP)

: init_general  ( 'obj 'descr -- )
    [ index-of INIT ] literal recurse-dlist ;

' init_general ctime (INIT)

: (SIZE)   ( descriptor-addr -- size )
    active-descriptor @
    CLASS0: [ drop ] over =
    if ( we're working on a class... )  ( 'descr )
      state @
      if ( we're compiling... )   ( CLASS0: )
        drop compile +class-size compile @
```

```
           else ( interpreting... ) ( 'descr CLASS0: )
             drop +class-size @     ( size )
           then
         else ( we've got a regular object, not a class... ) ( 'descr )
 5         state @
           if ( we're compiling... )  ( 'descr )
             compile drop +class-size @ [compile] literal
           else ( interpreting... ) ( 'obj 'descr )
             +class-size @ swap drop  ( size )
10         then
        then
      ;

: ((MAKE))    ( 'descr -- )
15      dup make-sno-hdr restore-header  +class-size @ allot align ;

: (MAKE) ( -- )
        index-of MAKE state @
        if ( compiling ) here CELL - @ >body ( index 'descr )  else over then
20      validate-descr
        match-method ( addr true )
        if [ hidden ' (MAKE) (ool) ] literal over  -
            if    ( special ) state @ if , else execute then
            else ( normal ) drop state @ if compile ((MAKE)) else ((MAKE)) then
25          then exit
        then methods-error ;

: ((DMAKE))   ( 'descr -- 'obj ) +class-size @ get-memory ;
    : (DMAKE) ( -- )
30      index-of DMAKE state @
        if ( compiling ) here CELL - @ >body ( index 'descr )  else over then
        validate-descr
        match-method ( addr true )
        if [ hidden ' (DMAKE) (ool) ] literal over  -
35          if    ( special ) state @ if , else execute then
            else ( normal )  drop state @ if compile ((DMAKE)) else ((DMAKE)) then
            then exit
        then methods-error ;

40  : (DUNMAKE)   ( 'obj -- ) cr ." PRIMITIVE DUNMAKE OF OBJECT: " dup . cr
        ?dup if release-m then ( else it is a NULL object ) ;

: list-methods_general  ( 'descr -- ) ( display the methods associated with a descriptor )
        +mn-list    ( 'mn-head )
45      begin       ( 'mn-head )
          @ ?dup    ( 'mnode 'mnode | 0 )
        while       ( 'mnode )
          dup +mn-index @    ( n'mnode index )
          if ( this is a normal methods node... ) ( 'mnode )
50          dup +mn-target @    ( ' mnode cfa )
            cr id.              ( display the method )  ( 'mnode )
          else ( this is a link to another class... ) ( 'mnode )
            dup +mn-branch @    ( 'mnode 'descr )
            recurse             ( 'mnode )
55        then                  ( 'mnode )
        repeat      ( )
      ;
    : (LIST-METHODS) ( 'descr-descr | 'descr 'descr-descr | 'descr | 'obj 'descr )
        active-descriptor @ CLASS0: [ drop ] over =
60      if ( classname ..) ( 'descr-descr | 'descr 'descr-descr )
          drop state @
          if ( compiling.. ) ( )
            compile list-methods_general
          else ( interpreting... ) ( )
65          list-methods_general
          then
```

```
              else ( objectname.... )   ( 'descr | 'obj 'descr )
                state @
                if ( compiling... )    ( 'descr )
                  [compile] literal compile list-methods_general compile drop
 5              else ( interpreting )  ( 'obj 'descr )
                  list-methods_general drop
                then
              then ;

10      : (ADDR) ;

( The following code is used to define a new class )
        ool definitions (ool)
15      : class:
        \* +-----------------------------------------------------------------------+
        \* | This  is  the defining word to begin the definition of a new object class. See the |
        \* | system help on 200L for more information.                             |
        \* +-----------------------------------------------------------------------+
20
        : subclass:
        \* +-----------------------------------------------------------------------+
        \* | This  is  the  defining word to define a new subclass. A subclass is like a class, |
        \* | except its name can be made private within a class definition.        |
25      \* +-----------------------------------------------------------------------+ definitions
        : ((conceal))  ( 'mlist-head -- )
           ( conceal takes all of the methods nodes belonging to an m-list and )
30         (   sets bit-1 of all of those nodes whose "public bit" has not been set )
           begin
             @ ?dup                 ( 'mnode | 0 )
           while                    ( 'mnode )
             dup +mn-index dup @    ( 'mnode 'index index )
35           ?dup                   ( 'mnode 'index index index | 'mnode 'index 0 )
             if                     ( 'mnode 'index index )
               dup 1 and            ( 'mnode 'index index public-bit )
               if                   ( 'mnode 'index index )
                 2drop              ( 'mnode )
40             else
                 2 or swap !        ( 'mnode )
               then                 ( 'mnode )
             else                   ( 'mnode 'index )
               drop                 ( 'mnode )
45           then                   ( 'mnode )
           repeat ;

: (conceal) ( 'descr -- )
           ( conceals all the methods of all the subclasses belonging to the )
50         (   subclass list associated with this descriptor )
           +subclass-list           ( 'subclass )
           begin                    ( 'subclass )
             @ ?dup                 ( 'subclass 'subclass | 0 )
           while                    ( 'subclass )
55           dup                    ( 'subclass 'subclass )
             +mn-list               ( 'subclass 'mlist-head )
             ((conceal))            ( 'subclass )
             +subclass-link         ( 'subclass' )
           repeat ;
60
        : conceal ( 'descr -- )
           ( conceals all the methods of the class and its subclasses )
           dup (conceal)   ( conceal the subclasses )
           +mn-list ((conceal))  ( conceal the class itself )
65      ;
```

```
   : (CONCEAL)   (    | 'descr )
     active-descriptor @ CLASS0: [ drop ] =
     if ( classname ... ) (    | 'descr )
        state @
5       if ( compiling ... )
           compile conceal
        else ( interpreting ... )
           conceal
        then exit
10   then ( objectname ... ) methods-error ;

: ((reveal)) ( 'mlist-head -- )
        ( reveal takes all of the methods nodes belonging to an m-list and )
        (    clears bit-1 of all nodes )
15      begin
           @ ?dup                ( 'mnode | 0 )
        while                    ( 'mnode )
           dup +mn-index dup @   ( 'mnode 'index index )
           0fffffffd and         ( 'mnode 'index index' )
20         swap !                ( 'mnode )
        repeat ;

: (reveal) ( 'descr -- )
        ( reveals all the methods of all the subclasses belonging to the )
25      (    subclass list associated with this descriptor )
        +subclass-list           ( 'subclass )
        begin                    ( 'subclass )
           @ ?dup                ( 'subclass 'subclass | 0 )
        while                    ( 'subclass )
30         dup                   ( 'subclass 'subclass )
           +mn-list              ( 'subclass 'mlist-head )
           ((reveal))
           +subclass-link
        repeat ;
35
```

```
     : reveal
         ( reveal reveals all the methods of a class and its subclasses )
         dup (reveal)   ( reveals the subclasses )
         +mn-list ((reveal))    ( reveals the class itself )
   5   ;

: (REVEAL)    (   | 'descr )
         active-descriptor @ CLASS0: [ drop ] =
         if ( classname ... )   (   | 'descr )
  10       state @
           if ( compiling... )
             compile reveal
           else ( interpreting... )
             reveal
  15       then exit
         then ( objectname ... ) methods-error ;

( Now we attach the general methods to CLASS0: )

20   CLASS0: drop curr-class !   ( set up CLASS0: as the current class )
       ' (ADDR) mlink ADDR
       ' (CONCEAL) mlink CONCEAL immediate-method
       ' (DMAKE) mlink DMAKE immediate-method
       ' (DUMP) mlink DUMP immediate-method
  25   ' (DUNMAKE) mlink DUNMAKE
       ' (INIT) mlink INIT immediate-method
       ' (LIST-METHODS) mlink LIST-METHODS immediate-method
       ' (MAKE) mlink MAKE immediate-method
       ' (NAME) mlink NAME
  30   ' (PRINT) mlink PRINT immediate-method
       ' (REVEAL) mlink REVEAL immediate-method
       ' (SIZE) mlink SIZE immediate-method ool definitions (ool)
  35
     : ;class
     \* +-------------------------------------------------------------------------------+
     \* | This  word ends the current class definition. See the system help on 2OOL for more |
     \* | information.                                                                  |
  40   \* +-------------------------------------------------------------------------------+

: ;subclass
     \* +-------------------------------------------------------------------------------+
     \* | This word terminates definition of the current subclass.                      |
  45   \* +-------------------------------------------------------------------------------+

: member-of: ( 'obj -- ) ( <classname> <methodname> )
     \* +-------------------------------------------------------------------------------+
     \* | This  word  supports  late binding of a class of an object whose address is on the |
  50   \* | stack. Example usage:                                                         |
     \* |                                                                               |
     \* |    : test.member-of: ( -- ) 'testobj member-of: TestClass: DUMP ;             |
     \* |                                                                               |
     \* | See system help on 2OOL late-binding for more information.                    |
  55   \* +-------------------------------------------------------------------------------+ definitions
```

```
: make-descr-node ( array-size 'descr <descr-node-name> -- )
    elt-method:   ( create the basic method )
    ( now we create and initialize the elemental methods node )
    method-node allot    ( allocate the space )
    ( link it into the methods list )
    curr-class @ +mn-list @  curr-elt +elt-methnode +mn-link !
    curr-elt +elt-methnode +mn-link  curr-class @ +mn-list !
    ( initialize the index value )
    curr-elt +elt-methform +mf-index @
    public-flag @ or
    curr-elt +elt-methnode +mn-index !
    ( initialize the target of the method )
    curr-elt +elt-genword +gw-cfa  curr-elt +elt-methnode +mn-target !
    ( now we create and initialize the elemental descriptor node )
    descriptor-node allot    ( allocate the space )
    ( link it into the descriptor nodes list )
    0 curr-elt +elt-descrnode +dn-link ! ( 0 indicates end of list )
    curr-elt +elt-descrnode +dn-link dup  mrd-descr-node @ !  mrd-descr-node !
    ( initialize the target field )
    curr-elt +elt-descrnode +dn-target !
    ( initialize the array multiple )
    curr-elt +elt-descrnode +dn-array-multiple !
    ( now we create and initialize the generic word for execution time behavior )
    generic-word allot  ( allocate the space )
    ( set up the header pointer )
    curr-elt +elt-methform +mf-genword +gw-header @  curr-elt +elt-genword +gw-header !
    ( set up the does field )
    0 curr-elt +elt-genword +gw-does !
    ( set up the cfa )
    '(create)  curr-elt +elt-genword +gw-cfa !
    ( now we redirect the header )
    curr-elt +elt-genword +gw-cfa
    curr-elt +elt-methform +mf-genword +gw-header @ redirect-header
;

ool definitions (ool)
: shortalign
\* +-----------------------------------------------------------------------------+
\* | As  elements  are  being  defined  within a class'es instance data, the allocation |
\* | offset is being incremented by the size of  each  element.  This  word  moves  the |
\* | running offset up to the next 16-bit byte boundary.                                |
\* +-----------------------------------------------------------------------------+

: longalign
\* +-----------------------------------------------------------------------------+
\* | As elements  are  being  defined  within a class'es instance data, the allocation |
\* | offset is being incremented by the size of  each  element.  This  word  moves  the |
\* | running offset up to the next 32-bit byte boundary.                                |
\* +-----------------------------------------------------------------------------+
```

```
: alias:
\* +-----------------------------------------------------------------------------+
\* | The  alias: element type defines a pointer to a object whose type must be provided |
\* | by a class name preceding the alias: word. This defines an element  which  behaves |
\* | as if the element were an object of the referenced class, rather than as a pointer |
\* | to the object. Typical usage:                                               |
\* |                 SomeClassName: alias: +thisElementName                      |
\* | After  a class using alias: definitions has been instantiated, the alias: elements |
\* | need to be initialized using the assign: word. The assign: word  needs  an  object |
\* | address on the stack for an object of the specified class, or a zero to initialize |
\* | the alias: pointer as a NULL pointer. Example of using alias:               |
\* |                                                                             |
\* |                    <value> oa assign: <aliase:element>                      |
\* |                                                                             |
\* | Methods  referencing  alias:  elements should normally test the address, using the |
\* | ADDR method, before referencing other methods of the aliased object.        |
\* +-----------------------------------------------------------------------------+

: aliases:
\* +-----------------------------------------------------------------------------+
\* | The  aliases:  element type allows definition of an array of alias: pointers. Such |
\* | elements need to be initialized  in  almost  the  same  way  alias:  elements  are |
\* | initialized,  but  using the assigns: word instead of the assign: word. References |
\* | to arrays, require an index on the stack. For example:                      |
\* |                                                                             |
\* |             <value> <index> oa assigns: <aliases:element>                   |
\* +-----------------------------------------------------------------------------+

: assigns:
\* +-----------------------------------------------------------------------------+
\* | Used to initialize an element of an aliases: array. See aliases:            |
\* +-----------------------------------------------------------------------------+

: assign:
\* +-----------------------------------------------------------------------------+
\* | Used to initialize an alias: pointer. See alias:                            |
\* +-----------------------------------------------------------------------------+

: mexit
\* +-----------------------------------------------------------------------------+
\* | Provides a way to exit from a m: definition; equivalent to exit in : definition. |
\* +-----------------------------------------------------------------------------+

: ;binding-set
\* +-----------------------------------------------------------------------------+
\* | End definition of binding-set range.                                        |
\* | binding-set:                                                                |
\* |    :m m1 ... ;m                                                             |
\* |    :m m2 ... ;m                                                             |
\* |    .                                                                        |
\* |    .                                                                        |
\* |    :m mN ... ;m                                                             |
\* | ;binding-set                                                                |
\* +-----------------------------------------------------------------------------+
```

```
    : binding-set:
    \* +-------------------------------------------------------------------------------+
    \* | Begin definition of binding-set range.                                        |
    \* | binding-set:                                                                  |
 5  \* |    :m m1 ... ;m                                                               |
    \* |    :m m2 ... ;m                                                               |
    \* |    .                                                                          |
    \* |    .                                                                          |
    \* |    :m mN ... ;m                                                               |
10  \* | ;binding-set                                                                  |
    \* +-------------------------------------------------------------------------------+

: late-binding;
    \* +-------------------------------------------------------------------------------+
15  \* | Used to specify late-bound methods within m: definitions in a "template class". |
    \* +-------------------------------------------------------------------------------+

: is-bound?
    \* +-------------------------------------------------------------------------------+
20  \* | Used to test whether a template class method has been bound to a specific class. |
    \* +-------------------------------------------------------------------------------+

: m:
    \* +-------------------------------------------------------------------------------+
25  \* | In 2OOL, method names are global and unique. However, they must take on a   |
    \* | different specific meaning in relation to every class definition to which they |
    \* | apply. This is called "method binding". m: provides the specific code thread for |
    \* | each method as it applies to the class it is defined within. m: is the 2OOL |
    \* | equivalent to the regular forth : defining word.                              |
30  \* +-------------------------------------------------------------------------------+

: ;m
    \* +-------------------------------------------------------------------------------+
    \* | ;m terminates an m: method thread definition. It is roughly equivalent to ; for a |
35  \* | forth : definition.                                                           |
    \* +-------------------------------------------------------------------------------+

: mrecurse ( 'descr -- ) ( recursively reenter the current method )
    \* +-------------------------------------------------------------------------------+
40  \* | Used to recursively enter the current method definition                       |
    \* +-------------------------------------------------------------------------------+

: oa
    \* +-------------------------------------------------------------------------------+
45  \* | oa stands for "object address" This word does a compile time check for the class |
    \* | descriptor of an instance data reference. At run time, this word provides the |
    \* | current object's address as the base for referencing an instance data element. |
    \* +-------------------------------------------------------------------------------+

50  : object:
    \* +-------------------------------------------------------------------------------+
    \* | This word is used to define an element within a class, where the element type is |
    \* | actually an object of some other class. The MAKE or DMAKE of this class will |
    \* | automatically MAKE or DMAKE the element object within this class's instance data. |
55  \* | All methods of the object element's class can be applied against this element. |
    \* | Example useage:                                                               |
    \* |                                                                               |
    \* |    <otherClass>: object: +otherClassObjElement                                |
    \* |                                                                               |
60  \* +-------------------------------------------------------------------------------+

: objects:
    \* +-------------------------------------------------------------------------------+
    \* | This is like object: except it provides for the definition of an array of objects |
65  \* | of the specified class. References must provide an array index value.        |
    \* +-------------------------------------------------------------------------------+
```

```
     : union:
\*   +-----------------------------------------------------------------------------+
\*   | union: begins  the  definition  of  a  choice of different element types within a |
5    \*   | class's instance data definitions. Union: is used in  conjunction  with  the  word |
\*   | with: to define a set of choices in the form:                               |
\*   |                                                                             |
\*   |                    <classnameX> union: <eltname1>                           |
\*   |                    <classnameY> with:  <eltname2>                           |
10   \*   |                              .                                              |
\*   |                              .                                              |
\*   |                    <classnameZ> with:  <eltnameN>                           |
\*   |                                ;union                                       |
\*   |                                                                             |
15   \*   | Note: The elements of a union must be elements of other classes or subclasses. |
\*   |                                                                             |
\*   | It  is  presumed  that somewhere within the class instance data, some element will |
\*   | store the selector that indicates how the union has been initialized; i.e., which |
\*   | choice  of  the  possible  forms  has been used. Methods that are to reference the |
20   \*   | union will need this information. While it is possible to provide this information |
\*   | external  to the class and passed as a parameter to its methods, it is much better |
\*   | practice to include this information as part of the class itself.           |
\*   +-----------------------------------------------------------------------------+

25   : with:
\*   +-----------------------------------------------------------------------------+
\*   | with: continues the  definition  of  a  choice of different element types within a |
\*   | class's instance data definitions defined as a union:.                      |
\*   | An example:                                                                 |
30   \*   |                    <classnameX> union: <eltname1>                           |
\*   |                    <classnameY> with:  <eltname2>                           |
\*   |                              .                                              |
\*   |                              .                                              |
\*   |                    <classnameZ> with:  <eltnameN>                           |
35   \*   |                                ;union                                       |
\*   |                                                                             |
\*   | Also see union:                                                             |
\*   +-----------------------------------------------------------------------------+

40   : ;union
\*   +-----------------------------------------------------------------------------+
\*   | ;union completes the definition of a union: See union:                      |
\*   +-----------------------------------------------------------------------------+

45   : ubyte:
\*   +-----------------------------------------------------------------------------+
\*   | ubyte: is a primitive data element type to define unsigned byte elements.   |
\*   +-----------------------------------------------------------------------------+

50   : ubytes:
\*   +-----------------------------------------------------------------------------+
\*   | ubytes: is a primitive data type for defining an array of unsigned bytes.   |
\*   +-----------------------------------------------------------------------------+

55   : byte:
\*   +-----------------------------------------------------------------------------+
\*   | byte:  is  a  primitive  data element type for defining signed bytes. When a byte: |
\*   | element is fetched, it will be sign-extended onto the 32-bit parameter stack. It's |
\*   | sign bit is bit7 (leftmost bit).                                            |
60   \*   +-----------------------------------------------------------------------------+

: bytes:
\*   +-----------------------------------------------------------------------------+
\*   | bytes:  is a primitive data element type for defining an array of elements of type |
65   \*   | byte:                                                                       |
\*   +-----------------------------------------------------------------------------+
```

```
: short:
\* +-----------------------------------------------------------------------------+
\* | short: is a primitive data element type for defining signed 16-bit elements. |
\* | When an element is fetched, it will be sign-extended onto the 32-bit parameter |
\* | stack. It's sign bit is bit15 (leftmost bit).                               |
\* +-----------------------------------------------------------------------------+

: shorts:
\* +-----------------------------------------------------------------------------+
\* | shorts: is a primitive data element type for defining an array of elements of type |
\* | short:                                                                      |
\* +-----------------------------------------------------------------------------+

: ushort:
\* +-----------------------------------------------------------------------------+
\* | ushort: is a primitive data element type for defining unsigned 16-bit elements. |
\* +-----------------------------------------------------------------------------+

: ushorts:
\* +-----------------------------------------------------------------------------+
\* | ushorts: is a primitive data element type for defining an array of elements of |
\* | type ushort:                                                                |
\* +-----------------------------------------------------------------------------+

: ulong:
\* +-----------------------------------------------------------------------------+
\* | ulong: is a primitive data element type for defining unsigned 32-bit elements. |
\* +-----------------------------------------------------------------------------+

: ulongs:
\* +-----------------------------------------------------------------------------+
\* | ulongs: is a primitive data element type for defining an array of elements of type |
\* | ulong:                                                                      |
\* +-----------------------------------------------------------------------------+

: long:
\* +-----------------------------------------------------------------------------+
\* | long: is a primitive data element type for defining signed 32-bit elements. |
\* | It's sign bit is bit31 (leftmost bit).                                      |
\* +-----------------------------------------------------------------------------+

: longs:
\* +-----------------------------------------------------------------------------+
\* | longs: is a primitive data element type for defining an array of elements of type |
\* | long:                                                                       |
\* +-----------------------------------------------------------------------------+

: pointer:
\* +-----------------------------------------------------------------------------+
\* | pointer: is a primitive element data type that is equivalent to ulong: It is not a |
\* | strongly typed element, but is provided to indicate the cell is expected to |
\* | contain a 32-bit pointer. See alias: for a strongly typed object pointer.   |
\* +-----------------------------------------------------------------------------+

: pointers:
\* +-----------------------------------------------------------------------------+
\* | pointers: is a primitive data element type for defining an array of elements of |
\* | type pointer:                                                               |
\* +-----------------------------------------------------------------------------+

: ?bname
\* +-----------------------------------------------------------------------------+
\* | This word expects a cfa on the stack and checks it to determine that it is a |
\* | binding-set name. The system error routine is executed if it is not a binding-set |
\* | cfa.                                                                        |
```

```
     \* +-------------------------------------------------------------------------------+
     : T.bname
     \* +-------------------------------------------------------------------------------+
5    \* | Display  the   class   name  currently  associated with a task's instance of a binding |
     \* | name. The task's task control block address is expected on the stack.          |
     \* +-------------------------------------------------------------------------------+

: .bname
10   \* +-------------------------------------------------------------------------------+
     \* | This  displays  the   class name currently associated with the binding-set name for |
     \* | the current task (the task executing this word).                               |
     \* +-------------------------------------------------------------------------------+
```

Table 6

```
\ ***********************************************************
\ * COPYRIGHT(C) 1991-1993 AG COMMUNICATION SYSTEMS CORP.    *
\ ***********************************************************
  only forth definitions 0 cload fmtos
: fmtos ;
  include c4th.files/c4th.mmgr ( FMTOS - USER VARIABLE DEFINITIONS )
  base @ decimal
: prev-to-me \* +---------------------------------------------------------------------------------+
\* | This  word  is  used by the "user" word to link a newly defined user variable into |
\* | the uvar list.                                                                  |
\* +---------------------------------------------------------------------------------+

( FMTOS - USER VARIABLE DEFINITIONS )
: user
\* +---------------------------------------------------------------------------------+
\* | user  variables  are  defined to have an instance in each task's tcb (task control |
\* | block). This word creates a header for each new user variable and links it to  the |
\* | previously  defined  user  variable.  This linkage us used to support viewing user |
\* | variables with the .uvars and T.uvars words. User variables are assigned an offset |
\* | within  the  tcb.  A  user  variable  name, when executed, adds this offset to the |
\* | executing task's tcb address.                                                   |
\* +---------------------------------------------------------------------------------+

: same-as
\* +---------------------------------------------------------------------------------+
\* | Usage: same-as <uvarname>                                                       |
\* | user variables are assigned successively larger cell offsets as they are defined. |
\* | They are intended to provide an offset into any given task's  task  control  block |
\* | (tcb).  Some  tasks  may  be  defined  which  do  not  have need of an instance of |
\* | previously defined user variables beyond some limited early set. The same-as  word |
\* | allows  a  new  user  variable  to be defined with the same offset as a previously |
\* | defined user variable, so the tcb won't have to be so large to  accomodate  offset |
\* | cells  for  user  variables  not  used  by the task. This should be used with some |
\* | caution.  Use  of  this word resets the user offset to the offset of the specified |
\* | user variable.                                                                  |
\* +---------------------------------------------------------------------------------+

: next-user-cfa ( user-cfa -- next-user-cfa | 0 ) 8 + @ ;
  user >trace<
\* +---------------------------------------------------------------------------------+
\* | >trace< is a user variable that is used as a trace control flag by FSML and any |
\* | other words for which the designer may want to provide tracing. Setting >trace< |
\* | false turns off tracing and setting it true turns it on.                       |
\* +---------------------------------------------------------------------------------+

: forget
\* +---------------------------------------------------------------------------------+
\* | Usage: forget <wordname>                                                        |
\* | This  word "undefines" the specified word and all the words in the dictionary that |
\* | were defined after the specified word. This word also  fixes  up  the  user table |
\* | linkage to compensate for user variables that were forgotten in the process.    |
\* +---------------------------------------------------------------------------------+
```

```
     ( FMTOS - socket socket! fopen )
     also hidden also domain definitions
     : socket
     \* +----------------------------------------------------------------------------+
 5   \* | Usage: socket <socketname>                                                 |
     \* | Creates a new socket name and allocates a 20 byte buffer whose address is returned |
     \* | by executing the name.                                                     |
     \* +----------------------------------------------------------------------------+

10   : socket!
     \* +----------------------------------------------------------------------------+
     \* | Usage: ( addr ) <socketname> socket!                                       |
     \* | Expects an address on the stack and moves 20 bytes from it to the address returned |
     \* | by <socketname>                                                            |
15   \* +----------------------------------------------------------------------------+

: fopen
     \* +----------------------------------------------------------------------------+
     \* | Usage: <mode> fopen <path>                                                 |
20   \* | This is an interactive word to open a file whose Unix path is specified.   |
     \* |      mode = 0 ==> read                                                     |
     \* |      mode = 1 ==> write                                                    |
     \* |      mode = 2 ==> read/write                                               |
     \* +----------------------------------------------------------------------------+
25
     only forth definitions also hidden create fergitbuf ," forget " 48 allot
     : (forget)
30   \* +----------------------------------------------------------------------------+
     \* | Usage: ' <wordname> (forget)                                               |
     \* | The regular "forget" word is an interactive word. (forget) is to be used so |
     \* | another word can execute a "forget" during execution.                      |
     \* +----------------------------------------------------------------------------+
35
     456 define-memQ 456memQ ( used for creating TCBs )

: (kill)
     \* +----------------------------------------------------------------------------+
40   \* | This is an internal word expecting the tcb address of a task to be killed. Each |
     \* | task is either executing, suspended, waiting in the active list, or waiting on a |
     \* | semaphore. If it is suspended it's tcb is not linked to any list. Otherwise, the |
     \* | task is delinked from the list. Finally, the tcb is released to the memory |
     \* | manager.                                                                   |
45   \* +----------------------------------------------------------------------------+
```

```
    : kill
\*  +------------------------------------------------------------------------------+
\*  | Every task TCB contains a user variable "recvy-proc" which contains a pointer to a |
\*  | system default recovery routine "rcvy-rout". The default recovery routine  handles |
\*  | three cases:                                                                 |
\*  | 1. kill                                                                      |
\*  | 2. break                                                                     |
\*  | 3. timeout                                                                   |
\*  | The  user  may  use  the default choice for this procedure or design a specialized |
\*  | word  to  handle  the  particular  requirements  of  their  application  and  then |
\*  | initialize  their  task's  "recvy-proc"  user variable to point to the specialized |
\*  | recovery routine.                                                            |
\*  |                                                                              |
\*  | The word kill executes the "kill" case of the  recovery  routine.  The  default |
\*  | routine  discards  the  cause  flag (established for more specialized user-defined |
\*  | recovery routines), gets the TCB token from the top of  the  parameter  stack  and |
\*  | adjusts pointers within that TCB such that the next time that task is executed, it |
\*  | will release the memory used by its TCB, cease executing, and  return  control  to |
\*  | the scheduler. In effect, the task having that TCB is cancelled.             |
\*  +------------------------------------------------------------------------------+

: die
\*  +------------------------------------------------------------------------------+
\*  | A task may execute this word to kill itself.                                 |
\*  +------------------------------------------------------------------------------+

: make-tcb
\*  +------------------------------------------------------------------------------+
\*  | This  word makes a new task control block of a size that depends upon the supplied |
\*  | parameters:                                                                  |
\*  |     pfa[word] = pfa of the word to be executed as separate task              |
\*  |     rlen = rstack length   - must be multiple of 4 bytes                     |
\*  |     plen = pstack length   - must be multiple of 4 bytes                     |
\*  |     ulen = user-table size - must be multiple of 4 bytes                     |
\*  |     mtype = memQ type for managing tcb buffer                                |
\*  +------------------------------------------------------------------------------+

( FMTOS - semaphore )
    12 define-memQ 12memQ
    : semaphore
\*  +------------------------------------------------------------------------------+
\*  | Usage: semaphore <name>                                                      |
\*  | creates a semaphore with the name specified. A semaphore is a 3-cell object: |
\*  | +----------------+                                                           |
\*  | |   flink        | \                                                         |
\*  | +----------------+  > links to tcb's of tasks waiting on semaphore           |
\*  | |   blink        | /                                                         |
\*  | +----------------+                                                           |
\*  | | (#sig - #wait) | semaphore counter                                         |
\*  | +----------------+                                                           |
\*  +------------------------------------------------------------------------------+
```

```
: signal
\* +-------------------------------------------------------------------------------+
\* | This word  expects a semaphore address on the stack and signals the semaphore. If |
\* | one or more tasks are waiting on the semaphore, the  first   task   in   the  waiting |
\* | queue  is activated -- its tcb is removed from the waiting queue and placed at the |
\* | head of the scheduler queue. If no tasks are waiting on the semaphore, the counter |
\* | associated  with  the  semaphore is incremented, indicating the number of times the |
\* | semaphore has been signalled.                                                  |
\* +-------------------------------------------------------------------------------+

: wait
\* +-------------------------------------------------------------------------------+
\* | This  word  examines  the   status  of  the semaphore whose address is given on the |
\* | stack. If the semaphore is signalled, its counter  is  decremented  and  the  task |
\* | which  is  performing  the wait operation continues execution. If the semaphore is |
\* | not signalled, the tcb of the task is removed from the scheduler queue and  placed |
\* | into  a waiting queue associated with the semaphore. The task ceases execution and |
\* | control is passed to the scheduler.                                            |
\* +-------------------------------------------------------------------------------+

: ?waiting   ( token -- u )   ( return number of tasks waiting )
\* +-------------------------------------------------------------------------------+
\* | This word returns the number of tasks that are waiting on the semaphore.       |
\* +-------------------------------------------------------------------------------+

: ?signalled   ( tok -- u )   ( return number of times signalled)
\* +-------------------------------------------------------------------------------+
\* | This word returns the number of times the semaphore has been signalled         |
\* +-------------------------------------------------------------------------------+

: sem-reset   ( token -- )   ( reset a signalled semaphore )
\* +-------------------------------------------------------------------------------+
\* | This  word examines the status of the semaphore whose address has been provided on |
\* | the stack. If the semaphore is in the signalled state, it will  be  reset  to  the |
\* | idle state. If tasks are waiting on the semaphore, or if it is already in the idle |
\* | state, its status will remain unchanged.                                       |
\* +-------------------------------------------------------------------------------+

( FMTOS - get-e, put-e, ... )
: get-e   ( 'pipe -- adr32 )   ( get empty buffer from pipe )
\* +-------------------------------------------------------------------------------+
\* | The  word  get-e  obtains an "empty" buffer from the pipe identified by the address |
\* | ptoken. It returns the address of the buffer on the stack.                     |
\* +-------------------------------------------------------------------------------+

: put-e   ( 'buf 'pipe -- )
\* +-------------------------------------------------------------------------------+
\* | The  word put-e returns an empty buffer whose address is given by addr to the pipe |
\* | identified by the address ptoken.                                              |
\* +-------------------------------------------------------------------------------+

: get-f   ( 'pipe -- adr32 )   ( get full buffer from pipe )
\* +-------------------------------------------------------------------------------+
\* | The  word  get-f  obtains  a "full" buffer from the pipe identified by ptoken. The |
\* | address of the buffer is returned on the stack.                                |
\* +-------------------------------------------------------------------------------+
```

```
: put-f   ( adr32 'pipe -- )   ( place full buf into pipe )
\* +-----------------------------------------------------------------------------+
\* | The  word  put-f  takes a full buffer whose address is given by addr and places it |
\* | into the pipe identified by ptoken.                                         |
\* +-----------------------------------------------------------------------------+

: xget   ( adr32 'pipe -- adr32' )   ( xchg empty for full buf )
\* +-----------------------------------------------------------------------------+
\* | The  word x-get exchanges an "empty" buffer whose address is given by adr-e for a |
\* | "full" buffer whose address is given by adr-f. The "empty" buffer is returned  to |
\* | the  pipe  identified  by  ptoken and the "full" buffer is obtained from that same |
\* | pipe.                                                                       |
\* +-----------------------------------------------------------------------------+

: xput ( adr32 'pipe -- adr32' )
\* +-----------------------------------------------------------------------------+
\* | The  word x-put exchanges a "full" buffer whose address is given by adr-f with an |
\* | "empty" buffer whose address is given by adr-e. The  "full"  buffer  is  obtained |
\* | from  the  pipe  identified by ptoken and "empty" buffer is obtained from the same |
\* | pipe.                                                                       |
\* +-----------------------------------------------------------------------------+

: purge-ebufQ
\* +-----------------------------------------------------------------------------+
\* | Delink all objects on an empty buffer queue and return them to the memory manager. |
\* | This word is used by the pipe "close" word.                                 |
\* +-----------------------------------------------------------------------------+

: purge-Q
\* +-----------------------------------------------------------------------------+
\* | Delink all objects on a queue and return them to the memory manager.        |
\* | This word is used by the pipe "close" word.                                 |
\* +-----------------------------------------------------------------------------+

: new-pipe
\* +-----------------------------------------------------------------------------+
\* | This is the creating word for pipes, normally used by the "open" word for pipes. |
\* | Also, see pipe.                                                             |
\* +-----------------------------------------------------------------------------+
```

```
: pipe
\* +----------------------------------------------------------------------------------+
\* | The word pipe is used to define a type of pipe. It specifies the number of buffers |
\* | to be used when the pipe is opened together with the type of the buffers to be |
\* | used.  The  buffer   type should previously be defined using define-mem. Usage is a |
\* | follows:  10 60memQ pipe p-name                                                  |
\* |                                                                                  |
\* | Each pipe  instance  has  two  semaphore  structures  and a pre-defined number of |
\* | buffers by which inter-task communiction can take place. If a task is waiting for |
\* | an  input  from a pipe, or must wait to send an output into a full pipe (all empty |
\* | buffers have been consumed), it's task control block  (tcb)   is   linked  into the |
\* | associated  semaphore  queue. When the semaphore is signalled due to arrival of an |
\* | appropriate buffer (either full or empty, depending upon which semaphore is being |
\* | considered),  the next queued task will be moved to the active scheduling queue to |
\* | process the event at the next activation opportunity.                            |
\* |                                                                                  |
\* | pipe structure                                                                   |
\* |         semaphore empty        sending task tcb's                                |
\* |        +----------------+     +----------------+         +----------------+      |
\* |        | Q-top       *-|-->|                *-|-- - -->|                |<--+   |
\* |        +----------------+     +----------------+         +----------------+   |  |
\* |        | Q-bot       *-|----------------------------------------------------+  |
\* |        +----------------+                                                      |
\* |        | empty count    |     empty buffers                                    |
\* |        +----------------+     +----------------+         +----------------+    |
\* |      /| empty buffer Q |-->|                *-|-- - -->|                |      |
\* |     / +----------------+     +----------------+         +----------------+     |
\* | next /                                                                          |
\* | cell \  semaphore full         waiting task tcb's                               |
\* |       \ +----------------+     +----------------+         +----------------+    |
\* |        \| Q-top       *-|-->| ·              *-|-- - -->|                |<--+ |
\* |        +----------------+     +----------------+         +----------------+   | |
\* |        | Q-bot       *-|----------------------------------------------------+  |
\* |        +----------------+                                                      |
\* |        | full count    |     full buffers                                     |
\* |        +----------------+     +----------------+         +----------------+    |
\* |        | Q-top       |-->|                *-|-- - -->|                |<--+   |
\* |        +----------------+     +----------------+         +----------------+ |  |
\* |        | Q-bot       *-|----------------------------------------------------+  |
\* |        +----------------+                                                      |
\* |                                                                                  |
\* +----------------------------------------------------------------------------------+

: open
\* +----------------------------------------------------------------------------------+
\* | Open an instance of a pipe. The ptype must be obtained by a previous definition of |
\* | a pipe type using the pipe word. Executing the associated <pipe name> returns the |
\* | ptype. Also, see pipe.                                                           |
\* +----------------------------------------------------------------------------------+

: close
\* +----------------------------------------------------------------------------------+
\* | Close  an   instance   of a pipe associated with a token received when executing the |
\* | open word.                                                                       |
\* +----------------------------------------------------------------------------------+
```

```
: suspend
\* +-------------------------------------------------------------------------------+
\* | The  word  suspend causes the task whose TCB is given by token to cease execution. |
\* | The task itself is left in a stable state, such that it can be resumed at any time |
\* | in the future.                                                                |
\* +-------------------------------------------------------------------------------+

: resume
\* +-------------------------------------------------------------------------------+
\* | The  word  resume cancels the effect of a suspend operation on a task whose TCB is |
\* | identified by token. Most commonly this will enable the task to  resume  execution |
\* | unless additional suspend operations are in effect.                           |
\* +-------------------------------------------------------------------------------+

: (sched)
\* +-------------------------------------------------------------------------------+
\* | This is an internal word used by schedule and [schedule]. It makes a tcb and hooks |
\* | it into the scheduling queue.                                                 |
\* +-------------------------------------------------------------------------------+

: schedule   ( schedule following word )
\* +-------------------------------------------------------------------------------+
\* | Usage: schedule <name>                                                        |
\* | Schedules the specified word as a task.                                       |
\* +-------------------------------------------------------------------------------+

: [schedule]   ( schedule following word at execution time )
\* +-------------------------------------------------------------------------------+
\* | Usage: Within : definition... [schedule] <name> .... ;                        |
\* | Schedules the specified word as a task at execution time.                     |
\* +-------------------------------------------------------------------------------+

: dummy
\* +-------------------------------------------------------------------------------+
\* | This  is a dummy task to ensure there is always at least one tcb in the scheduling |
\* | queue.                                                                        |
\* +-------------------------------------------------------------------------------+

: tcom
\* +-------------------------------------------------------------------------------+
\* | This is the internal timer control word used by the "timer" word. Also see tmgr |
\* +-------------------------------------------------------------------------------+

: timer
\* +-------------------------------------------------------------------------------+
\* | This  word defines a timer instance for the task which executes the timer word. u1 |
\* | and u2 are parameters which the user may specify to return particular  information |
\* | or  identify  the timing event when several different timers may be simultaneously |
\* | running.                                                                      |
\* |                                                                               |
\* | The tasks recovery procedure timer entry will be executed if the  timeout   occurs, |
\* | and  the  recovery  procedure can be designed to interpret the returned parameters |
\* | (u1 & u2) and take whatever action the application requires.  Also see tmgr   |
\* +-------------------------------------------------------------------------------+
```

```
      : cancel-timer  ( 'timeblk -- )   ( halt a timer )
      \* +------------------------------------------------------------------------------+
      \* | When  a  specific timer  instance has been created, using the timer word, a timer |
      \* | token (ttoken) is returned. Normally, this timer will run and upon  timeout  cause |
 5    \* | the  timer  entry  of the associated task's recovery procedure to be executed. The |
      \* | cancel-timer word allows the timer to be  cancelled  prior  to  timing  out,  thus |
      \* | avoiding the timeout event. Also see tmgr                                        |
      \* +------------------------------------------------------------------------------+

10    : seconds    10 * ;
      : minutes    600 * ;
      : awaken     dup 16 + @ resume mput ;

( FMTOS - timer manager )
15    : delay
      \* +------------------------------------------------------------------------------+
      \* | This  will  suspend  the  task  executing  the delay for a period of u tenths of a |
      \* | second (ticks), then awaken the task.                                          |
      \* +------------------------------------------------------------------------------+
20
      semaphore tsem  ( timer semaphore )
      : tmgr  ( timer manager task )
      \* +------------------------------------------------------------------------------+
      \* | This is the timer manager code that runs in a continuous loop as a control task to |
25    \* | support fmtos timing functions. The timer manager waits  on  the  tsem  semaphore |
      \* | which is signalled once for each tick by the ticks word.                       |
      \* |                                                                                |
      \* | For each tick, the timer manager is unblocked and allowed to execute. Each time it |
      \* | executes, it steps to the next timing list in a queue of  64  separate  lists.  It |
30    \* | traverses  each  entry  that happens to be linked into the particular timing list, |
      \* | checking the entry's timeout value against the current wall-time. If it  is  equal |
      \* | to  the  current  wall  time,  the  entry  is  removed from the timer list and its |
      \* | supplied execution address  is  executed.  The  execution  address  which  may  be |
      \* | specified as any cfa when the timer is started, or defaults to the task's recovery |
35    \* | routine.                                                                        |
      \* |                                                                                |
      \* | After  a list has been traversed, all its entries containing the current wall-time |
      \* | will have been removed,  and  the  tmgr  then  increments  the  global  wall-timer |
      \* | counter.                                                                        |
40    \* +------------------------------------------------------------------------------+

: ticks ( n -- )
      \* +------------------------------------------------------------------------------+
      \* | Increments the wall time variable by #ticks. Also see tmgr                    |
45    \* +------------------------------------------------------------------------------+

( FMTOS - recovery routine )
      : (break)   drop ; ( dummy break routine )
      : break
50    \* +------------------------------------------------------------------------------+
      \* | This is a debugging aid which can temporarily be compiled into the definition of a |
      \* | task in any logic path the user wishes to analyze  interactively. When a  task  is |
      \* | executing and encounters a break, it is rearranged in the scheduling queue in such |
      \* | a way as to become the terminal task. The user may then interact  with  the  task, |
55    \* | dump  memory,  view  and/or  change stack contents for the task, spawn other tasks |
      \* | interactively etc. A break level indicator LVL[n] is displayed since more  than  a |
      \* | single level of break is supported.                                            |
      \* +------------------------------------------------------------------------------+
```

```
: recvy-rout
\* +----------------------------------------------------------------------------+
\* | This  is the default recovery routine, called with the appropriate token depending |
\* | upon what routine calls it.                                                |
\* +----------------------------------------------------------------------------+ decimal
user OUT
\* +----------------------------------------------------------------------------+
\* | OUT  is  a  user  variable whose contents indicate the number of output characters |
\* | have been emitted since the previous carriage return. This can be  used  by  words |
\* | that  are  required  to  produce  formatted  output  text with "smart" indentation |
\* | control.                                                                   |
\* +----------------------------------------------------------------------------+

: out!
\* +----------------------------------------------------------------------------+
\* | i/o CELL+ is a global variable that contains a pointer to the primitive routine to |
\* | be used for output to the screen. Normally, this would be  the  nucleus  primitive |
\* | etype.  To  support  the  availability  of  the  current output column in the user |
\* | variable OUT, out! increments OUT when strings are typed, and  zeros  OUT  when  a |
\* | carriage  return  is emitted. After this, out! executes etype. The address of out! |
\* | is loaded into i/o CELL+ to enable this feature.                           |
\* +----------------------------------------------------------------------------+
```

Table 7

```
    \ **********************************************************
    \ * COPYRIGHT(C) 1991-1993 AG COMMUNICATION SYSTEMS CORP. *
    \ **********************************************************
    0 cload fsml
 5  only forth definitions
    create task-fsml
    vocabulary fsml also fsml definitions ( FSML CODE - variable definitions )
10  hex
    40 CELLS constant Rsize
    20 CELLS constant Psize
    64 CELLS constant Usize
    32 ( hex ) constant #STATES
15  2 20memQ pipe input-pipe
    Rsize Psize Usize + + define-memQ mach-memQ user curr-state
    \* +-------------------------------------------------------------------------------+
20  \* | Each  instance  of  a  finite  state  machine  runs as a separate task with a task |
    \* | control block (tcb) containing task-specific variables, called "user variables". |
    \* |                                                                                 |
    \* | curr-state  contains  the pointer into the state-input table (SIT) for the current |
    \* | state of the machine.                                                           |
25  \* +-------------------------------------------------------------------------------+ user in-save
    \* +-------------------------------------------------------------------------------+
    \* | Each  instance  of  a  finite  state  machine  runs as a separate task with a task |
30  \* | control block (tcb) containing task-specific variables, called "user variables". |
    \* |                                                                                 |
    \* | in-save contains the last input token sent to the machine.                      |
    \* +-------------------------------------------------------------------------------+

35  user prev-state
    \* +-------------------------------------------------------------------------------+
    \* | Each  instance  of  a  finite  state  machine  runs as a separate task with a task |
    \* | control block (tcb) containing task-specific variables, called "user variables". |
    \* |                                                                                 |
40  \* | prev-state contains a pointer to the previous state for this machine.           |
    \* +-------------------------------------------------------------------------------+ user my-pipe
    \* +-------------------------------------------------------------------------------+
45  \* | Each  instance  of  a  finite  state  machine  runs as a separate task with a task |
    \* | control block (tcb) containing task-specific variables, called "user variables". |
    \* |                                                                                 |
    \* | my-pipe contains a pointer to this machine's input pipe.                        |
    \* +-------------------------------------------------------------------------------+
50  user 'process
    \* +-------------------------------------------------------------------------------+
    \* | Each  instance  of  a  finite  state  machine  runs as a separate task with a task |
    \* | control block (tcb) containing task-specific variables, called "user variables". |
    \* |                                                                                 |
55  \* | 'process is automatically updated when a message is sent to this machine. The fsml |
    \* | message header structure contains the value of 'process supplied by the sender. It |
    \* | typically  contains  a  pointer  to a message body containing information elements |
    \* | required by the application.                                                    |
    \* +-------------------------------------------------------------------------------+
60  : (in-srch)
    \* +-------------------------------------------------------------------------------+
    \* | This  is  an internal fsml word that searches a linked list of defined fsml inputs |
    \* | and returns a true flag and a pointer to the pfa of the input if it is defined. If |
    \* | the ivalue supplied does not correspond to a previously defined fsml input, only a |
65  \* | false flag is returned.                                                         |
    \* +-------------------------------------------------------------------------------+
```

```
   : type.r
   \* +------------------------------------------------------------------------------+
   \* | This is a primitive to type a string right adjusted within a specified width. If |
 5 \* | the string is longer than the specified width, it will be truncated on output.   |
   \* +------------------------------------------------------------------------------+

: id.r
   \* +------------------------------------------------------------------------------+
10 \* | This is a primitive that types the identifier associated with a cfa (a word name) |
   \* | right-adjusted within a specified width.                                          |
   \* +------------------------------------------------------------------------------+

: (.st)
15 \* +------------------------------------------------------------------------------+
   \* | This is an internal primitive used to type a state name associated with a State |
   \* | Input Table address ( 'SIT ).                                                   |
   \* +------------------------------------------------------------------------------+

20 : .state
   \* +------------------------------------------------------------------------------+
   \* | This word will type the state name of the current state of the current machine. |
   \* +------------------------------------------------------------------------------+

25 : .mach
   \* +------------------------------------------------------------------------------+
   \* | This word types out the name of the fsm whose tcb is supplied on the parameter |
   \* | stack.                                                                          |
   \* +------------------------------------------------------------------------------+
30 : .in
   \* +------------------------------------------------------------------------------+
   \* | Supplied an input value (Token), this word types out its name, right-adjusted in a |
   \* | width of 18 characters. Longer names are truncated.                                |
35 \* +------------------------------------------------------------------------------+

: .time
   \* +------------------------------------------------------------------------------+
   \* | This word displays the number of ticks in the wall-time counter.              |
40 \* +------------------------------------------------------------------------------+

: .intrace
   \* +------------------------------------------------------------------------------+
   \* | This is an fsml trace support word. It outputs trace data associated with an input |
45 \* | event.                                                                              |
   \* +------------------------------------------------------------------------------+
```

```
: close-my-pipe
\* +----------------------------------------------------------------------------------+
\* | This word closes a machine's input pipe and cleans up any attached buffers. This |
\* | will be used when a machine executes its recovery routine, such as when a machine|
\* | is being "killed".                                                               |
\* +----------------------------------------------------------------------------------+

: mrcvy-rout
\* +----------------------------------------------------------------------------------+
\* | This  is  the  default recovery routine for fsms. It is executed when a machine is|
\* | being killed, hits a break, or has a timeout.                                    |
\* | The  timeout  case  supports an interface with the timer manager which essentially|
\* | sends a message of the same form as fsml message headers to the input pipe of the|
\* | machine that started the timer. This is set up by the start-timer word.          |
\* +----------------------------------------------------------------------------------+

: (start-state)
\* +----------------------------------------------------------------------------------+
\* | This is an internal word that initialized the state of a machine.                |
\* +----------------------------------------------------------------------------------+

: (m-sched)
\* +----------------------------------------------------------------------------------+
\* | This  is  the internal word that schedules a new instance of a fsm. It allocates a|
\* | special tcb for fsms and schedules the task for the new machine.                 |
\* +----------------------------------------------------------------------------------+

: doit
\* +----------------------------------------------------------------------------------+
\* | This  is  an  internal primitive, used by (run-mach) to transfer control to a code|
\* | thread.                                                                          |
\* +----------------------------------------------------------------------------------+

: (run-mach)
\* +----------------------------------------------------------------------------------+
\* | This  is an internal word that checks whether an fsm instance has an input, and if|
\* | so, it executes the appropriate thread of  code  for  the  current  state  of  the|
\* | machine.                                                                         |
\* +----------------------------------------------------------------------------------+

: .dest
\* +----------------------------------------------------------------------------------+
\* | This is an fsml trace support word that prints the 'tcb and name of a machine.   |
\* +----------------------------------------------------------------------------------+

: .outtrace
\* +----------------------------------------------------------------------------------+
\* | This  is  an  fsml  trace  supporting word that displays a line of trace output in|
\* | conjunction with an fsm output to another machine.                               |
\* +----------------------------------------------------------------------------------+

: ton
\* +----------------------------------------------------------------------------------+
\* | This  is  a  control word that turns on fsml tracing. It will apply to the current|
\* | machine and any "child" fsms spauned by the current machine.                     |
\* +----------------------------------------------------------------------------------+
```

```
: toff
\* +---------------------------------------------------------------------------+
\* | This is a control word that turns off fsml tracing in the current machine. |
\* +---------------------------------------------------------------------------+

: .trace
\* +---------------------------------------------------------------------------+
\* | This is an internal word used for fsml tracing to display trace output headers. |
\* +---------------------------------------------------------------------------+

: pass-on
\* +---------------------------------------------------------------------------+
\* | This is an internal fsml word that passes an input to a machine. |
\* +---------------------------------------------------------------------------+

: input-match
\* +---------------------------------------------------------------------------+
\* | This  is  an  internal  fsml word that attempts to match an input value in the SIT |
\* | (State Input Table) and return the address of the appropriate action table. |
\* +---------------------------------------------------------------------------+

: process-input
\* +---------------------------------------------------------------------------+
\* | This is an internal fsml word that vectors an input to the appropriate thread for |
\* | an fsm state. |
\* +---------------------------------------------------------------------------+

: reset-fsml
\* +---------------------------------------------------------------------------+
\* | This is an internal fsml word that zaps the fsml-state variable |
\* +---------------------------------------------------------------------------+

: .err
\* +---------------------------------------------------------------------------+
\* | This displays FSML errors encountered during compiling. |
\* +---------------------------------------------------------------------------+

: ?st=0
\* +---------------------------------------------------------------------------+
\* | This  is  an  internal fsml word that generates an error message if executed while |
\* | not in interpreter mode. |
\* +---------------------------------------------------------------------------+

: ?st=1
\* +---------------------------------------------------------------------------+
\* | This  is  an  internal fsml word that generates an error message if executed while |
\* | not in compiling mode. |
\* +---------------------------------------------------------------------------+

: ?cschk
\* +---------------------------------------------------------------------------+
\* | This  is  an  internal  fsml  word that generates an error message if the supplied |
\* | state is not equal to the state value in fsml-state. |
\* +---------------------------------------------------------------------------+

: .warn
\* +---------------------------------------------------------------------------+
\* | This  is  an  internal  fsml  word  for  issuing  a  warning  message  during fsml |
\* | compilation. |
\* +---------------------------------------------------------------------------+
```

```
        ( FSML CODE - sit table )
        variable state-input-tbl-base
        variable state-input-tbl-ptr
        0d0 ( 208 ) state-input-tbl-base !
 5
        \ THIS DEPENDS ON SCREENS!
        \ THIS BUILDS STATE INPUT TABLE IN BLOCK
        \ VIRTUAL MEMORY, THEN TRANSFERS IT TO THE DICTIONARY 10      : SIT,
        \* +------------------------------------------------------------------------------+
        \* | This  stores  a State Input Table value in a buffer that will eventually be copied |
        \* | into the dictionary.                                                         |
        \* +------------------------------------------------------------------------------+
15
        : SIT>dict
        \* +------------------------------------------------------------------------------+
        \* | This  is  an  internal  fsml word that transfers a State Input Table that has been |
        \* | initially compiled in a disk buffer back into the dictionary. This is done so that |
20      \* | action  routines that are part of an fsml definition are not interspersed with the |
        \* | SIT, making its address offsets invalid.                                     |
        \* +------------------------------------------------------------------------------+

: 0>SIT
25      \* +------------------------------------------------------------------------------+
        \* | This  is  an  internal  fsml  word that initializes the pointer to the State Input |
        \* | Table.                                                                       |
        \* +------------------------------------------------------------------------------+

30      : SIT--
        \* +------------------------------------------------------------------------------+
        \* | This  is  an  internal  fsml  word  that decrements the pointer to the State Input |
        \* | Table.                                                                       |
        \* +------------------------------------------------------------------------------+
35
        : 'SIT
        \* +------------------------------------------------------------------------------+
        \* | This is a word that returns a pointer to the current State Input Table.      |
        \* +------------------------------------------------------------------------------+
40
        : machine
        \* +------------------------------------------------------------------------------+
        \* | Usage: machine <machine-type-name>                                           |
        \* | This is the defining word for a new finite state machine type.              |
45      \* +------------------------------------------------------------------------------+

: [m-schedule]
        \* +------------------------------------------------------------------------------+
        \* | Usage: [m-schedule] <machine-type-name name>                                 |
50      \* | This  is  a  word  that may be compiled into another word, such as a : definition, |
        \* | which when executed, will schedule an instance of a machine of the type specified. |
        \* +------------------------------------------------------------------------------+ create end-states ( used to terminate states )
55      \* +------------------------------------------------------------------------------+
        \* | Terminates state predefinition sequence. See states                          |
        \* +------------------------------------------------------------------------------+
```

```
    create st-lnk 0 ,
    \* +-----------------------------------------------------------------------------+
    \* | This is the head of an internal fsml state link-list, used to check and administer |
    \* | state names.                                                                |
5   \* +-----------------------------------------------------------------------------+ create dpth 0 ,
    \* +-----------------------------------------------------------------------------+
    \* | This is an internal fsml variable used in the stack word for checking for abnormal |
10  \* | stack depth during fsml execution.                                          |
    \* +-----------------------------------------------------------------------------+

: (states)
    \* +-----------------------------------------------------------------------------+
15  \* | This  is an internal word, used by the "states" word to predefine the states of an |
    \* | fsm.                                                                        |
    \* +-----------------------------------------------------------------------------+

: states
20  \* +-----------------------------------------------------------------------------+
    \* | Within  a machine type definition, the code between machine and states constitutes |
    \* | initialization code that will be  executed  when  an  instance  of  the  specified |
    \* | machine  type is scheduled. Between states and end-states is a list of states that |
    \* | are to be used by the machine type being compiled. Example:                 |
25  \* |                                                                             |
    \* |    machine <machine-type-name>                                              |
    \* |       .                     \                                               |
    \* |       .                      > fsm prolog                                   |
    \* |       .                     /                                               |
30  \* |                                                                             |
    \* |    states                   \                                               |
    \* |       <state-name1>          |                                              |
    \* |       <state-name2>          |                                              |
    \* |       .                      \  State                                       |
35  \* |       .                      /  predefinition list                          |
    \* |       .                      |                                              |
    \* |       .                      |                                              |
    \* |       <state-nameN>         /                                               |
    \* |    end-states                                                               |
40  \* |                                                                             |
    \* +-----------------------------------------------------------------------------+

( FSML CODE - error help display routines )
    decimal
45  : ERRSCN
    \* +-----------------------------------------------------------------------------+
    \* | FSML  error messages are located on cforth screens, taking advantage of the screen |
    \* | virtual storage access mechanism. Each error message is simply encoded as text  in |
    \* | a forth screen. The ERRSCN word is the first word on each screen, causing the text |
50  \* | to be printed out when accessing the screen via the "load" word.            |
    \* +-----------------------------------------------------------------------------+

: -more-
    \* +-----------------------------------------------------------------------------+
55  \* | This  is an extension of the ERRSCN word. When an FSML error message requires more |
    \* | than a single screen, the preceeding screen(s) prompts to hit  a  non-RETURN  key. |
    \* | this word will then list the next screen.                                   |
    \* +-----------------------------------------------------------------------------+
```

```
    ( FSML CODE - input input! )
    hex
    create input#  1 ,   ( auto-defined input value )
    -1 constant or-else    0 , 0cc8e ,
5   ' or-else >body in-lnk !   ( linked list of inputs )

: next-input
    \* +-----------------------------------------------------------------------------+
    \* | The  FSML  "input"  word  assigns  input  values  to  input definitions. This word |
10  \* | generates the automatically defined input values. This word is  an  internal  FSML |
    \* | word not normally accessed directly by the programmer writing FSML code.    |
    \* +-----------------------------------------------------------------------------+

: input!
15  \* +-----------------------------------------------------------------------------+
    \* | Usage: <value> input <input-name>                                           |
    \* | This  word  is like the "input" word, except instead of automatically assigning an |
    \* | input value, input! accepts a user-defined value for the particular input.  Before |
    \* | beginning  definition  of  inputs with automatically assigned values, The user can |
20  \* | preset the input# variable to some value out of the range of the manually assigned |
    \* | inputs to allow concurrent non-conflicting use of the "input" automatic definition |
    \* | of values and the "input!" manually assigned values.                        |
    \* +-----------------------------------------------------------------------------+

25  : input
    \* +-----------------------------------------------------------------------------+
    \* | Usage: input <input-name>                                                   |
    \* | This  will  define  a  new  FSML input and assign the next available automatically |
    \* | assigned value to it, using the input# variable to select the next  value.  input# |
30  \* | is then incremented.                                                        |
    \* +-----------------------------------------------------------------------------+

: state
    \* +-----------------------------------------------------------------------------+
35  \* | Usage: state <state-name>                                                   |
    \* | This  word  is  used  within  the  body  of an FSM definition to specify the state |
    \* | behavior of the named state. It is followed by a list of inputs  accepted  by  the |
    \* | state with corresponding next-states and output action code.                |
    \* +-----------------------------------------------------------------------------+
40
    : ?valid-in
    \* +-----------------------------------------------------------------------------+
    \* | This  is a word to check that an input value is associated with a valid FSML input |
    \* | definition. This is an internal FSML word.                                  |
45  \* +-----------------------------------------------------------------------------+

: [
    \* +-----------------------------------------------------------------------------+
    \* | Usage: <input> <next-state> { <output action code> }                        |
50  \* | This word specifies the beginning of the output action for a state-input pair. |
    \* +-----------------------------------------------------------------------------+

: (stk-chk)
    \* +-----------------------------------------------------------------------------+
55  \* | This is an internal FSML word that checks for a valid parameter stack depth during |
    \* | execution of an FSM. A warning is displayed if the stack depth is invalid in the   |
    \* | context of the machine.                                                     |
    \* +-----------------------------------------------------------------------------+
```

```
      : }
      \* +-----------------------------------------------------------------------------+
      \* | Usage: <input> <next-state> { <output action code> }                        |
      \* | This word  terminates  the definition of the output action code for a state-input |
 5    \* | pair.                                                                       |
      \* +-----------------------------------------------------------------------------+

: (inner)
10    \* +-----------------------------------------------------------------------------+
      \* | This is an internal FSML word used for compilation of a machine.            |
      \* +-----------------------------------------------------------------------------+

: start-state ( <state-name> )
15    \* +-----------------------------------------------------------------------------+
      \* | This word terminates the definition of a machine type and specifies the starting |
      \* | state initialization for instances of the machine type.                     |
      \* +-----------------------------------------------------------------------------+

20    : create-timer
      \* +-----------------------------------------------------------------------------+
      \* | Usage: <input-name> <#ticks> create-timer <timer-name>                      |
      \* | The create-timer word is used to create a timer "type", characterized by the input |
      \* | value it will return and by the number of ticks which  defines  its  period.  Each |
25    \* | tick  corresponds to  .1 second, or can be simulated using the "ticks" word. When |
      \* | executed, the <timer-name> word returns an address on the paramter stack which can |
      \* | be used  later in conjunction with the start-timer word to establish a particular |
      \* | instance of the timer and with the reset-timer word to reset an  instance  of  the |
      \* | timer.                                                                      |
30    \* |                                                                             |
      \* | <timer-name> returns a pointer to the timer type structure:                 |
      \* |         |                                                                   |
      \* |         |      +----------------+                                           |
      \* |         +----->| #ticks         |                                           |
35    \* |                +----------------+                                           |
      \* |                | input-value    |                                           |
      \* |                +----------------+                                           |
      \* |                                                                             |
      \* +-----------------------------------------------------------------------------+
40
      : 'pipe
      \* +-----------------------------------------------------------------------------+
      \* | Each  FSML  machine  has a user variable containing the pointer to its input pipe. |
      \* | This word accepts the tcb address of a machine's task and retrieves that machine's |
45    \* | pipe address. This is normally used internal to FSML.                       |
      \* +-----------------------------------------------------------------------------+

: >chan
      \* +-----------------------------------------------------------------------------+
50    \* | This  word feeds an input to the machine instance specified by the 'tcb on top the |
      \* | stack.                                                                      |
      \* +-----------------------------------------------------------------------------+
```

```
: channel
\* +------------------------------------------------------------------------------+
\* | Usage:                                                                       |
\* |   user <uvar-name>                  \ defines a user variable to use with channel |
\* |   <uvar-name> clear                 \ initialize the user variable           |
\* |   <uvar-name> channel <access-name> \ defines a channel access name          |
\* |   <input-name> <access-name>        \ sends input to machine attached to channel |
\* | A channel may be used to establish a 1-1 or N-1 communication binding between |
\* | different machines. The "channel" word is used to define an access name for  |
\* | sending inputs to a machine from other machines which have attached to that  |
\* | channel using the ch-attach word.                                            |
\* |                                                                              |
\* +------------------------------------------------------------------------------+
\* | FSML CHANNEL STRUCTURE                                                       |
\* | The FSML channel structure is built upon the FMTOS communication pipe mechanism. |
\* | "pipe" is a FMTOS data type which may be used to create any number of instances of |
\* | communication pipes. Each pipe instance has two semaphore structures and a   |
\* | pre-defined number of buffers by which inter-task communiction can take place.  If |
\* | a task is waiting for an input from a pipe, or must wait to send an output into a |
\* | full pipe (all empty buffers have been consumed), it's task control block (tcb) is |
\* | linked into the associated semaphore queue. When the semaphore is signalled due to |
\* | arrival of an appropriate buffer (either full or empty, depending upon which |
\* | semaphore is being considered), the next queued task will be moved to the active |
\* | scheduling queue to process the event at the next activation opportunity.    |
\* |                                                                              |
\* |                                                           user table         |
\* |      ' CH->X >body ( pfa )-> offset + self -------+   +----------------+     |
\* |                                                   |   |       .        |     |
\* |                                                   |   +----------------+     |
\* |                                                   +-->| ptr to pipe X  |---+ |
\* |                                                       +----------------+   | |
\* |                                                       |                |   | |
\* |                                                                            |
\* |    +--------------------------------------------------------------------+  |
\* |    |       semaphore empty       sending task tcb's                     |  |
\* |    |       +----------------+    +----------------+    +----------------+  |
\* |    +---->| Q-top         *-|-->|         *-|-- - -->|                |<--+ |
\* |    |       +----------------+    +----------------+    +----------------+  | |
\* |    |       | Q-bot         *-|-------------------------------------------+ |
\* |    |       +----------------+                                              |
\* |    |       | empty count    |    empty buffers                             |
\* |    |       +----------------+    +----------------+    +----------------+  |
\* |    +---| empty buffer Q |-->|              *-|-- - -->|                |   |
\* |    |       +----------------+    +----------------+    +----------------+  |
\* | next|                                                                      |
\* | cell|  semaphore full       waiting task tcb's                             |
\* |    |       +----------------+    +----------------+    +----------------+  |
\* |    +-->| Q-top         *-|-->|         *-|-- - -->|                |<--+ |
\* |    |       +----------------+    +----------------+    +----------------+  | |
\* |    |       | Q-bot         *-|-------------------------------------------+ |
\* |    |       +----------------+                                              |
\* |    |       | full count     |    full buffers                              |
\* |    |       +----------------+    +----------------+    +----------------+  |
\* |    |       | Q-top          |-->|              *-|-- - -->|                |<--+ |
\* |    |       +----------------+    +----------------+    +----------------+  | |
\* |    |       | Q-bot          |-------------------------------------------+ |
\* |    |       +----------------+                                              |
\* |                                                                            |
\* +------------------------------------------------------------------------------+
: alias
\* +------------------------------------------------------------------------------+
\* | Usage: <machine type name> m-schedule alias <alias-name>                     |
\* | This word can be used to specify a symbolic name by which to reference an instance |
\* | of an FSML machine type.                                                     |
\* +------------------------------------------------------------------------------+
```

```
    : m-schedule
    \* +----------------------------------------------------------------------------------+
    \* | Usage: <machine type name> m-schedule                                            |
5   \* | m-schedule is  the interactive word for scheduling an instance of an FSML machine |
    \* | type.                                                                            |
    \* +----------------------------------------------------------------------------------+ also hidden
10  : ch-attach
    \* +----------------------------------------------------------------------------------+
    \* | The  channel  word  is  used  to define 1-1 and N-1 communication bindings between |
    \* | FSMs. It is associated with a user variable,  so any machines  defined  after  a |
    \* | channel's user variable has been defined will create a corresponding user variable |
15  \* | instance for each machine instance. Before a channel can be used for communication |
    \* | between  machine x and machine y, a ch-attach operation must be executed to set up |
    \* | the linkage.                                                                     |
    \* | EXAMPLE:                                                                         |
    \* |   Assume previous definitions:                                                   |
20  \* |       machine xyz             ( machine type definition )                        |
    \* |       input in1               ( input definition        )                        |
    \* |                                                                                  |
    \* |   The following definitions to be compiled:                                      |
    \* |       user uch->xyz             ( user variable for channel  )                   |
25  \* |       uch->xyz channel ch->xyz  ( define channel access word )                   |
    \* |       uch-xyz clear             ( initialize channel uvar    )                   |
    \* |       [m-schedule] xyz          ( -- 'tcb ) ( create instance of xyz )           |
    \* |       uch->xyz ch-attach        ( binds ch->xyz to instance of xyz     )         |
    \* |                                                                                  |
30  \* |   During execution:                                                              |
    \* |       in1 ch->xyz               ( send in1 to instance of xyz attached to ch->xyz ) |
    \* +----------------------------------------------------------------------------------+
```

```
: plex
\* +-----------------------------------------------------------------------------------+
\* | A  plex is similar to a channel except the plex supports 1-N and N-M communication |
\* | bindings between fsms. Instead of  defining  a  name  of  a  single  communication |
\* | channel,  plex  defines the name of a set of numeric values wherein each member of |
\* | the set corresponds to a communication port  instance.  Like  a  channel,  a  plex |
\* | requires an associated user variable definition.                                   |
\* | EXAMPLE:                                                                           |
\* |   Assume previous definitions:                                                     |
\* |       machine xyz              ( machine type definition )                         |
\* |       input in1                ( input definition        )                         |
\* |                                                                                    |
\* |   The following definitions to be compiled:                                        |
\* |       user ulx->xyz            ( user variable for plex  )                         |
\* |       ulx->xyz plex pl->xyz    ( define plex access word )                         |
\* |       ulx-xyz clear            ( initialize plex uvar    )                         |
\* |       [m-schedule] xyz         ( -- 'tcb ) ( create instance of xyz )              |
\* |       5 swap ulx->xyz p-attach ( associate index=5 with instance of ulx->xyz and ) |
\* |                                ( linked to instance of xyz identified by 'tcb   )  |
\* |                                                                                    |
\* |   During execution:                                                                |
\* |       in1 5 pl->xyz            ( send in1 to instance of xyz attached to pl->xyz[5]) |
\* +-----------------------------------------------------------------------------------+

: p-attach
\* +-----------------------------------------------------------------------------------+
\* | Associates a selector index with an instance of an FSM                             |
\* | EXAMPLE:                                                                           |
\* |   Assume previous definitions:                                                     |
\* |       machine xyz              ( machine type definition )                         |
\* |       input in1                ( input definition        )                         |
\* |                                                                                    |
\* |   The following definitions to be compiled:                                        |
\* |       user ulx->xyz            ( user variable for plex  )                         |
\* |       ulx->xyz plex pl->xyz    ( define plex access word )                         |
\* |       ulx-xyz clear            ( initialize plex uvar    )                         |
\* |       [m-schedule] xyz         ( -- 'tcb ) ( create instance of xyz )              |
\* |       5 swap ulx->xyz p-attach ( associate index=5 with instance of ulx->xyz and ) |
\* |                                ( linked to instance of xyz identified by 'tcb   )  |
\* |                                                                                    |
\* |   During execution:                                                                |
\* |       in1 5 pl->xyz            ( send in1 to instance of xyz attached to pl->xyz[5]) |
\* |                                                                                    |
\* +-----------------------------------------------------------------------------------+

: p-detach
\* +-----------------------------------------------------------------------------------+
\* | Removes  the  communication  port  indicated by the index from the plex associated |
\* | with the specified user variable.                                                  |
\* | EXAMPLE:                                                                           |
\* |   5 ulx->xyz p-detach ( see p-attach )                                             |
\* +-----------------------------------------------------------------------------------+

: clear
\* +-----------------------------------------------------------------------------------+
\* | Initializes the user variable associated with a plex or channel.                   |
\* | EXAMPLE:                                                                           |
\* |    ulx->xyz clear ( see channel ch-attach plex p-attach )                          |
\* +-----------------------------------------------------------------------------------+

: start-timer
\* +-----------------------------------------------------------------------------------+
\* | The  start-timer  word creates an instance of a timer type whose address is passed |
\* | on the parameter stack. This address points to a cell containing  the  #ticks  for |
\* | the  timer,  and  the following cell contains the input token associated with this |
\* | timer. The start-timer word passes ( ['process] input #ticks ) to the fmtos  timer |
```

```
\* | function which adds the currently executing task's tcb to the stack and then |
\* | executes the fmtos tcom word. The tcom word allocates a timer buffer which has a |
\* | compatible format with fsml message headers, stores the supplied parameters in the |
\* | block and links it into the timer manager's timer queue related to the difference |
\* | between the current wall-time and the #ticks supplied as the timeout interval. The |
\* | timer manager runs as a continuous looping task which waits on the tsem semaphore. |
\* | Each tick signals the semaphore, and the tmgr processes one of it's 64 timing |
\* | lists. See the tmgr word for more detail.                                         |
\* |                                                                                   |
\* | When an fsml timer expires, the tmgr essentially sends the related message token |
\* | to the machine whose task timed out, restoring the value of 'process to the value |
\* | it had when the start-timer word was executed.                                    |
\* +-----------------------------------------------------------------------------------+

: read-timer
\* +-----------------------------------------------------------------------------------+
\* | This word returns the number of ticks remaining on the specified timer.           |
\* +-----------------------------------------------------------------------------------+

: stop-timer
\* +-----------------------------------------------------------------------------------+
\* | This word cancels the specified timer without executing the function that would |
\* | have been executed if the timer had timed out.                                    |
\* +-----------------------------------------------------------------------------------+

: reset-timer
\* +-----------------------------------------------------------------------------------+
\* | This word resets the specified timer to its original timeout interval, essentially |
\* | starting the timer over again.                                                    |
\* +-----------------------------------------------------------------------------------+

: >>>
\* +-----------------------------------------------------------------------------------+
\* | There is a global pointer, curr-fsm which defines a "current machine". >>> sends |
\* | an input to the machine whose 'tcb is stored in curr-fsm.                         |
\* +-----------------------------------------------------------------------------------+

: select
\* +-----------------------------------------------------------------------------------+
\* | This is an interactive word allowing the user to select a particular fsm to become |
\* | the current fsm (storing its 'tcb in curr-fsm). The fsm to be selected can be |
\* | referenced either by its alias name or by its 'tcb.                               |
\* | EXAMPLES:                                                                         |
\* |     select myfsm                                                                  |
\* |     select 105432                                                                 |
\* +-----------------------------------------------------------------------------------+

: mkill
\* +-----------------------------------------------------------------------------------+
\* | Kill the current fsm                                                              |
\* +-----------------------------------------------------------------------------------+
```

```
: (dq-setup)   ( svar-offs -- )  \ save offset of state var
\* +------------------------------------------------------------------------------+
\* | This  is  an internal word for setting up a data query ( dq ) function for an fsml |
\* | state.                                                                       |
\* +------------------------------------------------------------------------------+

: (dq-clnup)
\* +------------------------------------------------------------------------------+
\* | This  is  an  internal  word  for  ministering  the  needs  of a data query ( dq ) |
\* | function.                                                                    |
\* +------------------------------------------------------------------------------+

: tokenof
\* +------------------------------------------------------------------------------+
\* | Usage: tokenof <alias-name>                                                  |
\* | This  is  an interactive word to retrieve the 'tcb of an fsm instance specified by |
\* | an alias name.                                                               |
\* +------------------------------------------------------------------------------+

: dq:
\* +------------------------------------------------------------------------------+
\* | The  dq  functions provides a way to make a data query before processing the input |
\* | token sent to an fsm instance. For example, sometimes the input  token  may  be  a |
\* | general  message  input,  but the functional input to the machine is stored within |
\* | the message. The dq function allows the message to be pre-analyzed  to  substitute |
\* | the message parameter as the input before allowing the machine to process it. Each |
\* | state  of an fsm may have its own dq function, and if used, must preceed the first |
\* | input listed for the state. The dq: word is similar  to  the  :  word,  except  dq |
\* | functions don't have a header (i.e., no name).                               |
\* | Usage:                                                                       |
\* |    dq: <any code here> dq;                                                   |
\* | Also see mapto .                                                             |
\* +------------------------------------------------------------------------------+

: dq;
\* +------------------------------------------------------------------------------+
\* | This is to terminate a dq function. It is similar to ; . Also see dq:        |
\* +------------------------------------------------------------------------------+

: mapto
\* +------------------------------------------------------------------------------+
\* | The mapto word is used within a dq: function to substitute a different input token |
\* | for the one originally received in the state.                                |
\* +------------------------------------------------------------------------------+

: (stateval)
\* +------------------------------------------------------------------------------+
\* | This is an internal fsml word to convert the cfa of a state to its "value".  |
\* +------------------------------------------------------------------------------+

: valueof
\* +------------------------------------------------------------------------------+
\* | Usage: valueof <state-name>                                                  |
\* | This returns the value associated with each fsml state.                      |
\* +------------------------------------------------------------------------------+
```

```
: fsm1state!
\* +----------------------------------------------------------------------------+
\* | This word updates an fsm instance state to the specified value. This is normally |
\* | used as an internal fsml word.                                             |
\* +----------------------------------------------------------------------------+

: .synctrace
\* +----------------------------------------------------------------------------+
\* | This is an internal word that supports the fsml trace capabilities. See ton and |
\* | toff .                                                                     |
\* +----------------------------------------------------------------------------+

: .smtrace
\* +----------------------------------------------------------------------------+
\* | This is an internal word that supports the fsml trace capabilities. See ton and |
\* | toff .                                                                     |
\* +----------------------------------------------------------------------------+

: .metrace
\* +----------------------------------------------------------------------------+
\* | This is an internal word that supports the fsml trace capabilities. See ton and |
\* | toff .                                                                     |
\* +----------------------------------------------------------------------------+

: inp>self
\* +----------------------------------------------------------------------------+
\* | This word allows a machine instance to send an input to itself. This can also be |
\* | used for a submachine to send an input to its parent machine.              |
\* +----------------------------------------------------------------------------+

: submachine
\* +----------------------------------------------------------------------------+
\* | A submachine is similar to a machine, except that a submachine instance is a |
\* | synchronous function that runs immediately in the task space of the task that |
\* | executes it. The usual use of a submachine is to define it within the machine type |
\* | definition for a machine, although it is possible to define stand-alone    |
\* | submachines that do not run as separate tasks.                             |
\* |                                                                            |
\* | Each submachine must be associated with a user variable, which will contain the |
\* | submachine's state value. Whereas a machine instance's inital state is defined by |
\* | the start-state word, a submachine specification does not use this mechanism. The |
\* | set-state word is used for this, and is usually executed in the prolog of the |
\* | parent machine.                                                            |
\* | EXAMPLE:                                                                   |
\* |     user T.Null              ( define submachine's user variable )         |
\* |     T.Null submachine >T.Null  ( define submachine's access name )         |
\* |         .                                                                  |
\* |         .                                                                  |
\* |         .                                                                  |
\* |     end-submachine           ( submachine definition terminated by end-submachine ) |
\* |                                                                            |
\* |     Submachine initialization code... usually in parent fsm's prolog section. |
\* |                +------------------Submachine state name                    |
\* |                |          +------Submachine's user variable                |
\* |                |          |                                                |
\* |                V          V                                                |
\* |     Awaiting_Event.01 O.Null set-state                                     |
\* |                                                                            |
\* +----------------------------------------------------------------------------+

: end-submachine
\* +----------------------------------------------------------------------------+
\* | Defines the end of a submachine definition. See submachine .               |
\* +----------------------------------------------------------------------------+
```

```
    : set-state
    \* +-----------------------------------------------------------------------------------+
    \* | Defines the initial state of a submachine.  See submachine .                      |
    \* +-----------------------------------------------------------------------------------+
5
    decimal
    ( CODE FOR ERROR HELP ROUTINE FOR FSML -- errhelp )
    : (?)    ( err# -- )   ( display help message )
    \* +-----------------------------------------------------------------------------------+
10  \* | If  you  are  compiling  an  fsm and get an error message, an error number will be |
    \* | displayed. In order to translate the error number, type: <error#> (?)             |
    \* +-----------------------------------------------------------------------------------+
```

Table 8

What is claimed is:

1. A method for a user to design a computer system to simulate an external system, said method comprising the steps of:

using the Forth collection of programming environment building blocks to create a finite state machine language and an object oriented language;

using said Forth collection of programming building blocks, said finite state machine language and said object oriented language to define said external system as a plurality of objects, said plurality of objects consisting of at least one controlling object;

said objects comprising a plurality of data where said plurality of data describes said object; and a plurality of operations that can be performed by said computer system on said plurality of data;

defining said at least one controlling object as a finite state machine;

defining said system as a plurality of finite state machines;

defining communication protocols between said plurality of finite state machines;

determining a closest match between said object and a previously defined object;

selecting said closest match and creating a new object based on said closest match;

defining said plurality of data for said object; and defining said plurality of operations for said object.

2. A method as claimed in claim 1 wherein each of said steps of defining said controlling object and said system as finite state machines comprises the steps of:

defining a plurality of states that said finite state machine can assume;

defining a next state transition pair, for each of said plurality of states said next state transition pair describes a next state for said finite state machine;

defining an action routine for each of said next state transition pair, said action routine describes what action said computer should take when said finite state machine transitions to said next state.

3. A method as claimed in claim 2 wherein each of said steps of defining said controlling object and said system as finite state machines further comprises the steps of:

for each of said plurality of states, defining only valid inputs;

defining said next state for each of said valid inputs; and defining said action routine for each of said valid inputs.

4. A method for designing a computer system to simulate an external system, said computer system being operated by a user through a user interface, said method comprising the steps of:

using the Forth collection of programming environment building blocks to create a finite state machine language and an object oriented language;

using said Forth collection of programming building blocks, said finite state machine language and said object oriented language to define said external system as a plurality of objects, said plurality of objects consisting of a controlling object;

said objects comprising a plurality of data where said plurality of data describes said object; and a plurality of operations that can be performed by said computer system on said plurality of data;

defining said controlling object as a finite state machine;

defining communication protocol between said finite state machine and said user through said user interface, said user inputs stimuli to said finite state machine and said user observes responses of said finite state machine to said input stimuli;

determining a closest match between said object and a previously defined object;

selecting said closest match and creating a new object based on said closest match;

defining said plurality of data for said object; and defining said plurality of operations for said object.

5. A method as claimed in claim 4 wherein each of said steps of defining said controlling object and said system as finite state machines comprises the steps of:

defining a plurality of states that said finite state machine can assume;

defining a next state transition pair, for each of said plurality of states said next state transition pair describes a next state for said finite state machine;

defining an action routine for each of said next state transition pair, said action routine describes said responses said computer will output to said user through said user interface when said finite state machine transitions to said next state.

6. A method as claimed in claim 5 wherein each of said steps of defining said controlling object and said system as finite state machines further comprises the steps of:

for each of said plurality of states, defining only valid inputs;

defining said next state for each of said valid inputs; and defining said action routine for each of said valid inputs.

* * * * *